US012578150B2

(12) United States Patent
Takeda et al.

(10) Patent No.: US 12,578,150 B2
(45) Date of Patent: Mar. 17, 2026

(54) VAPOR CHAMBER, ELECTRONIC DEVICE AND SHEET FOR VAPOR CHAMBER

(71) Applicant: DAI NIPPON PRINTING CO., LTD., Tokyo (JP)

(72) Inventors: Toshihiko Takeda, Tokyo (JP); Kazunori Oda, Tokyo (JP); Takayuki Ota, Tokyo (JP); Kiyotaka Takematsu, Tokyo (JP); Shinichiro Takahashi, Tokyo (JP); Terutoshi Momose, Tokyo (JP); Yohei Tsuganezawa, Tokyo (JP); Yoko Nakamura, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 273 days.

(21) Appl. No.: 17/432,867

(22) PCT Filed: Mar. 11, 2020

(86) PCT No.: PCT/JP2020/010587
§ 371 (c)(1),
(2) Date: Aug. 20, 2021

(87) PCT Pub. No.: WO2020/184620
PCT Pub. Date: Sep. 17, 2020

(65) Prior Publication Data
US 2022/0120509 A1      Apr. 21, 2022

(30) Foreign Application Priority Data

Mar. 11, 2019    (JP) ................................. 2019-043928
Mar. 12, 2019    (JP) ................................. 2019-045156

(Continued)

(51) Int. Cl.
F28D 15/02          (2006.01)
F28D 15/04          (2006.01)
H05K 7/20           (2006.01)

(52) U.S. Cl.
CPC ..... *F28D 15/0233* (2013.01); *F28D 15/0266* (2013.01); *F28D 15/04* (2013.01); *H05K 7/20318* (2013.01); *H05K 7/20336* (2013.01)

(58) Field of Classification Search
CPC .. F28D 15/0233; F28D 15/0266; F28D 15/04; H05K 7/20318; H05K 7/20336
See application file for complete search history.

(56) References Cited

U.S. PATENT DOCUMENTS

2004/0069460 A1    4/2004    Sasaki et al.
2010/0065255 A1    3/2010    Liu et al.
(Continued)

FOREIGN PATENT DOCUMENTS

JP      S53-145471  U    11/1978
JP      H11-304381  A    11/1999
(Continued)

OTHER PUBLICATIONS

May 26, 2020 Search Report issued in International Patent Application No. PCT/JP2020/010587.

*Primary Examiner* — Jianying C Atkisson
*Assistant Examiner* — Khaled Ahmed Ali Al Samiri
(74) *Attorney, Agent, or Firm* — Oliff PLC

(57)                ABSTRACT

A vapor chamber having an enclosure which a working fluid is sealed in, the enclosure including: a first flow path; and a fluid flow path part that is adjacent to the first flow path.

15 Claims, 73 Drawing Sheets

(30)        Foreign Application Priority Data

| Mar. 12, 2019 | (JP) | ................................. | 2019-045167 |
| Mar. 13, 2019 | (JP) | ................................. | 2019-046509 |
| Mar. 13, 2019 | (JP) | ................................. | 2019-046510 |
| Mar. 22, 2019 | (JP) | ................................. | 2019-054517 |

(56)              References Cited

U.S. PATENT DOCUMENTS

| 2018/0156545 A1* | 6/2018 | Delano ................. | F28D 15/043 |
| 2019/0239395 A1* | 8/2019 | Joshi ..................... | F28D 15/046 |
| 2021/0168969 A1 | 6/2021 | Takahashi et al. | |

FOREIGN PATENT DOCUMENTS

| JP | 2002-39693 A | 2/2002 |
| JP | 2004-28557 A | 1/2004 |
| JP | 2005-9763 A | 1/2005 |
| JP | 2007-212028 A | 8/2007 |
| JP | 2013-185774 A | 9/2013 |
| TW | 201014512 A | 4/2010 |
| WO | 02/58879 A1 | 8/2002 |
| WO | 2019/230911 A1 | 12/2019 |

* cited by examiner

VAPOR CHAMBER, ELECTRONIC DEVICE AND SHEET FOR VAPOR CHAMBER

TECHNICAL FIELD

The present disclosure relates to a vapor chamber in which a working fluid sealed in an enclosure therein refluxes as the working fluid changes its phase, to transport heat.

BACKGROUND ART

An improving information processing capacity of electronic components installed in personal computers and portable terminals such as portable telephones and tablet terminals, like CPU (central processing unit), leads to a tendency for the electronic components to generate heat of an increasing amount, and thus a cooling technique is important. Heat pipes are well known as means for such cooling. A heat pipe is to transport heat of a heat source to another portion by means of a working fluid sealed in the pipe and diffuse the heat, to cool the heat source.

In particular, portable terminals have been remarkably slimmed down in recent years, which has caused the demand for a thinner cooling means than the conventional heat pipe. For this, for example, a vapor chamber as described in PTL 1 is proposed.

A vapor chamber is a device of a tabular member to which the concept of heat transport using a heat pipe is deployed. That is, the vapor chamber includes a working fluid sealed in between flat plates facing each other. This working fluid refluxes as changing its phase so that heat is transported, and then heat of a heat source is transported and diffused so that the heat source is cooled.

More specifically, a flow path for vapor and a flow path for condensate are disposed inside the vapor chamber, and a working fluid is sealed therein. When the vapor chamber is arranged around a heat source, the working fluid receives heat of the heat source and evaporates near the heat source, and then becomes gas (vapor) and moves in the flow path for vapor. This results in smooth transport of the heat of the heat source to a place apart from the heat source. As a result, the heat source is cooled.

The working fluid in the gas state, which transports the heat of the heat source, moves to a place apart from the heat source, is cooled by surroundings that absorb heat of the working fluid and condenses, and changes its phase into the liquifying state. The working fluid, which has changed its phase into the liquifying state, passes through the flow path for condensate, returns to the position around the heat source, receives the heat of the heat source again and evaporates, and changes into the gas state.

The foregoing circulation results in transport of the heat generated from the heat source to a place apart from the heat source, and diffusion of the heat, to cool the heat source.

CITATION LIST

Patent Literature

[PTL 1] JP 2007-212028 A

SUMMARY OF INVENTION

Technical Problem

An object of the present disclosure is to provide a vapor chamber capable of improving a heat transport capability.

An electronic device provided with this vapor chamber, and a sheet for a vapor chamber are also provided.

Solution to Problem

One aspect of the present disclosure is a vapor chamber having an enclosure which a working fluid is sealed in, the enclosure comprising: a first flow path; and a fluid flow path part that is adjacent to the first flow path, the fluid flow path part including second flow paths on both sides in a thickness direction of the vapor chamber, the vapor chamber comprising: superposed three sheets, wherein a sheet disposed in the middle of the three sheets is formed to be the first flow path, which penetrates in a thickness direction of the sheet and extends along a plane of the sheet, and the second flow paths are disposed on both faces of the fluid flow path part of the sheet disposed in the middle in the thickness direction of the sheet, respectively.

An electronic device comprising: a housing; an electronic component disposed inside the housing; and the vapor chamber disposed in the electronic component can be also provided.

Another aspect of the present disclosure is a sheet for a vapor chamber, the sheet having a hollow part into which a working fluid is to be poured, the hollow part comprising: a first flow path; and a fluid flow path part that is adjacent to the first flow path, the fluid flow path part including second flow paths on both sides in a thickness direction of the vapor chamber, the sheet comprising: superposed three sheets, wherein a sheet disposed in the middle of the three sheets is formed to be the first flow path, which penetrates in a thickness direction of the sheet and extends along a plane of the sheet, and the second flow paths are disposed on both faces of the fluid flow path part of the sheet disposed in the middle in the thickness direction of the sheet, respectively.

Another aspect of the present disclosure is a vapor chamber having an enclosure which a working fluid is sealed in, the enclosure comprising: a first flow path; and a fluid flow path part that is adjacent to the first flow path, the fluid flow path part including a second flow path and a heat insulating part, the heat insulating part not communicating with the first or second flow path, the vapor chamber comprising: superposed three sheets, wherein a sheet disposed in the middle of the three sheets is formed to be the first flow path, which penetrates in a thickness direction of the sheet and extends along a plane of the sheet, and the second flow path is disposed on one face of the fluid flow path part of the sheet disposed in the middle in the thickness direction of the sheet, and the heat insulating part is disposed on another face thereof.

An electronic device comprising: a housing; an electronic component disposed inside the housing; and the vapor chamber disposed in the electronic component can be also provided.

Another aspect of the present disclosure is a sheet for a vapor chamber, the sheet having a hollow part into which a working fluid is to be poured, the hollow part comprising: a first flow path; and a fluid flow path part that is adjacent to the first flow path, the fluid flow path part including a second flow path and a heat insulating part, the heat insulating part not communicating with the first or second flow path, the sheet comprising: superposed three sheets, wherein a sheet disposed in the middle of the three sheets is formed to be the first flow path, which penetrates in a thickness direction of the sheet and extends along a plane of the sheet, and the second flow path is disposed on one face of the fluid flow path part of the sheet disposed in the middle in the thickness direction of the sheet, and the heat insulating part is disposed on another face thereof.

Another aspect of the present disclosure is a vapor chamber having an enclosure which a working fluid is sealed in, the enclosure comprising: a first flow path; and a fluid flow path part that is adjacent to the first flow path, the fluid flow path part including a second flow path, and a guiding part on a boundary surface with the first flow path, the guiding part sticking out toward the first flow path, the guiding part having a guiding face that extends toward the second flow path from an apex that sticks out most toward the first flow path, the vapor chamber comprising: superposed three sheets, wherein a sheet disposed in the middle of the three sheets is formed to be the first flow path, which penetrates in a thickness direction of the sheet and extends along a plane of the sheet, and the second flow path is disposed on a face of the fluid flow path part of the sheet disposed in the middle at least on one side in the thickness direction.

An electronic device comprising: a housing; an electronic component disposed inside the housing; and the vapor chamber disposed in the electronic component can be also provided.

Another aspect of the present disclosure is a sheet for a vapor chamber, the sheet having a hollow part into which a working fluid is to be poured, the hollow part comprising: a first flow path; and a fluid flow path part that is adjacent to the first flow path, the fluid flow path part including a second flow path, and a guiding part on a boundary surface with the first flow path, the guiding part sticking out toward the first flow path, the guiding part having a guiding face that extends toward the second flow path from an apex that sticks out most toward the first flow path, the sheet comprising: superposed three sheets, wherein a sheet disposed in the middle of the three sheets is formed to be the first flow path, which penetrates in a thickness direction of the sheet and extends along a plane of the sheet, and the second flow path is disposed on a face of the fluid flow path part of the sheet disposed in the middle at least on one side in the thickness direction.

Another aspect of the present disclosure is a vapor chamber having an enclosure which a working fluid is sealed in, the enclosure comprising: a first flow path; and a fluid flow path part that is adjacent to the first flow path, the fluid flow path part including a second flow path on at least one side in a thickness direction of the vapor chamber, the vapor chamber comprising: a first sheet; a second sheet; and a third sheet that is disposed between the first and second sheets, the three sheets being laminated onto each other, wherein the third sheet is formed to be the first flow path, which penetrates in a thickness direction thereof and extends along a plane thereof, and at least one of the first and second sheets includes an inner sheet on a side of the third sheet and a reinforcing sheet on a side opposite to the third sheet, said at least one of the first and second sheets being formed by laminating the inner sheet and the reinforcing sheet, the reinforcing sheet having proof stress higher than that of the inner sheet.

Another aspect of the present disclosure is a vapor chamber having an enclosure which a working fluid is sealed in, the enclosure comprising: a first flow path; and a fluid flow path part that is adjacent to the first flow path, the fluid flow path part including a second flow path on at least one side in a thickness direction of the vapor chamber, the vapor chamber comprising: a first sheet; a second sheet; and a third sheet that is disposed between the first and second sheets, the three sheets being laminated onto each other, wherein the third sheet is formed to be the first flow path, which penetrates in a thickness direction thereof and extends along a plane thereof, at least one of the first and second sheets includes an inner sheet on a side of the third sheet, a reinforcing sheet on a side opposite to the third sheet, and a barrier sheet disposed between the inner sheet and the reinforcing sheet, said at least one of the first and second sheets being formed by laminating the inner sheet, the reinforcing sheet, and the barrier sheet, the reinforcing sheet having proof stress higher than that of the inner sheet, the reinforcing sheet having proof stress higher than that of the inner sheet, and the barrier sheet contains at least one of tungsten, titanium, tantalum and molybdenum.

Advantageous Effect of Invention

According to the present disclosure, a heat transport capability of a vapor chamber can be improved.

BRIEF DESCRIPTION OF DRAWINGS

FIG. 2 is an exploded perspective view of the vapor chamber 1.
FIG. 22 is an exploded perspective view of a vapor chamber 51 according to a second embodiment.
FIG. 27 is an exploded perspective view of the vapor chamber 101.

5

Figure 28:
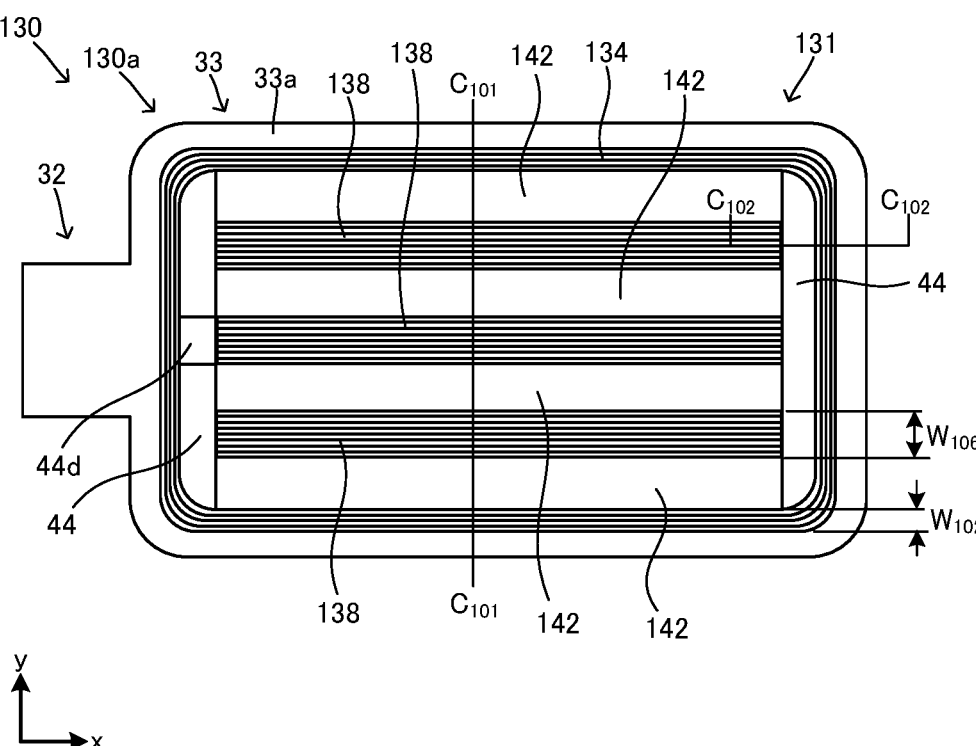
FIG. 28 shows a third sheet 130 in the direction z.
Figure 29:
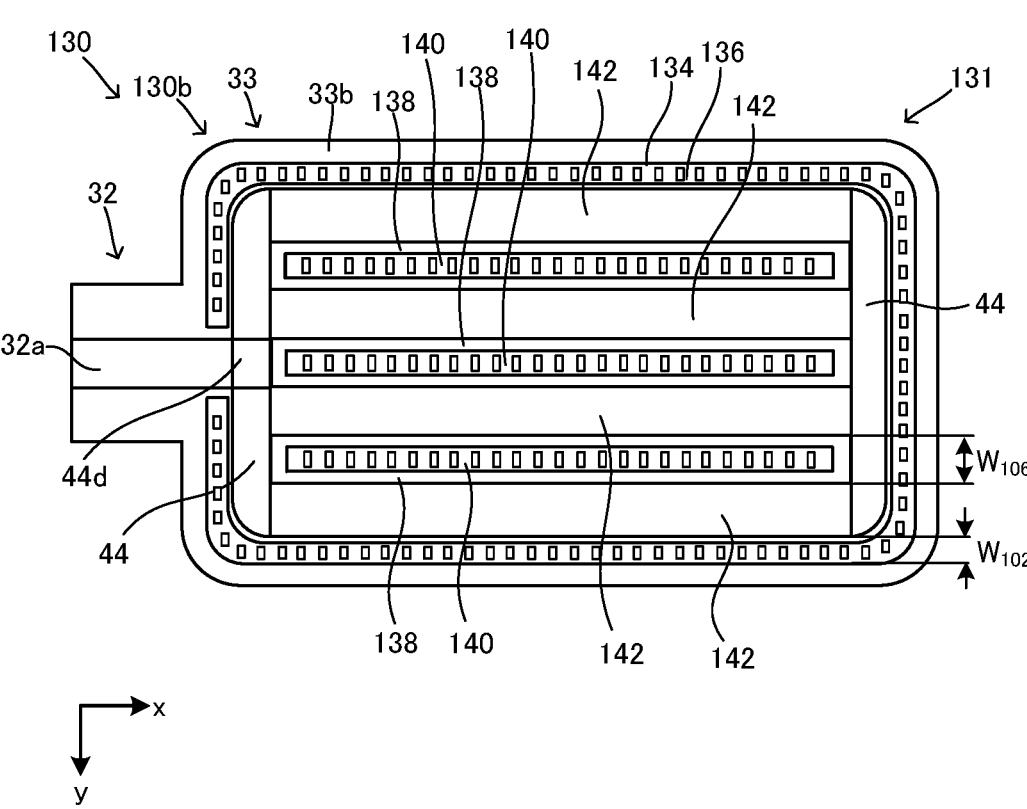

FIG. 29 shows the third sheet 30 viewed on the opposite side of FIG. 28.

Figure 30:
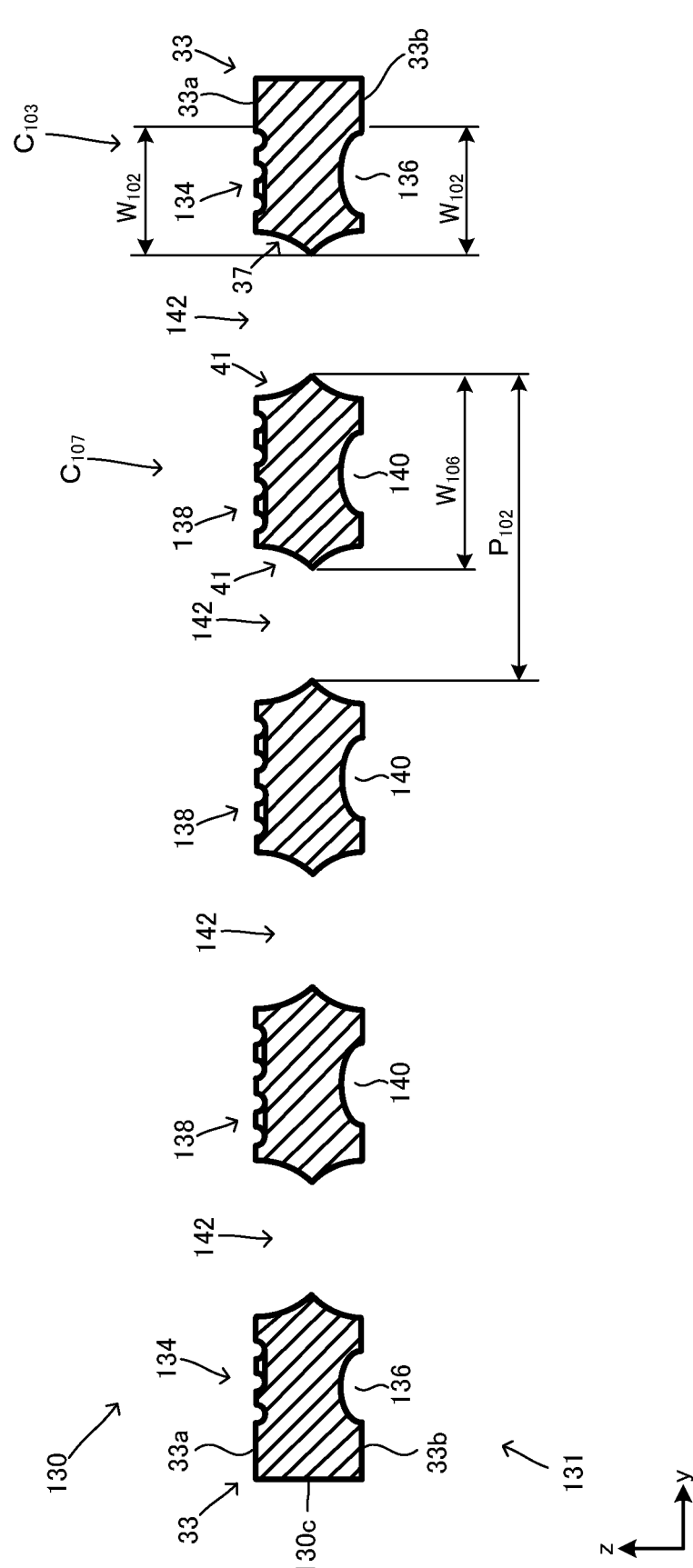

FIG. 30 is a cross-sectional view of the third sheet 130.

Figure 31:
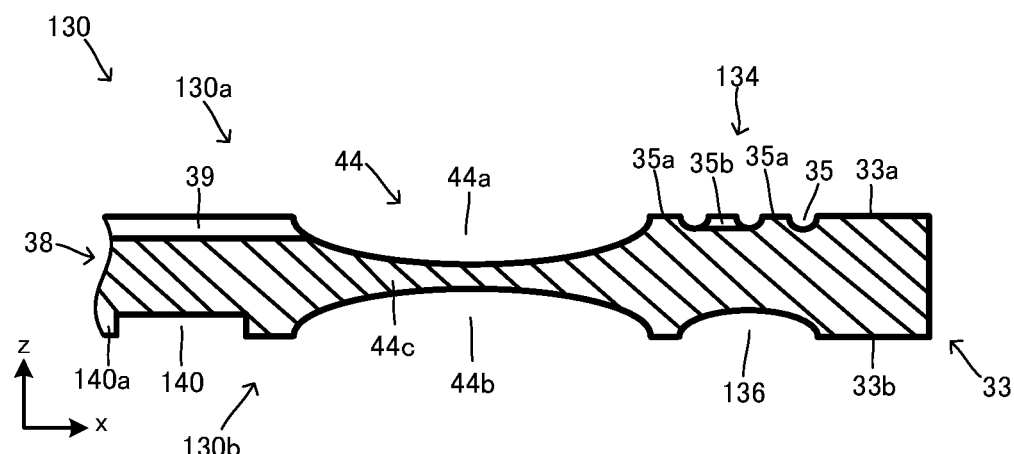

FIG. 31 is another cross-sectional view of the third sheet 130.

Figure 32:
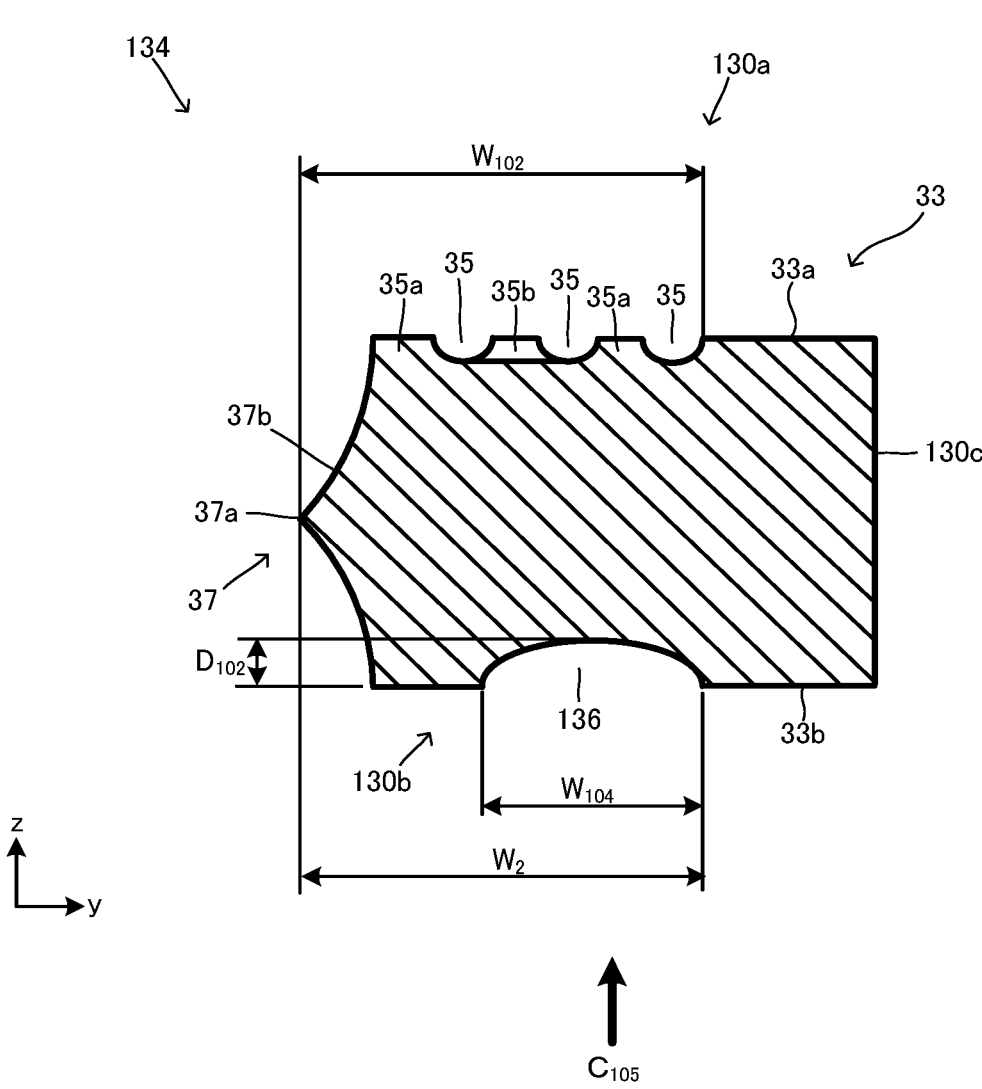

FIG. 32 is a cross-sectional view focusing on a peripheral fluid flow path part 134.

Figure 33:
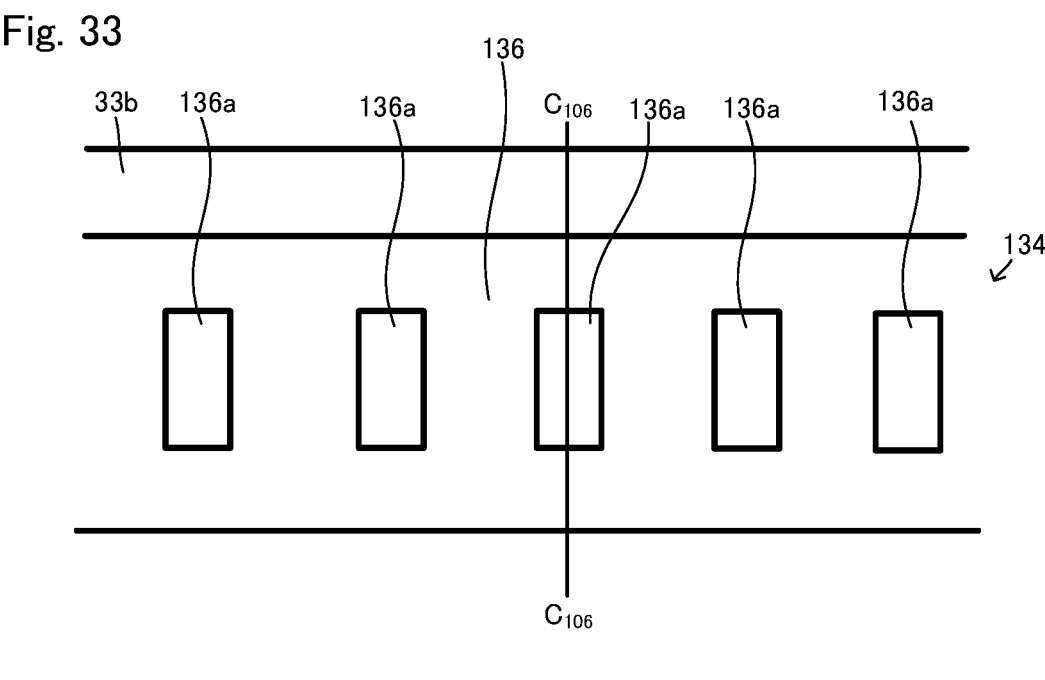

FIG. 33 explanatorily shows the peripheral fluid flow path part 134.

Figure 34:
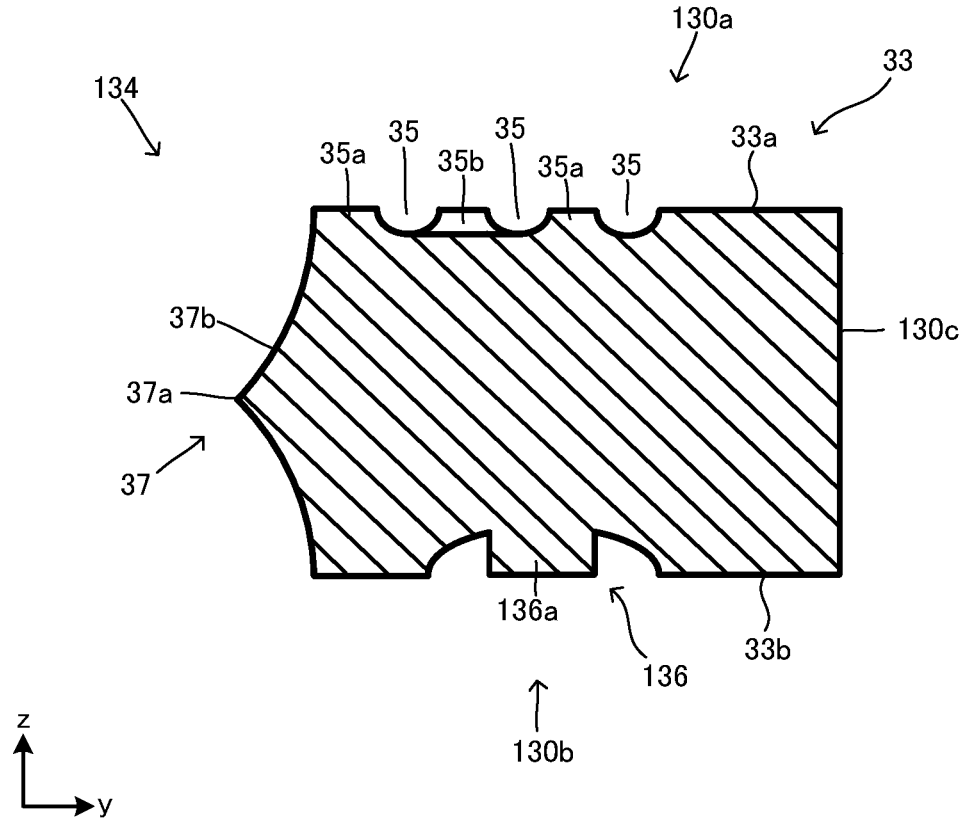

FIG. 34 is a cross-sectional view of a portion where a pillar 136*a* is disposed.

Figure 35:
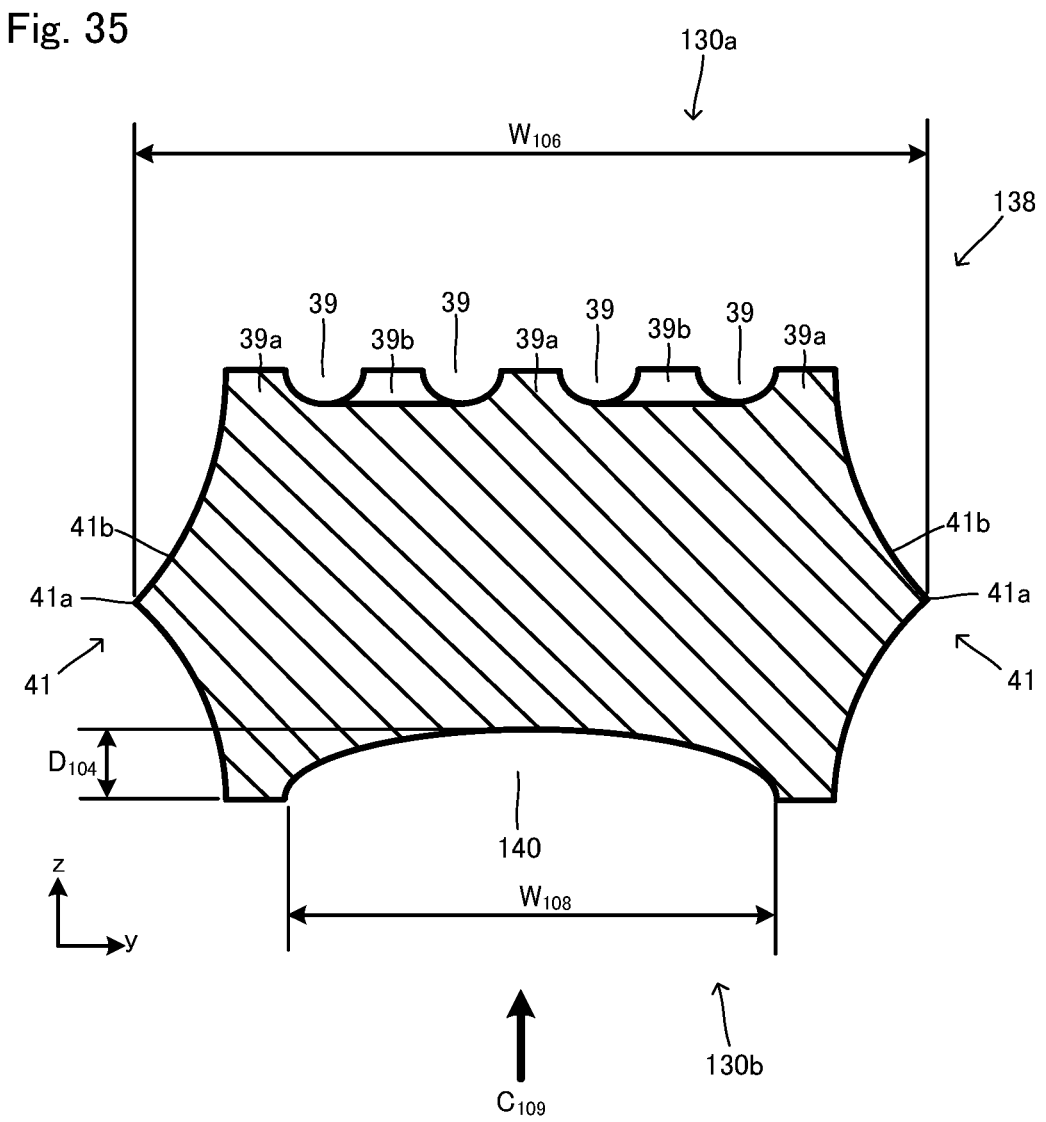

FIG. 35 is a cross-sectional view focusing on an inner side fluid flow path part 138.

Figure 36:
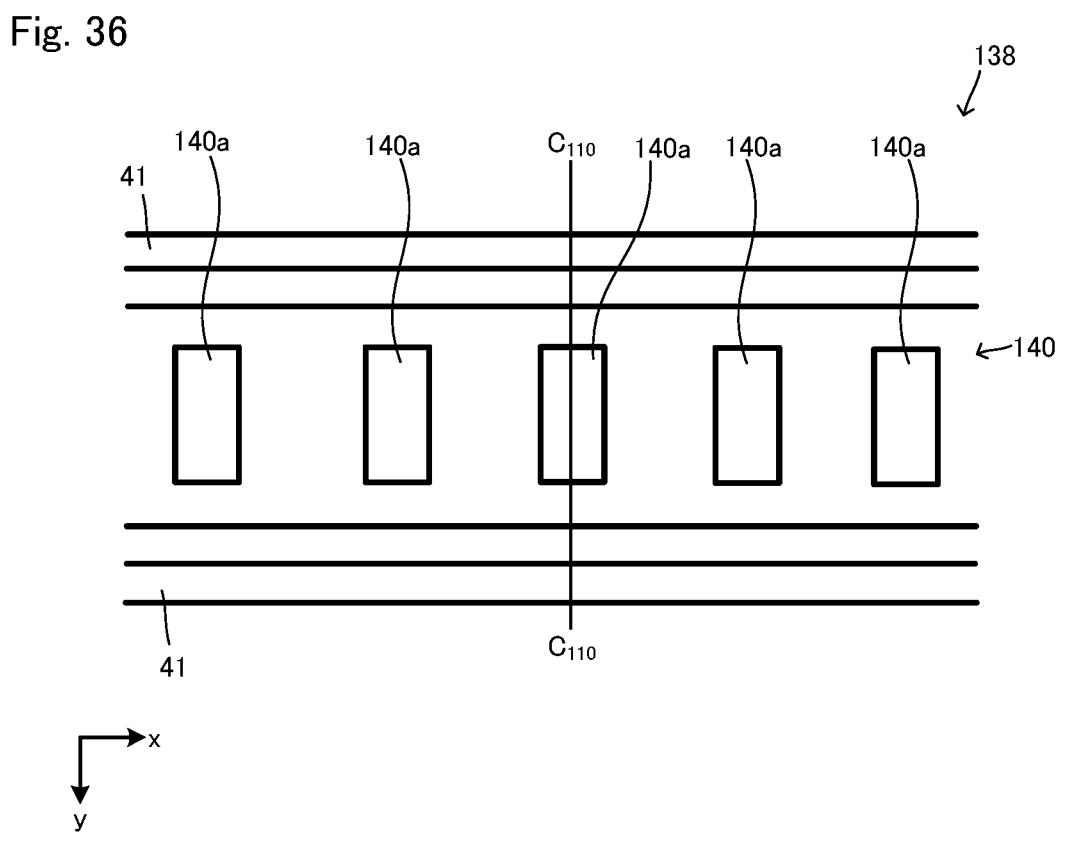

FIG. 36 explanatorily shows the inner side fluid flow path part 138.

Figure 37:
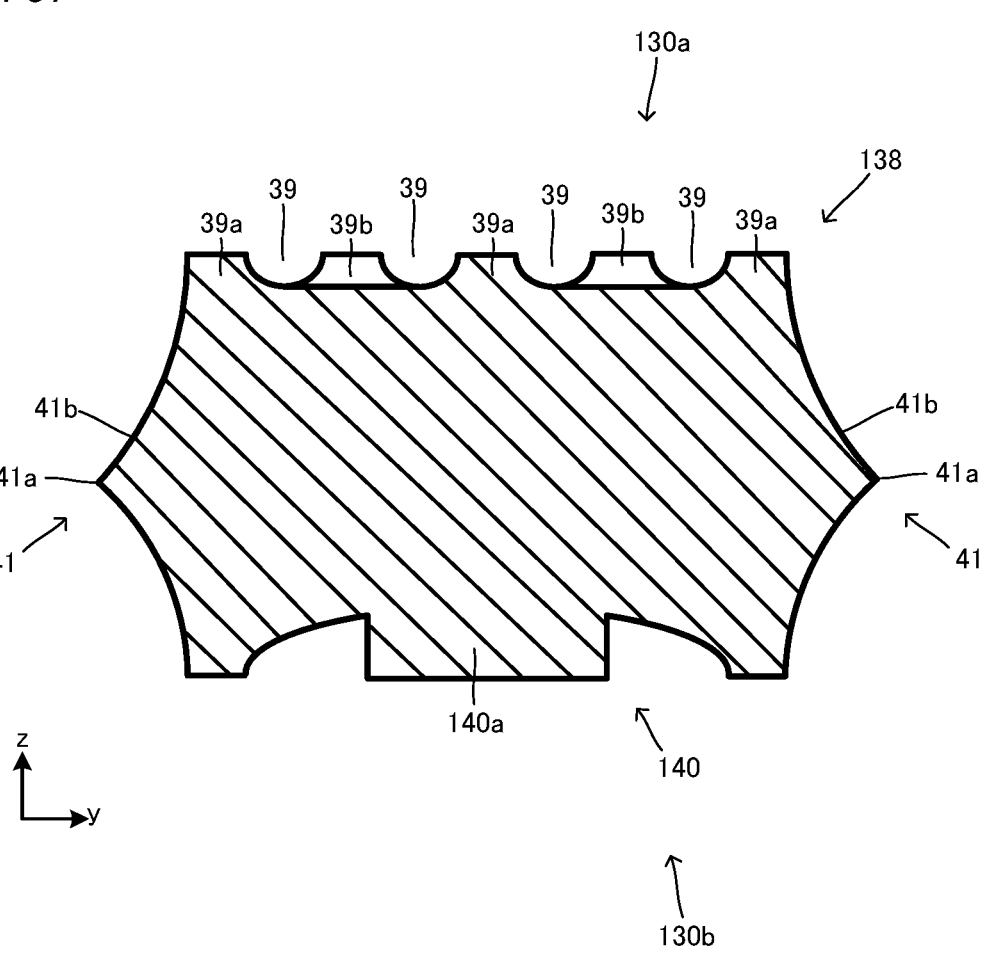

FIG. 37 is a cross-sectional view of a portion where a pillar 140*a* is disposed.

Figure 38:
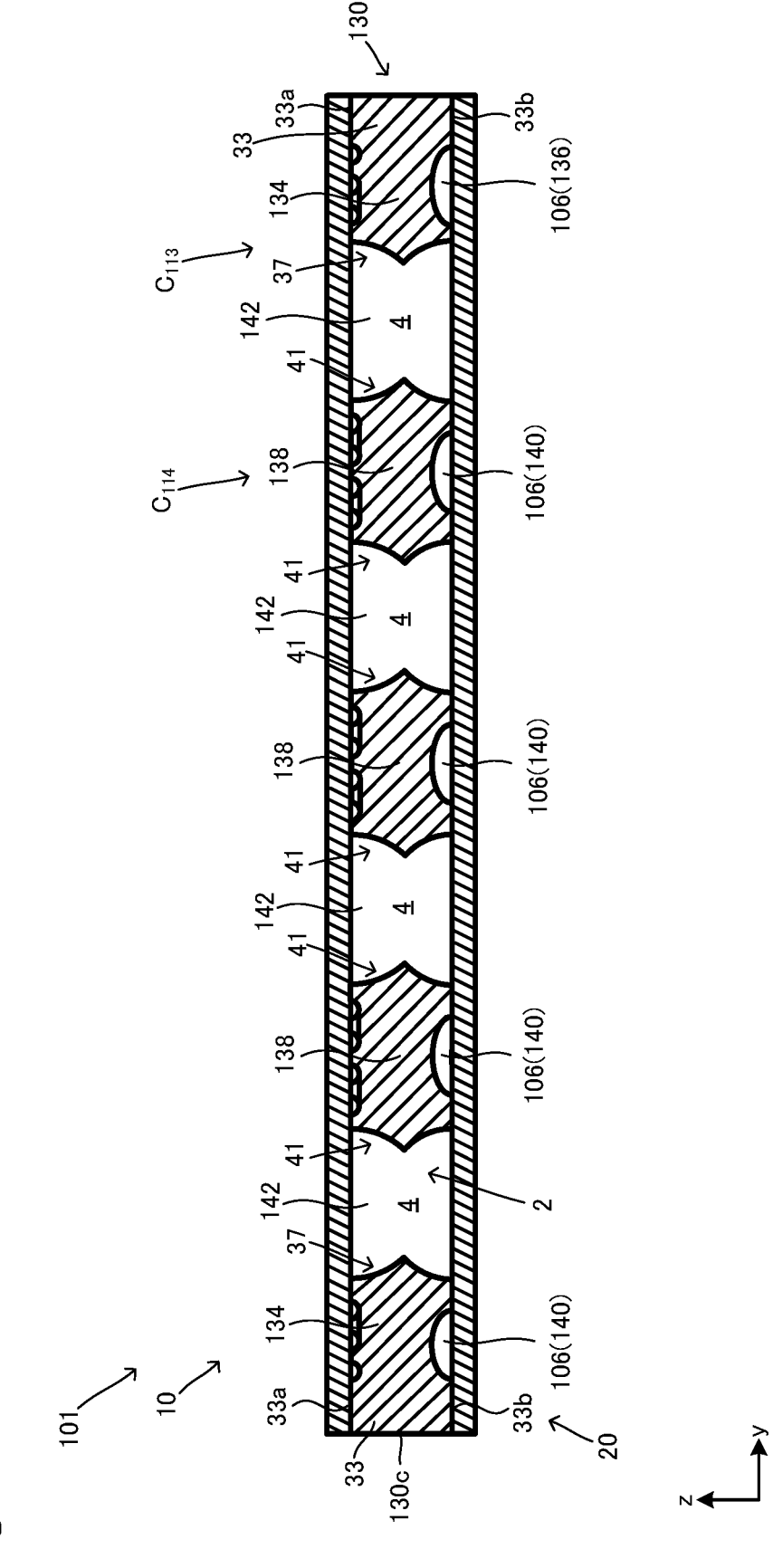

FIG. 38 is a cross-sectional view of the vapor chamber 101.

Figure 39:
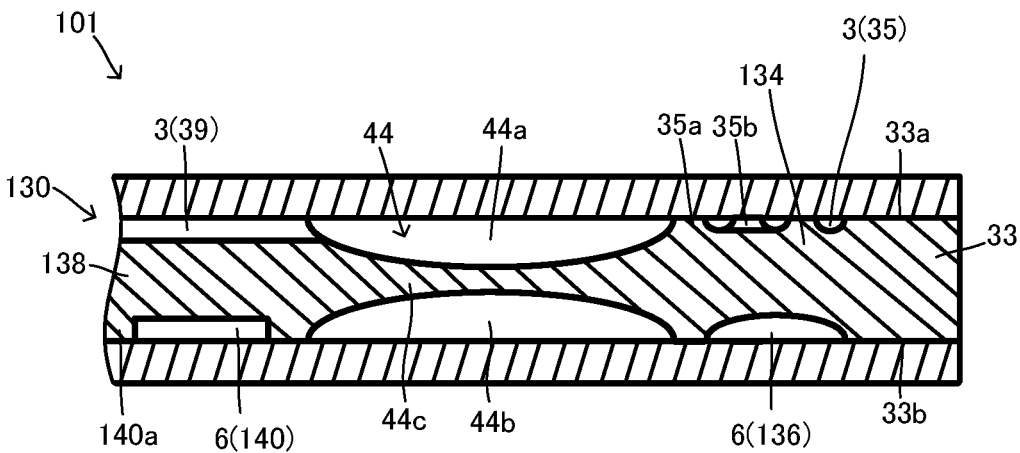
Figure 39:
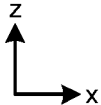

FIG. 39 is another cross-sectional view of the vapor chamber 101.

Figure 40:
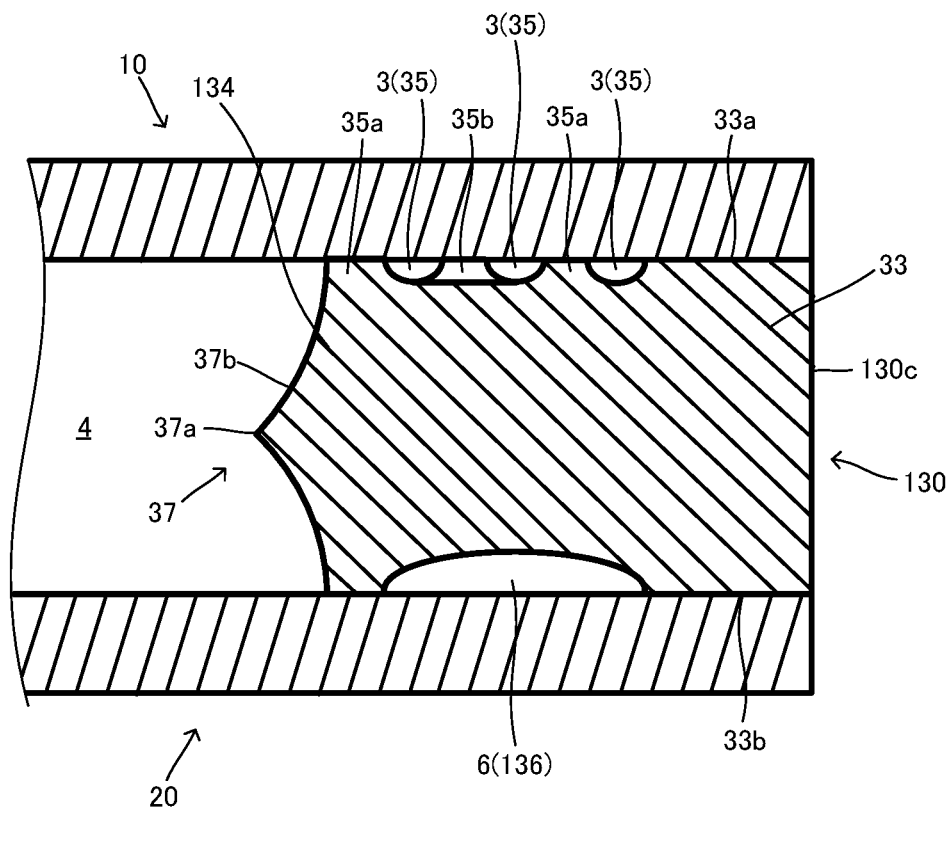
Figure 40:
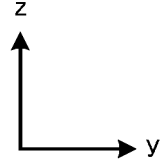

FIG. 40 is a partially enlarged view of FIG. 38.

Figure 41:
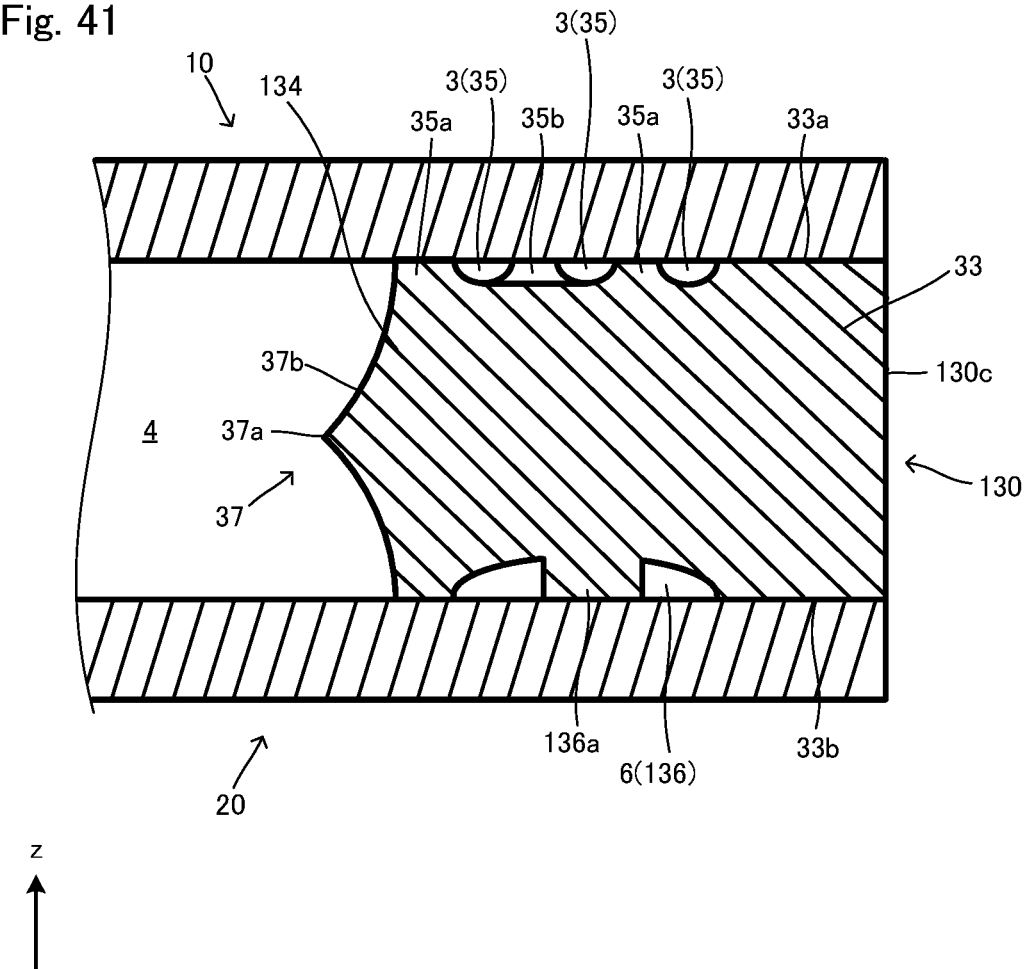

FIG. 41 is an enlarged cross-sectional view of the portion where the pillar 136*a* is disposed.

Figure 42:
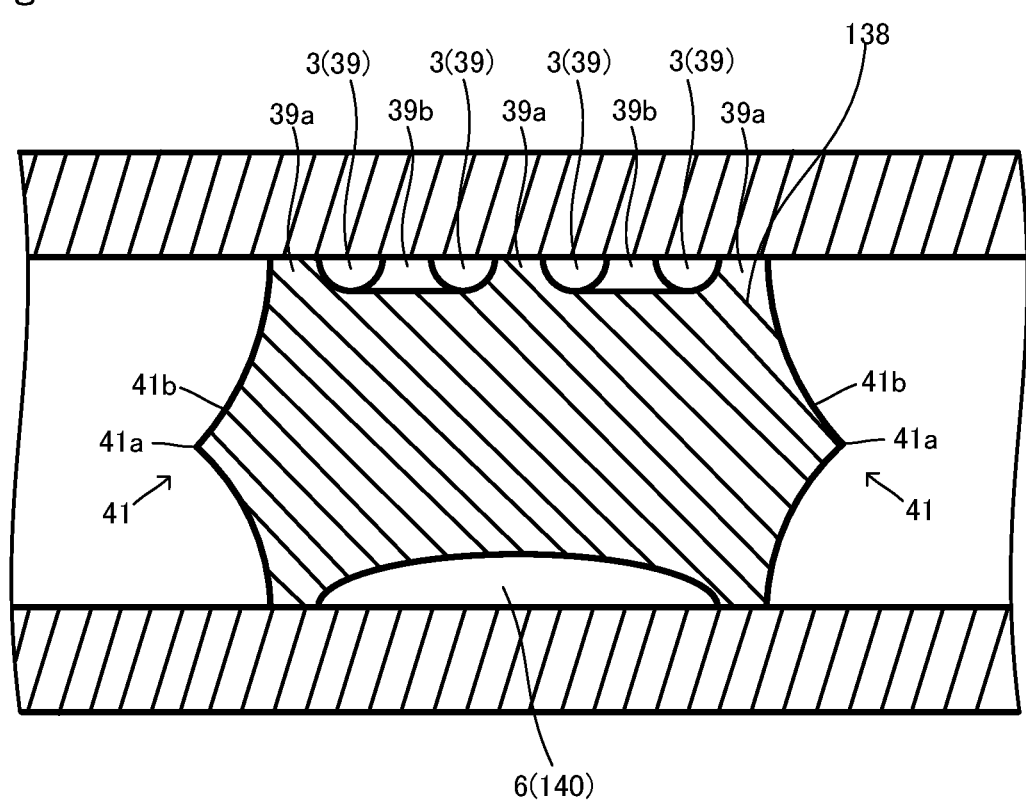
Figure 42:

FIG. 42 is a partially enlarged view of FIG. 38.

Figure 43:
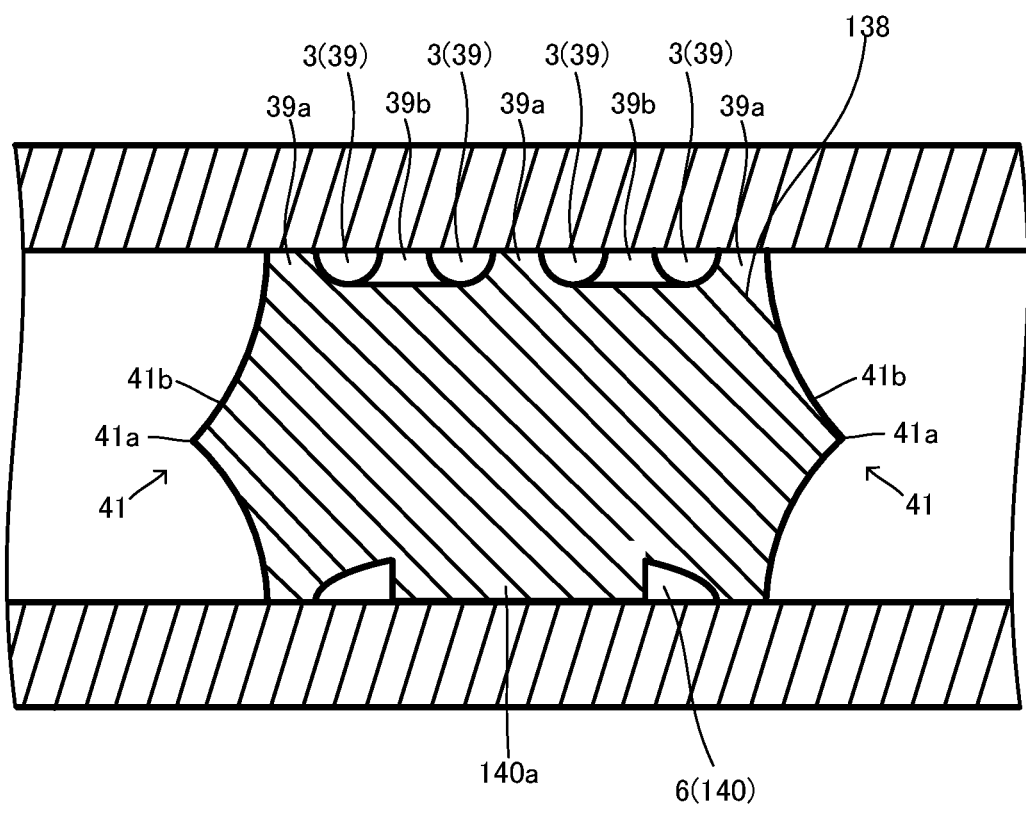
Figure 43:

FIG. 43 is an enlarged cross-sectional view of the portion where the pillar 140*a* is disposed.

Figure 44:
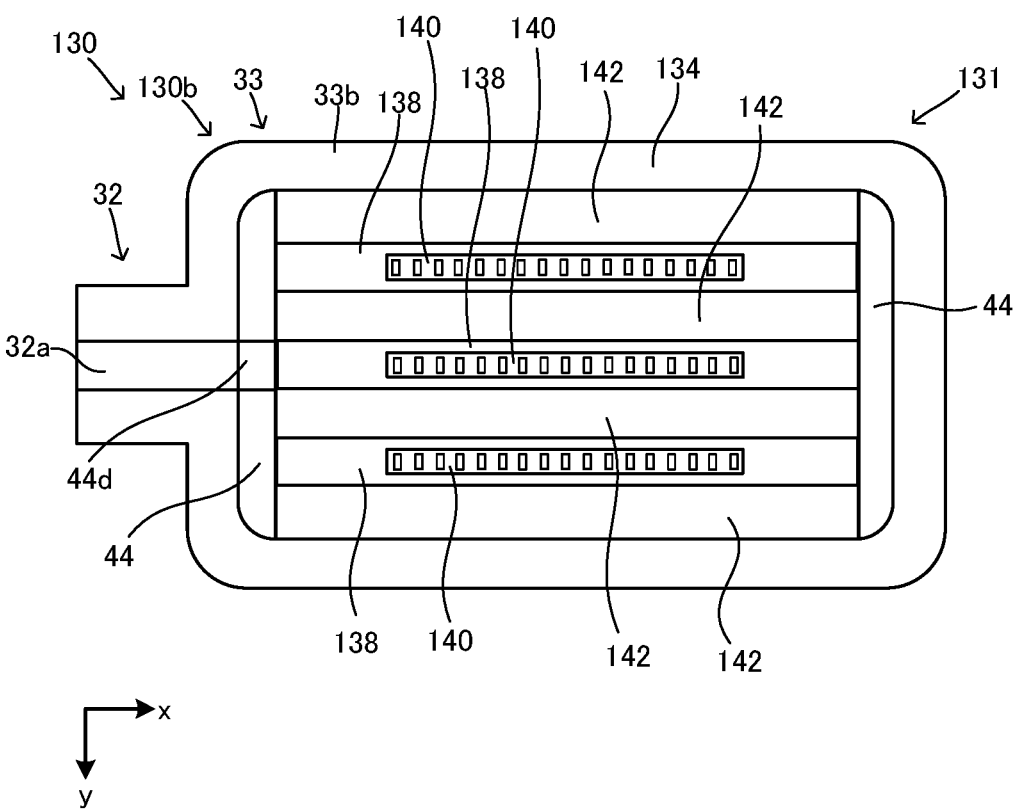

FIG. 44 explanatorily shows another embodiment.

Figure 45:
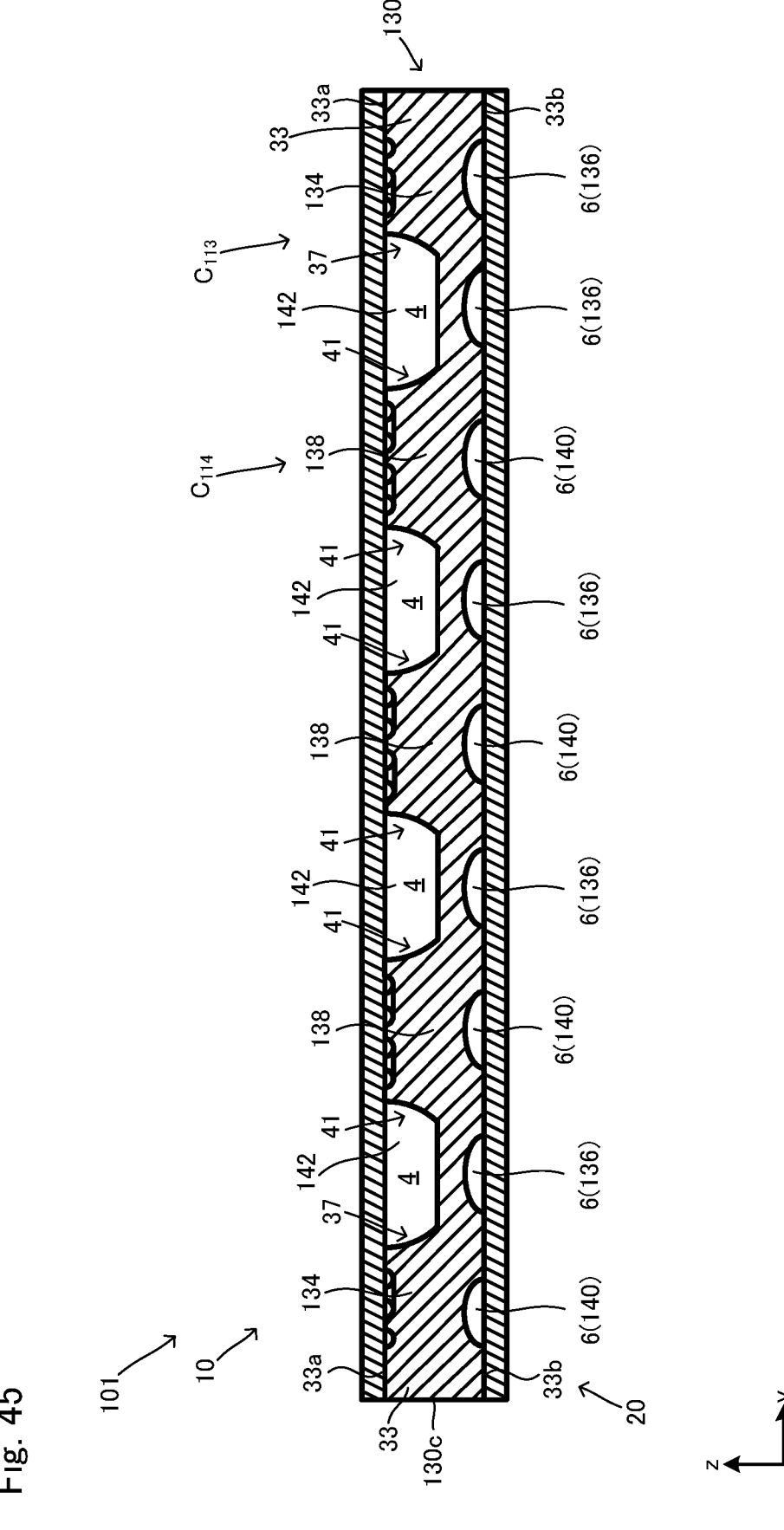

FIG. 45 explanatorily shows another embodiment.

Figure 46:
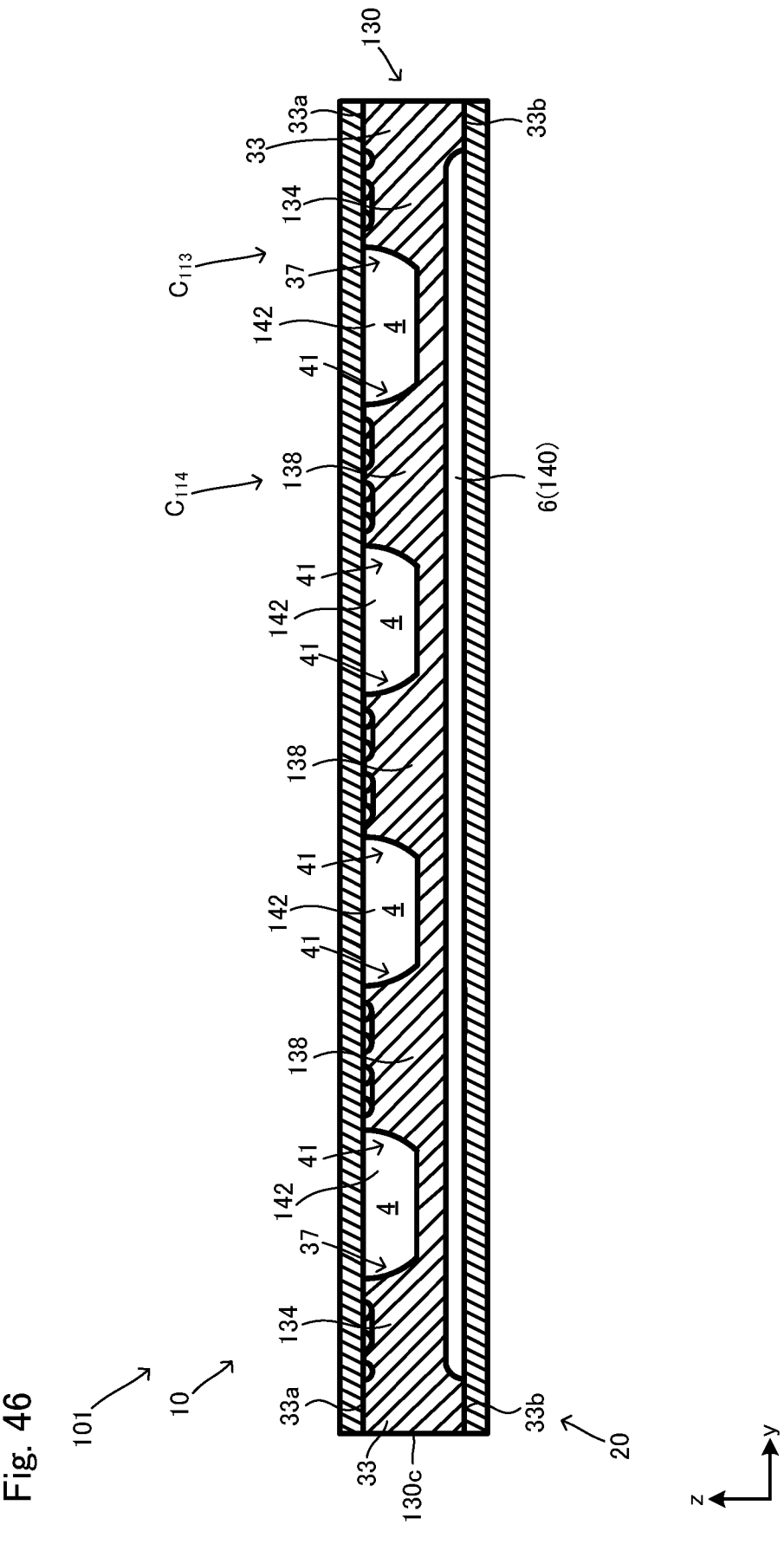

FIG. 46 explanatorily shows another embodiment.

Figure 47:
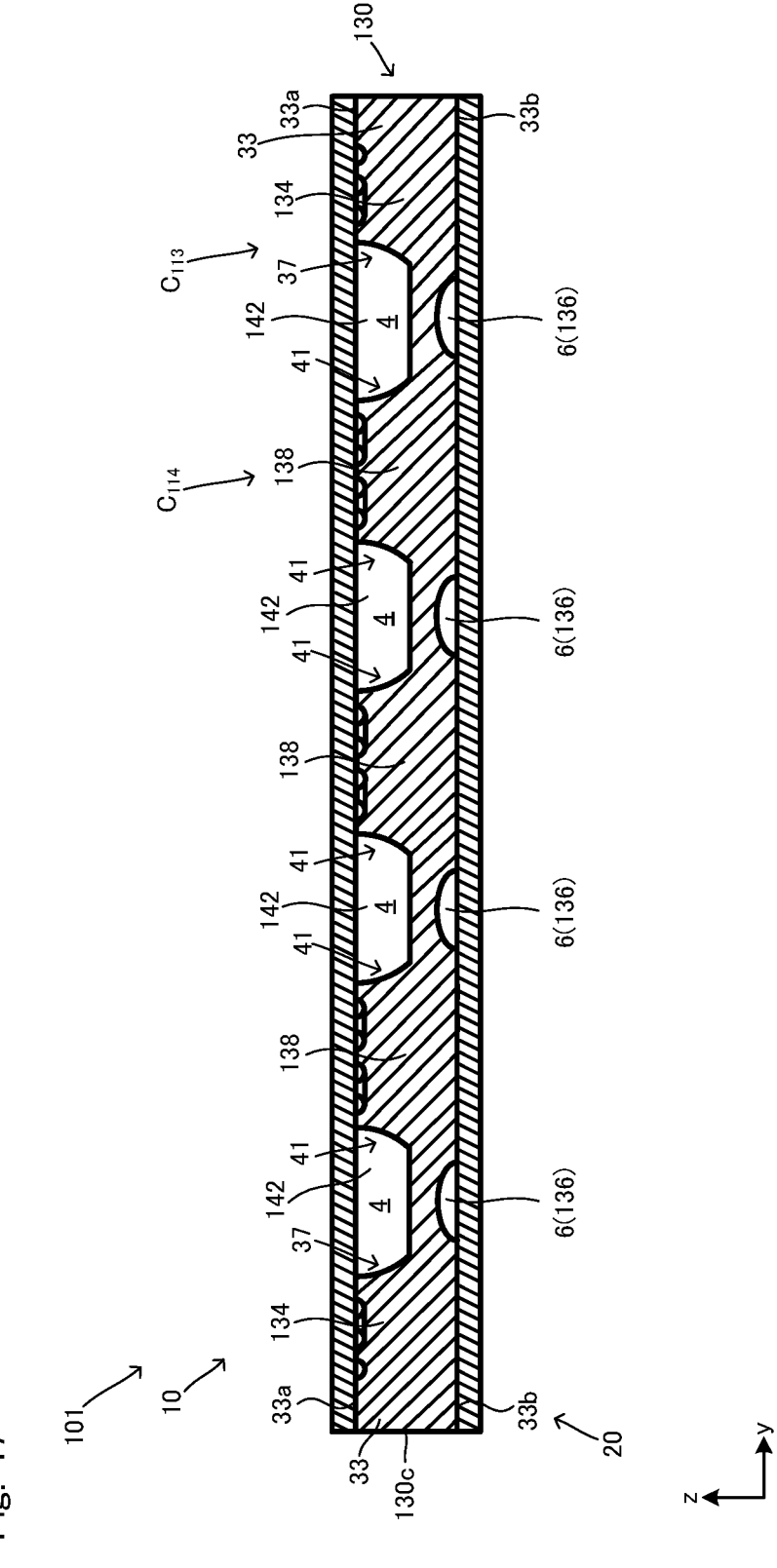

FIG. 47 explanatorily shows another embodiment.

FIGS. 48(*a*) and 48(*b*) are cross-sectional views focusing on an inner side fluid flow path part 238.

Figure 49A:
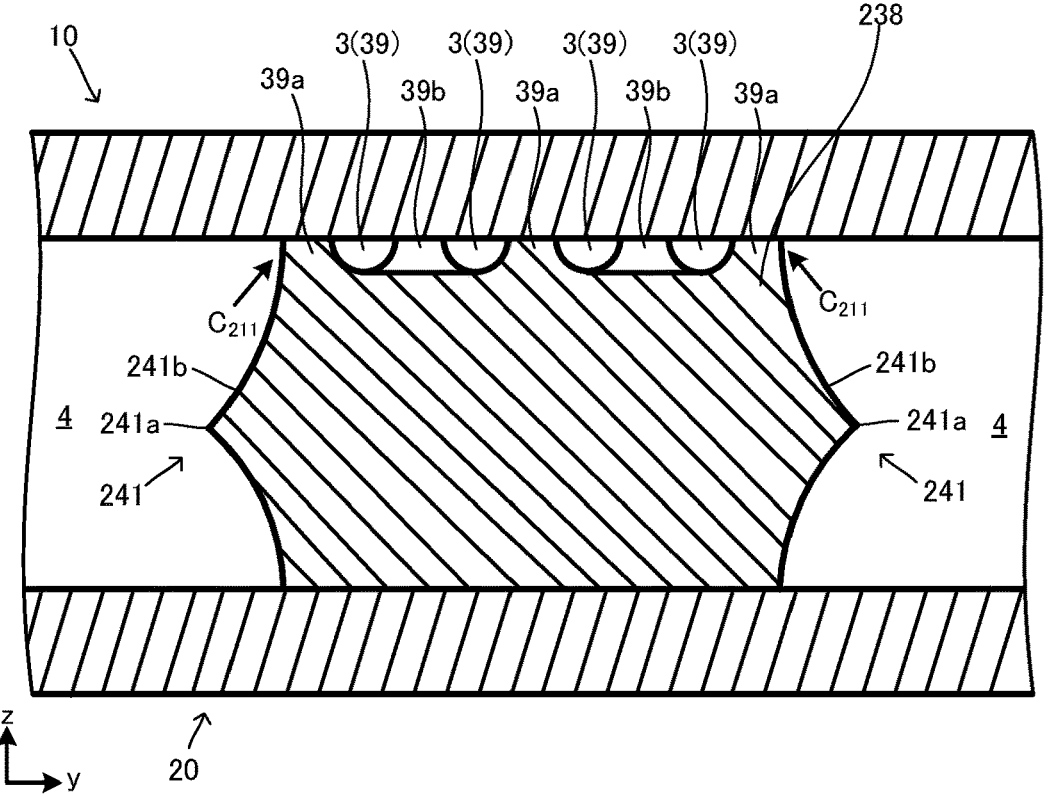
Figure 49B:
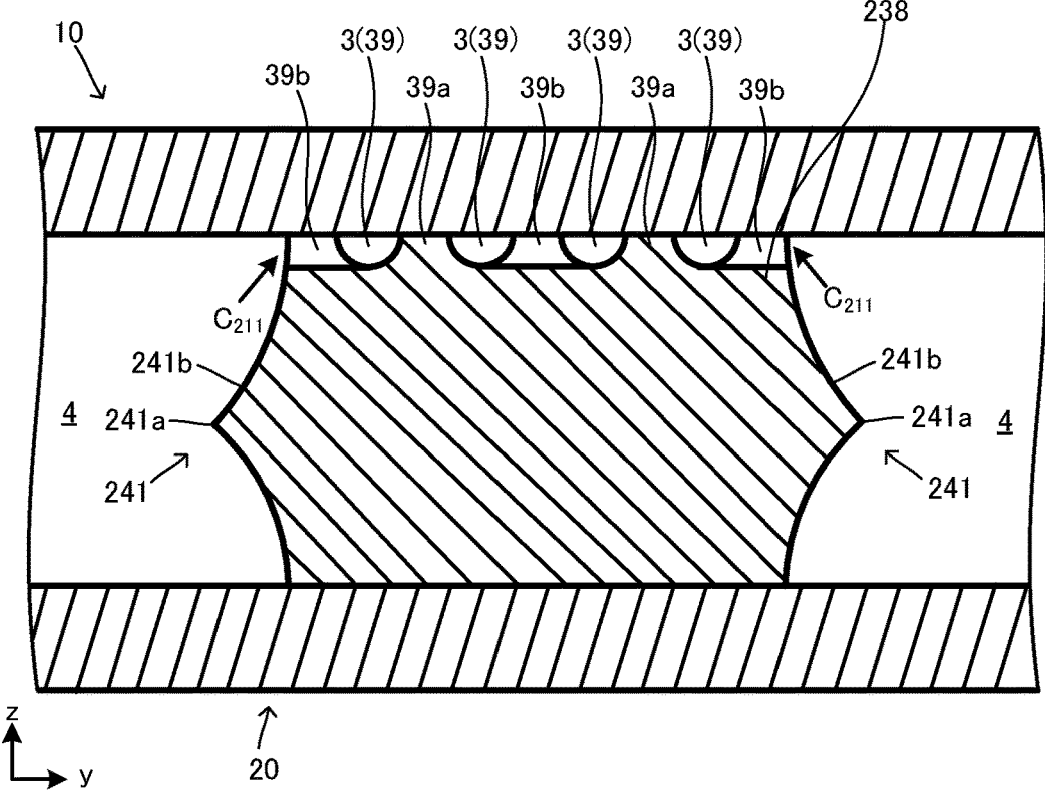

FIGS. 49(*a*) and 49(*b*) show part of a cross section of a vapor chamber 201 around the inner side fluid flow path part 238.

Figure 50:
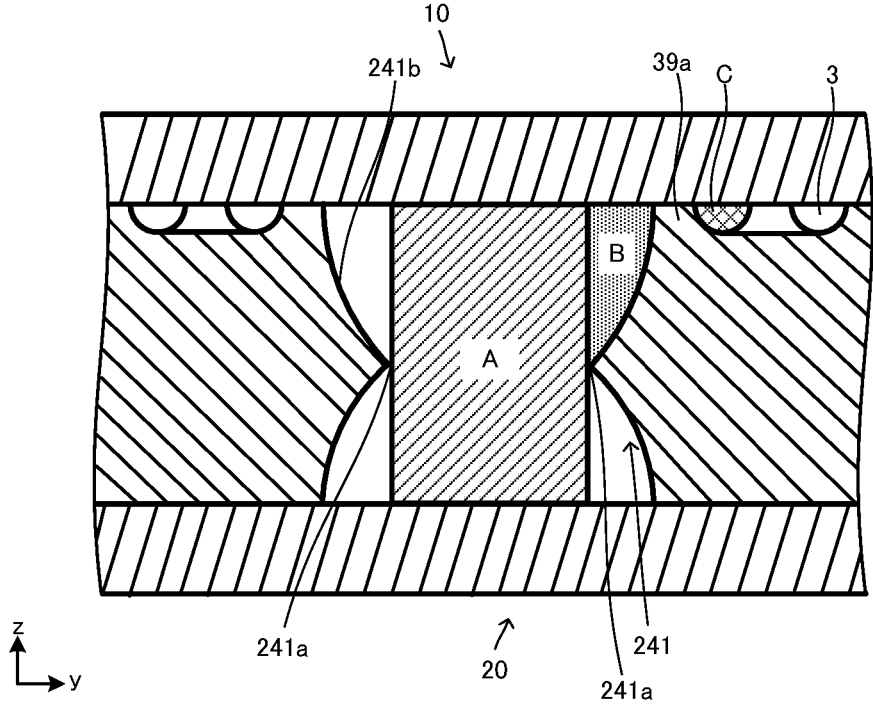
Figure 51A:
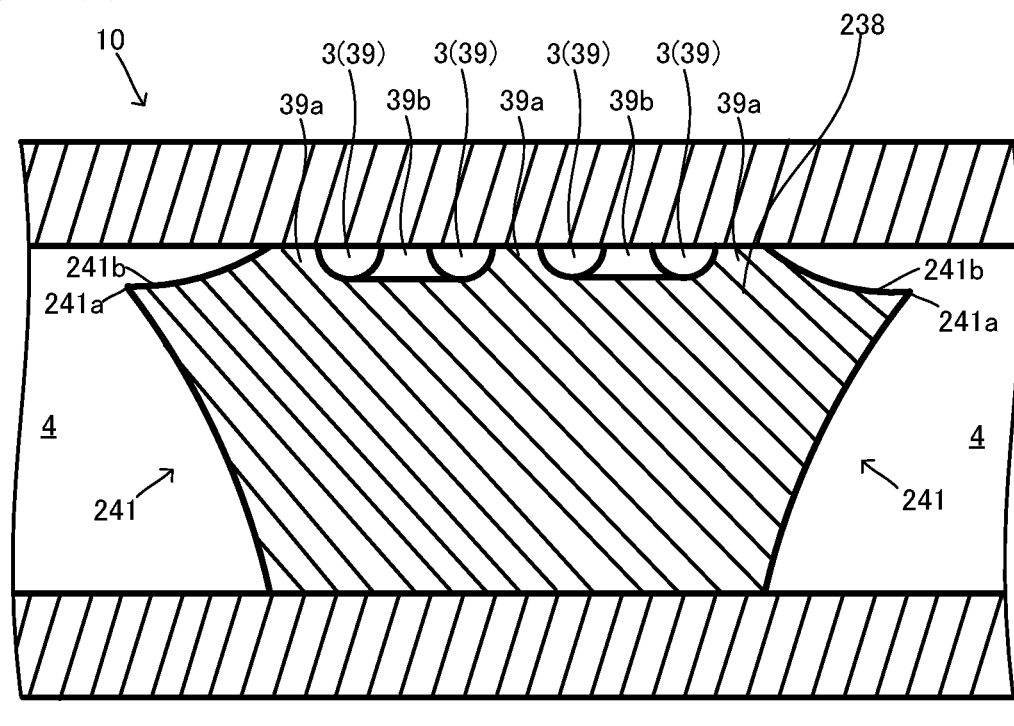
Figure 51A:
Figure 51B:
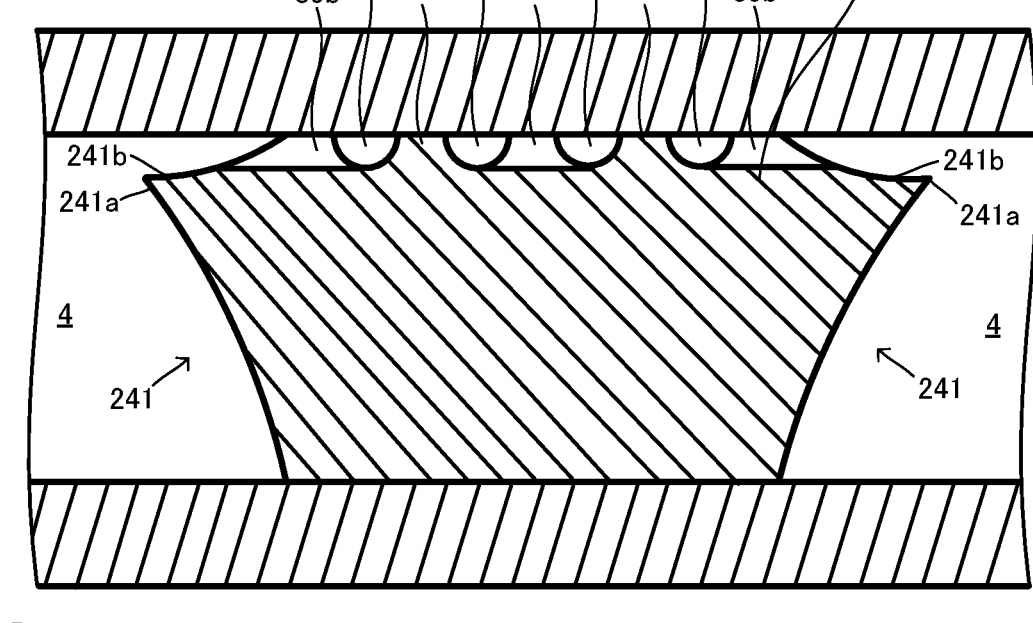
Figure 51B:
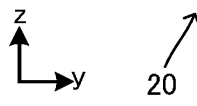

FIG. 50 explanatorily shows a preferred embodiment on a cross section.

FIGS. 51(*a*) and 51(*b*) explanatorily show guiding parts according to another embodiment.

Figure 52A:
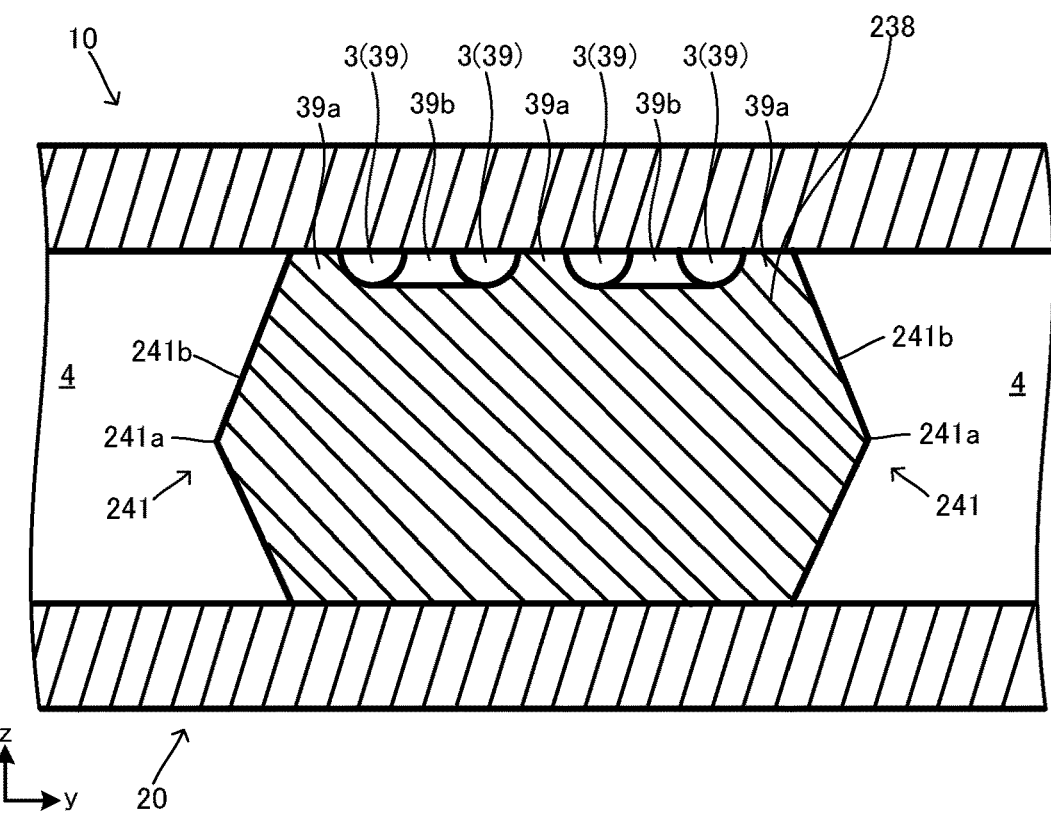
Figure 52B:
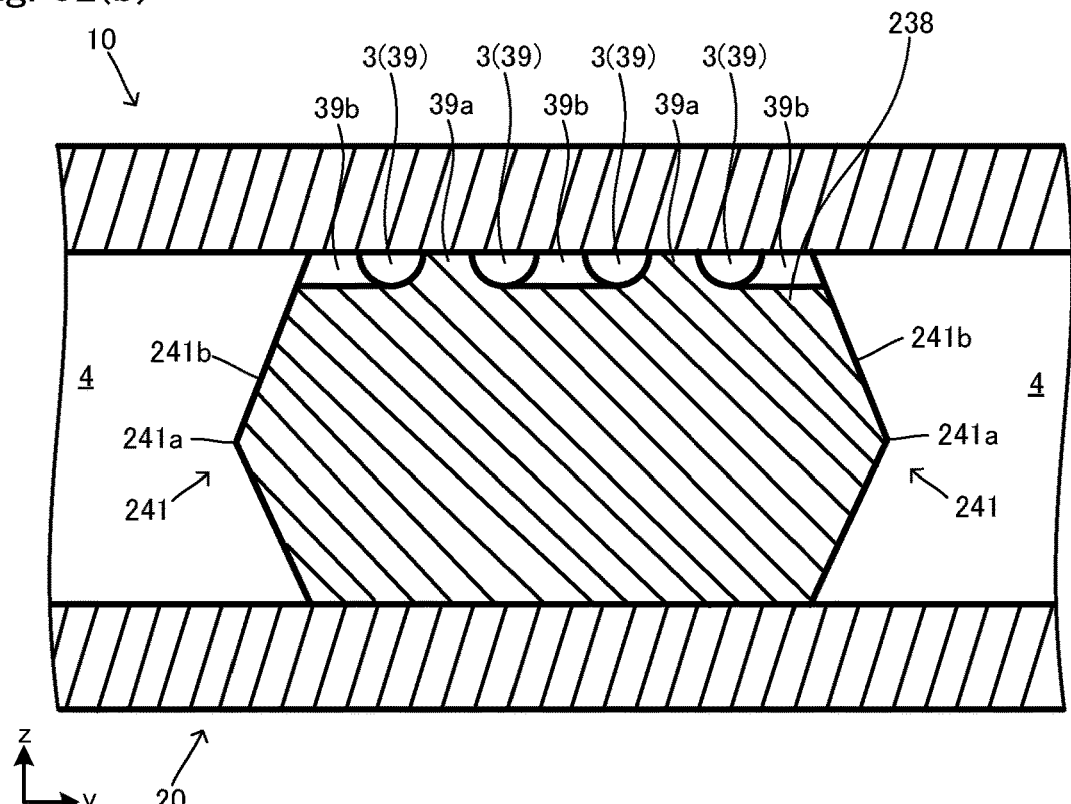

FIGS. 52(*a*) and 52(*b*) explanatorily show guiding parts according to another embodiment.

Figure 53A:
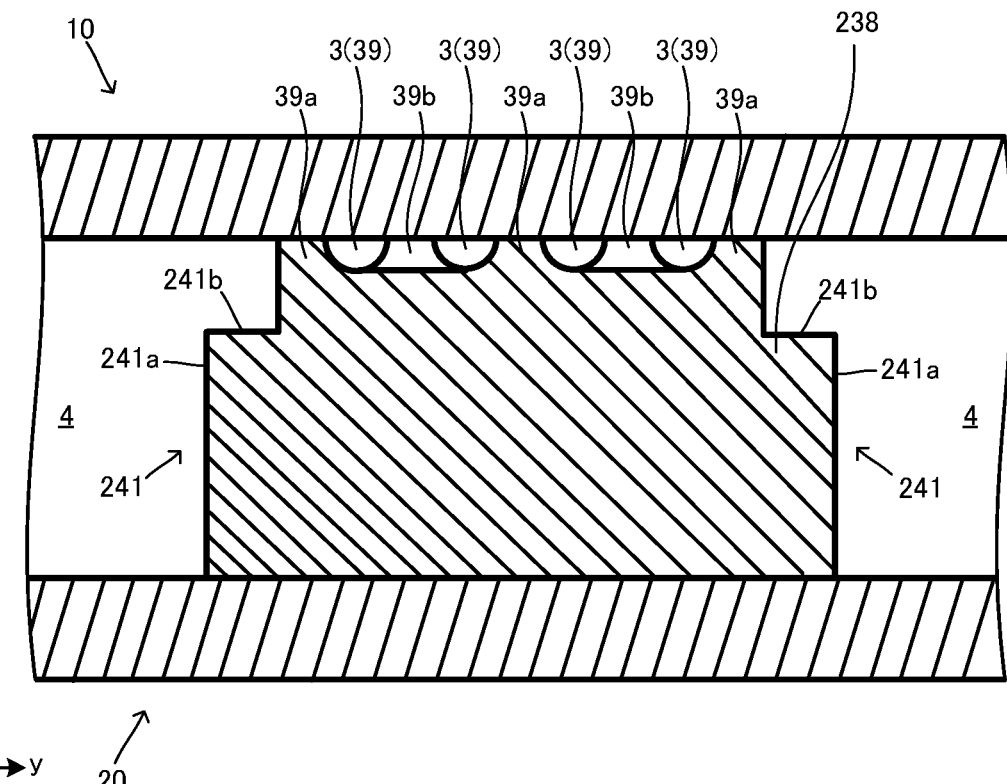
Figure 53B:
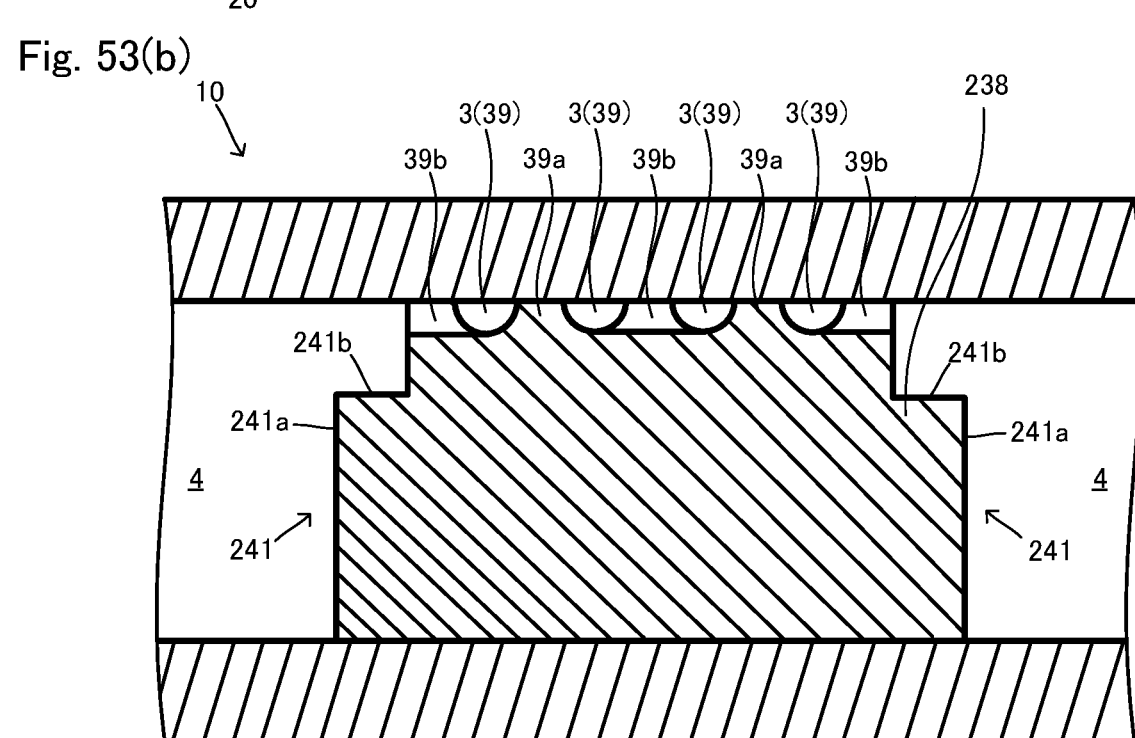

FIGS. 53(*a*) and 53(*b*) explanatorily show guiding parts according to another embodiment.

Figure 54A:
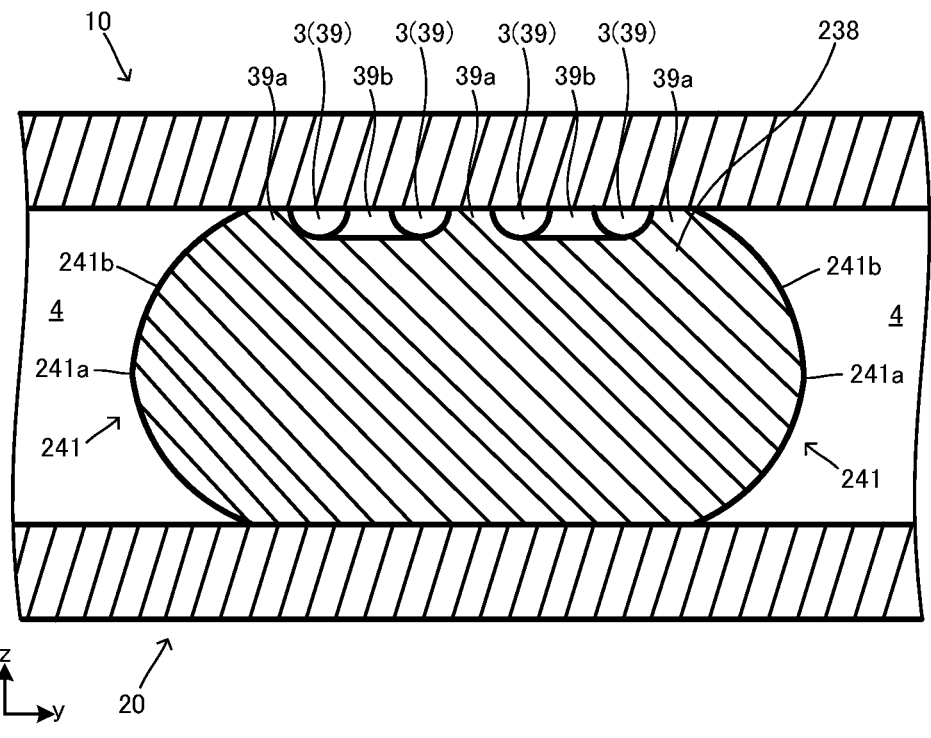
Figure 54B:
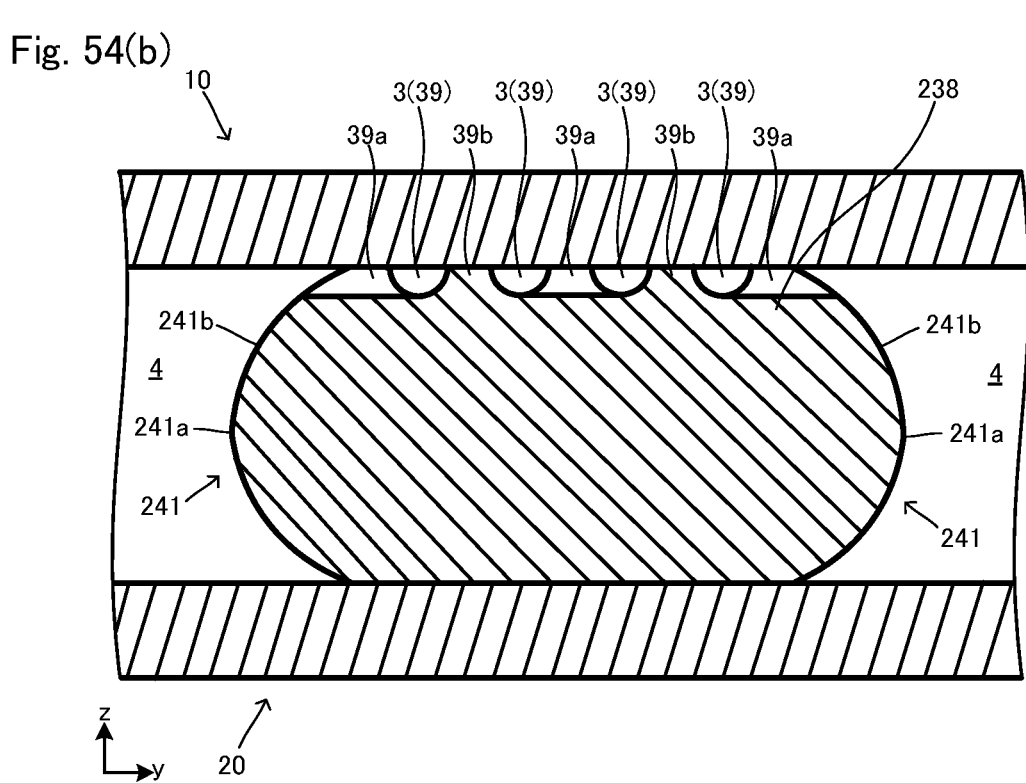

FIGS. 54(*a*) and 54(*b*) explanatorily show guiding parts according to another embodiment.

Figure 55A:
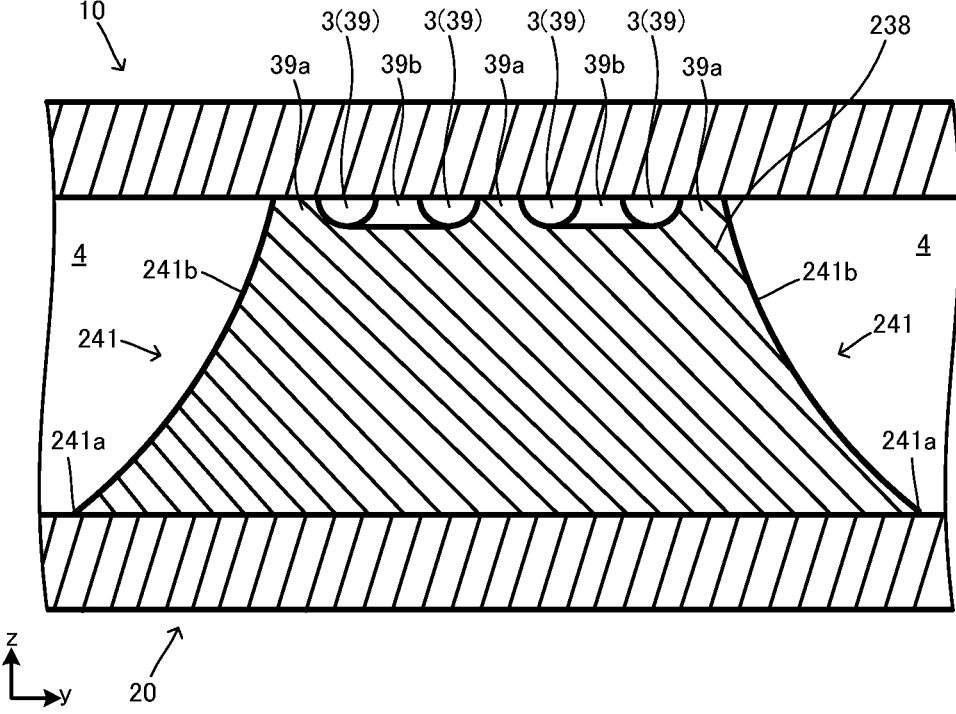
Figure 55B:
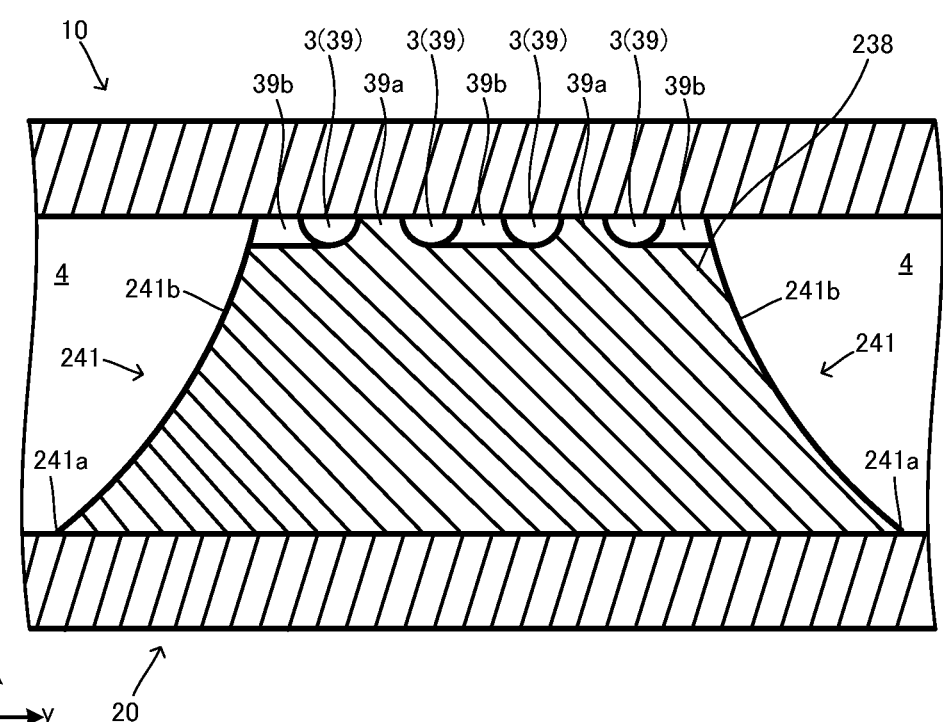

FIGS. 55(*a*) and 55(*b*) explanatorily show guiding parts according to another embodiment.

Figure 56A:
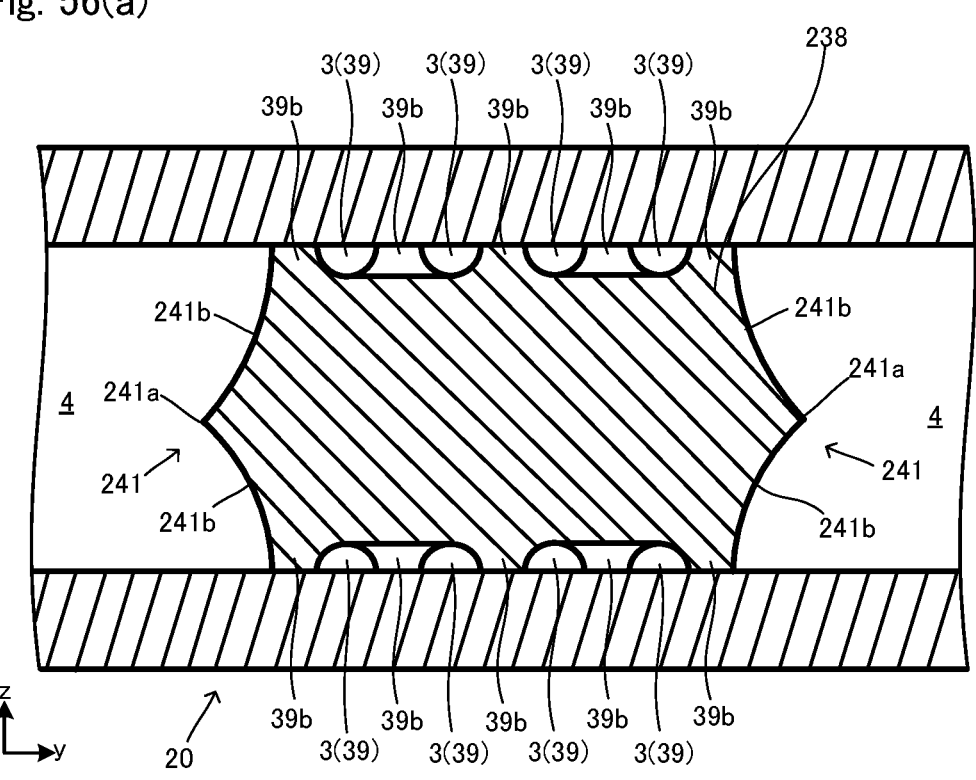
Figure 56B:
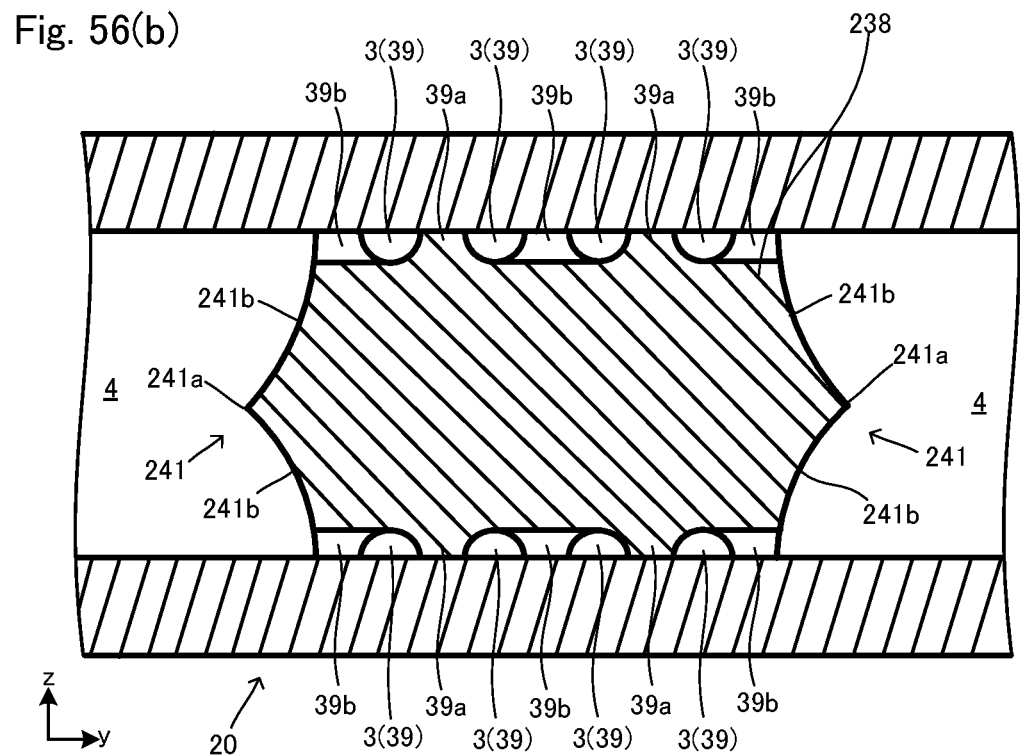

FIGS. 56(*a*) and 56(*b*) explanatorily show guiding parts according to another embodiment.

Figure 57A:
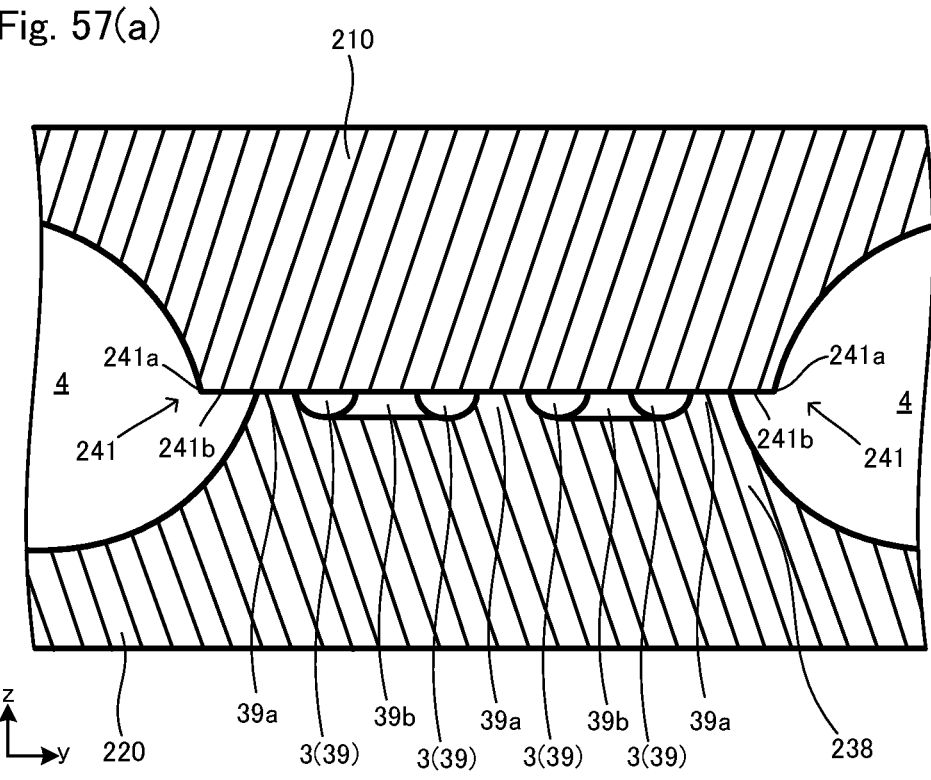
Figure 57B:
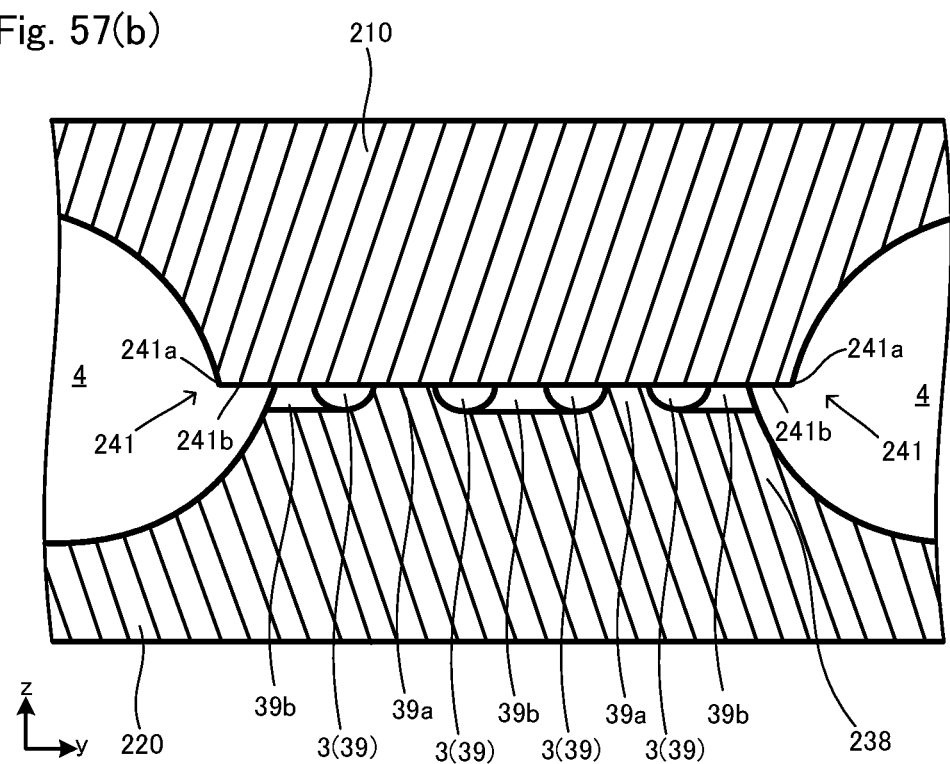

FIGS. 57(*a*) and 57(*b*) explanatorily show guiding parts according to another embodiment.

Figure 58:
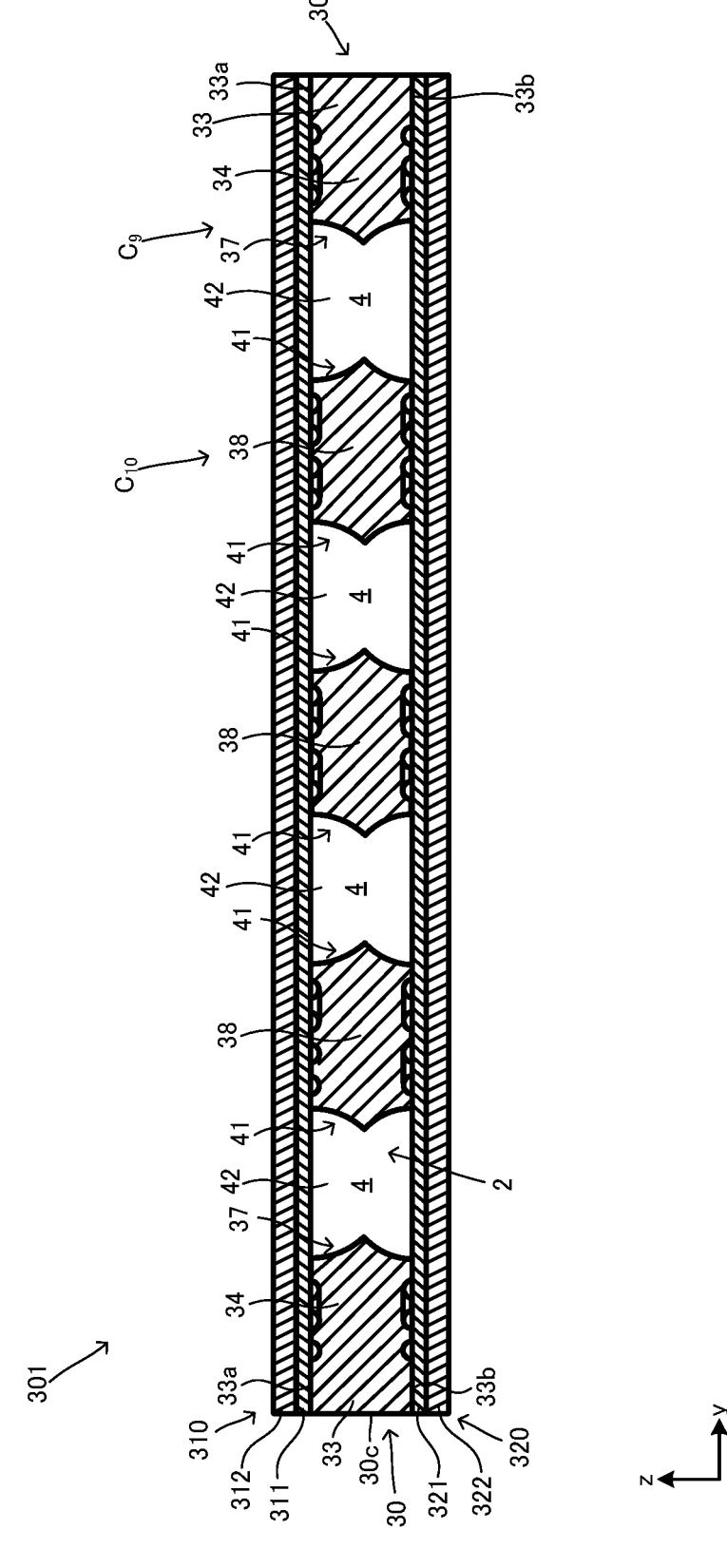

FIG. 58 is a cross-sectional view of a vapor chamber 301.

Figure 59:
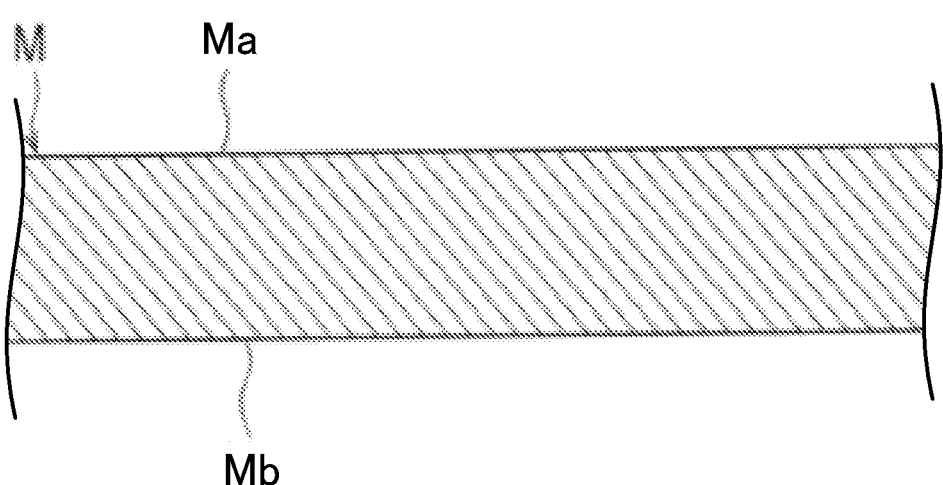
Figure 59:
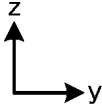

FIG. 59 explanatorily shows a production process of the vapor chamber 301.

Figure 60:
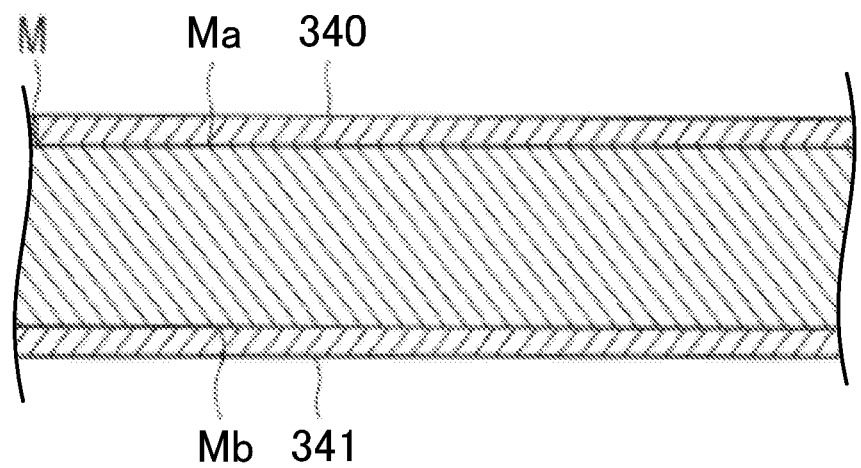
Figure 60:
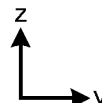

FIG. 60 explanatorily shows the production process of the vapor chamber 301.

Figure 61:
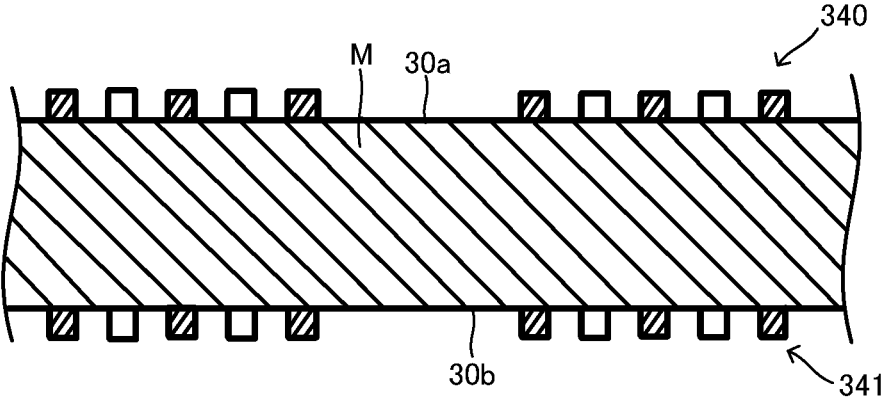
Figure 61:
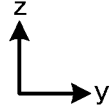

FIG. 61 explanatorily shows the production process of the vapor chamber 301.

Figure 62:
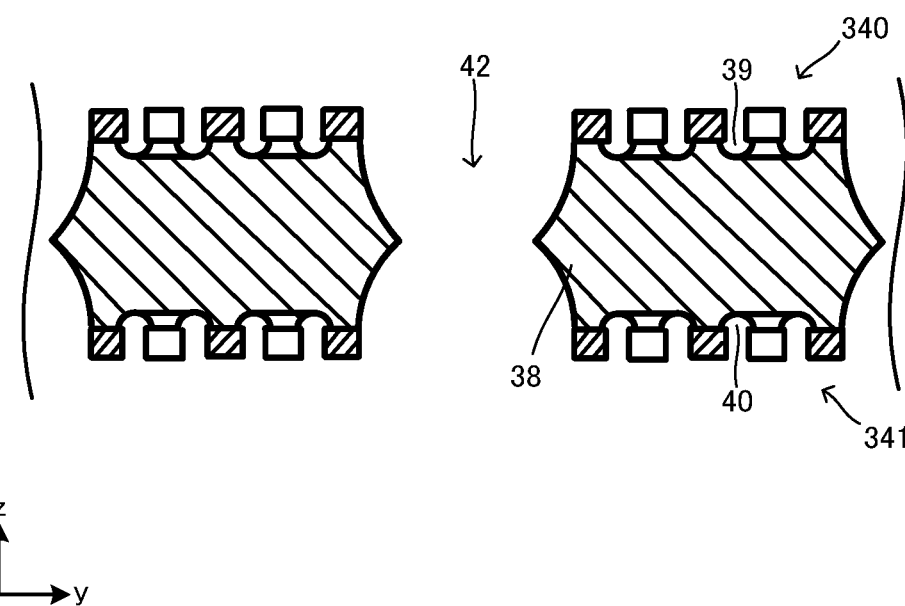

FIG. 62 explanatorily shows the production process of the vapor chamber 301.

Figure 63:
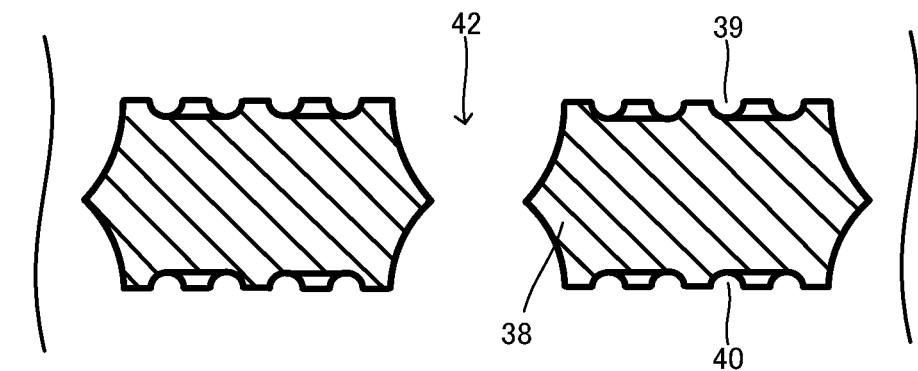
Figure 63:
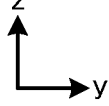

FIG. 63 explanatorily shows the production process of the vapor chamber 301.

Figure 64:
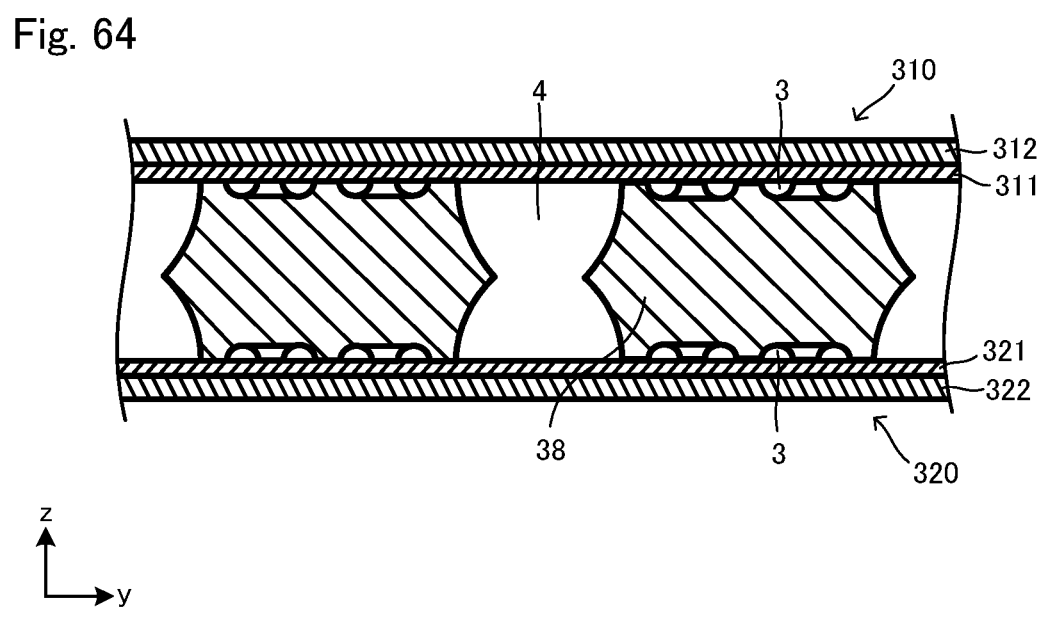

FIG. 64 explanatorily shows the production process of the vapor chamber 301.

Figure 65:
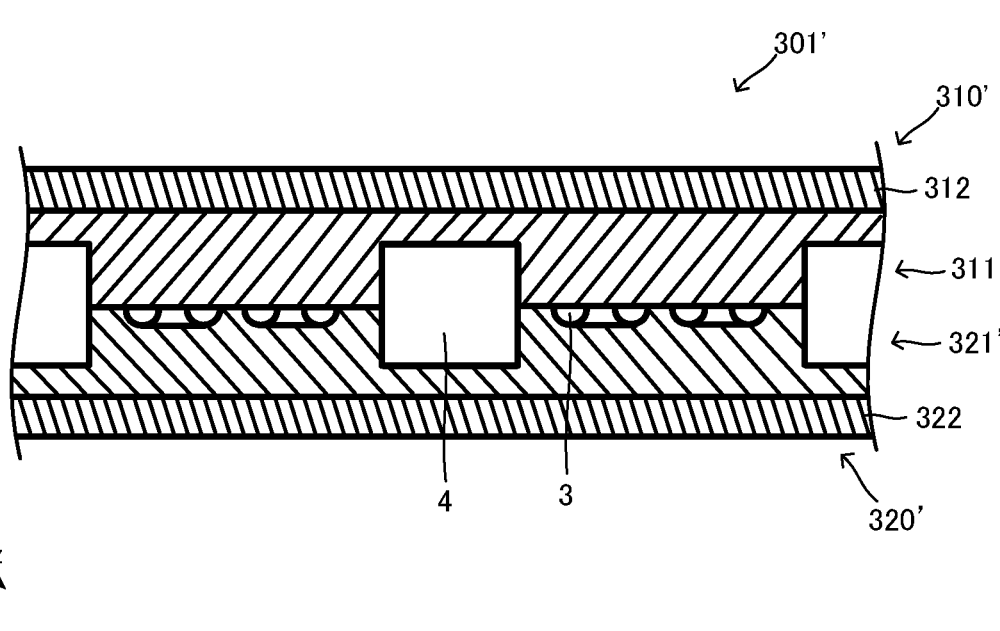

FIG. 65 is a cross-sectional view of a vapor chamber 301'.

6

Figure 66:
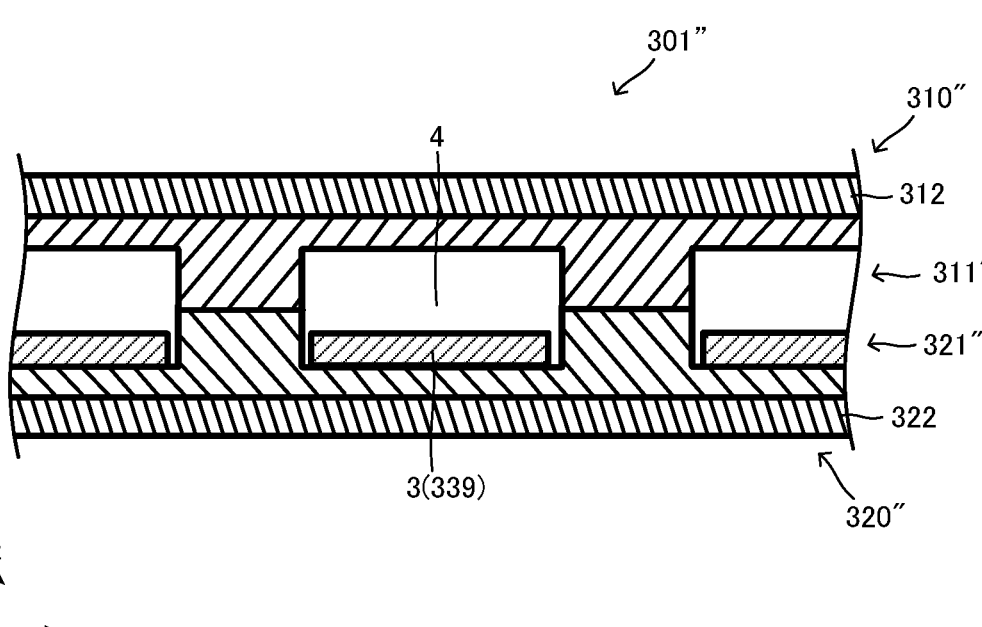

FIG. 66 is a cross-sectional view of a vapor chamber 301".

Figure 67:
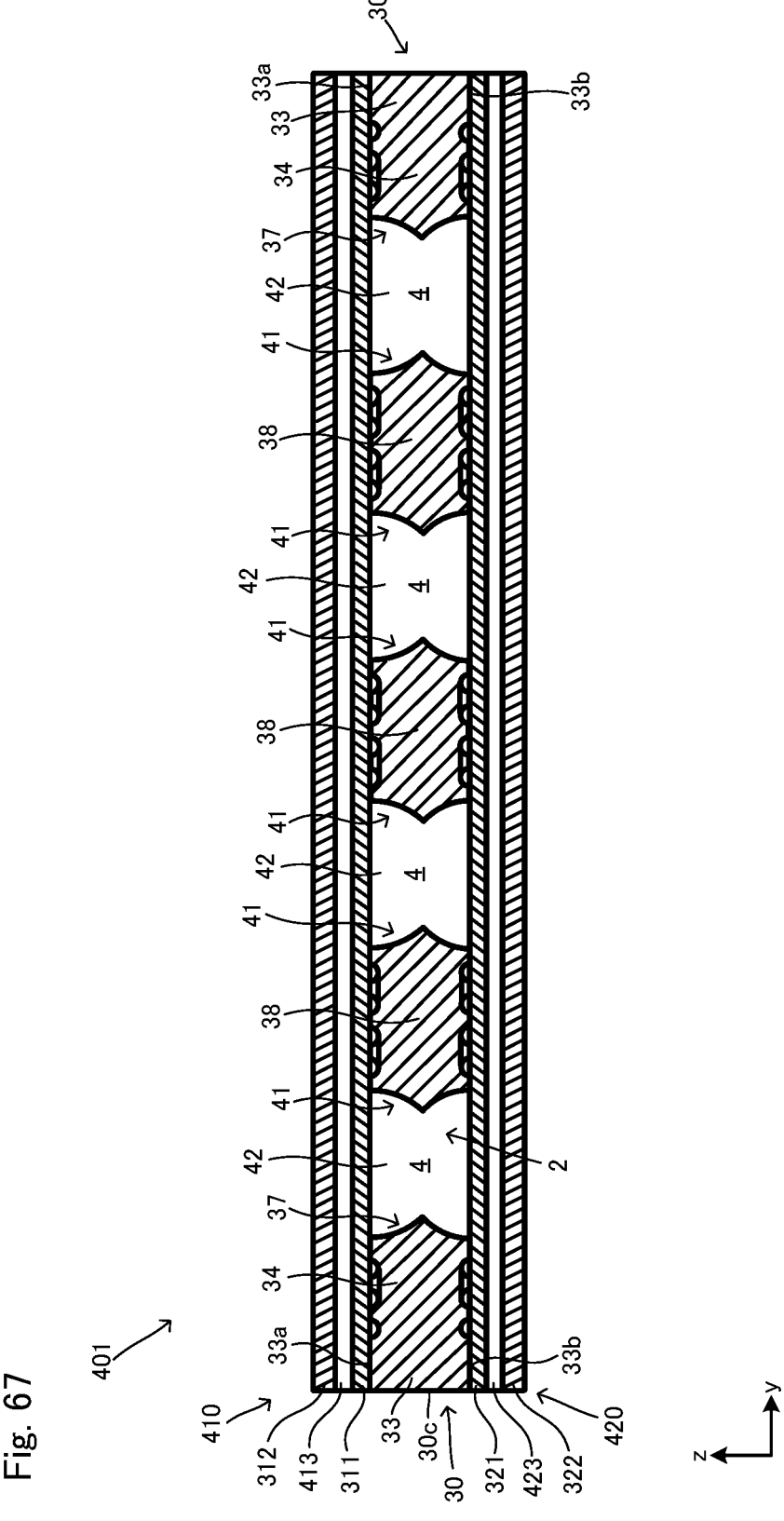

FIG. 67 is a cross-sectional view of a vapor chamber 401.

Figure 68:
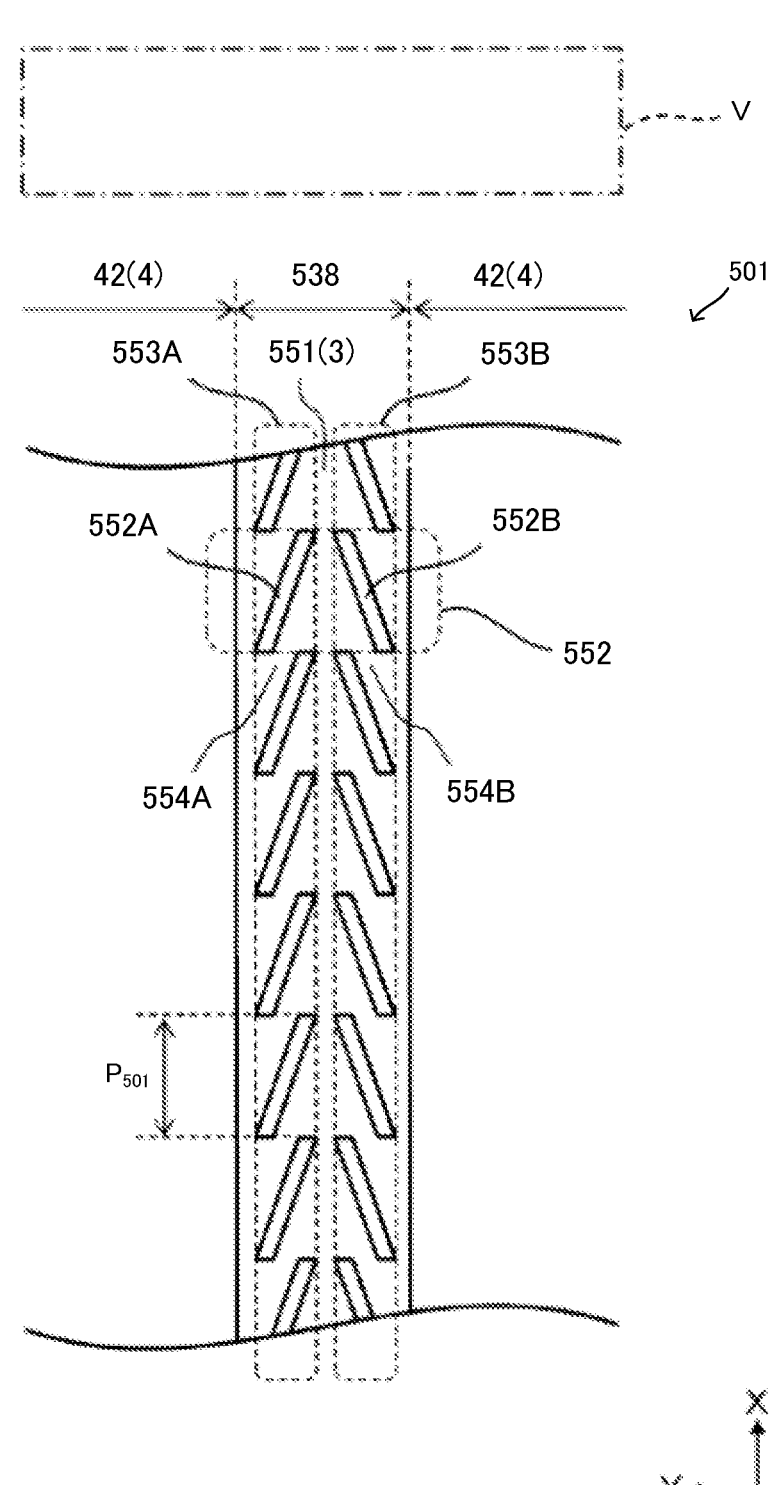

FIG. 68 explanatorily shows an inner side fluid flow path part 538 in a vapor chamber 501.

Figure 69:
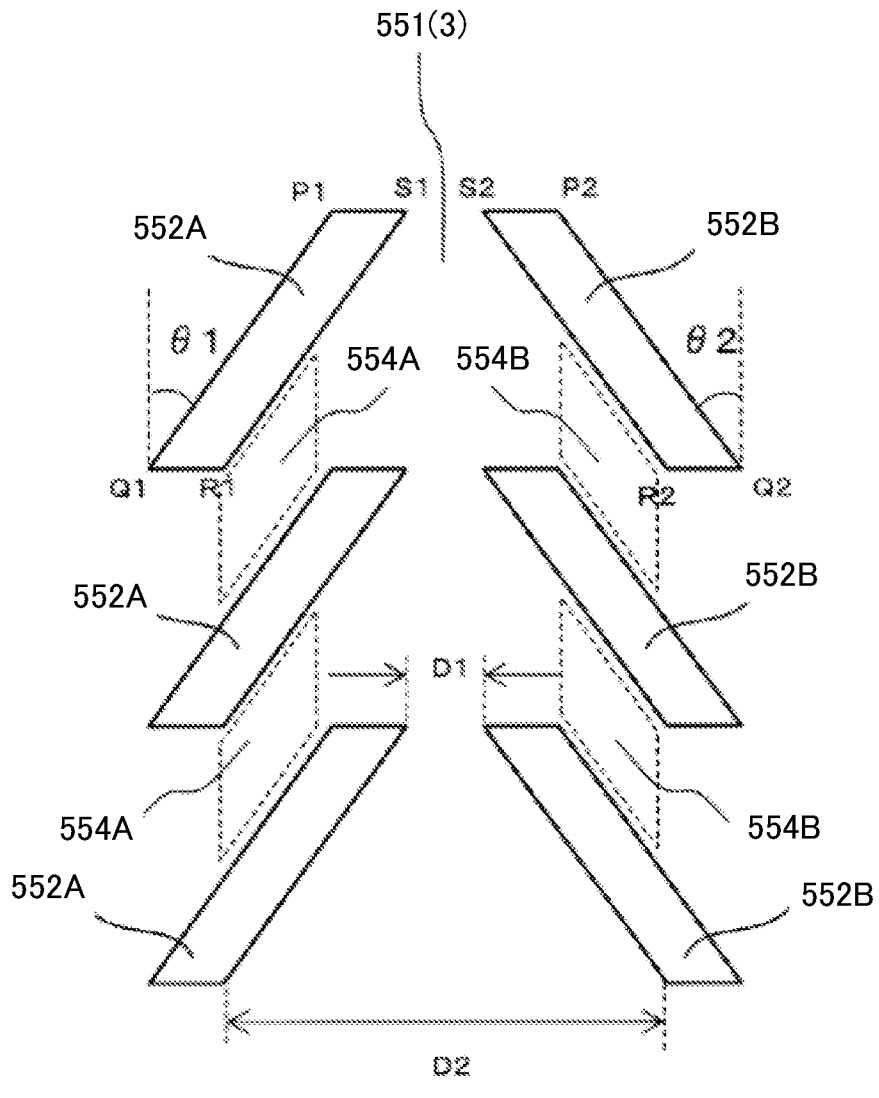
Figure 69:

FIG. 69 explanatorily shows a form of pairs of fluid flow path protrusions shown in FIG. 68.

Figure 70:
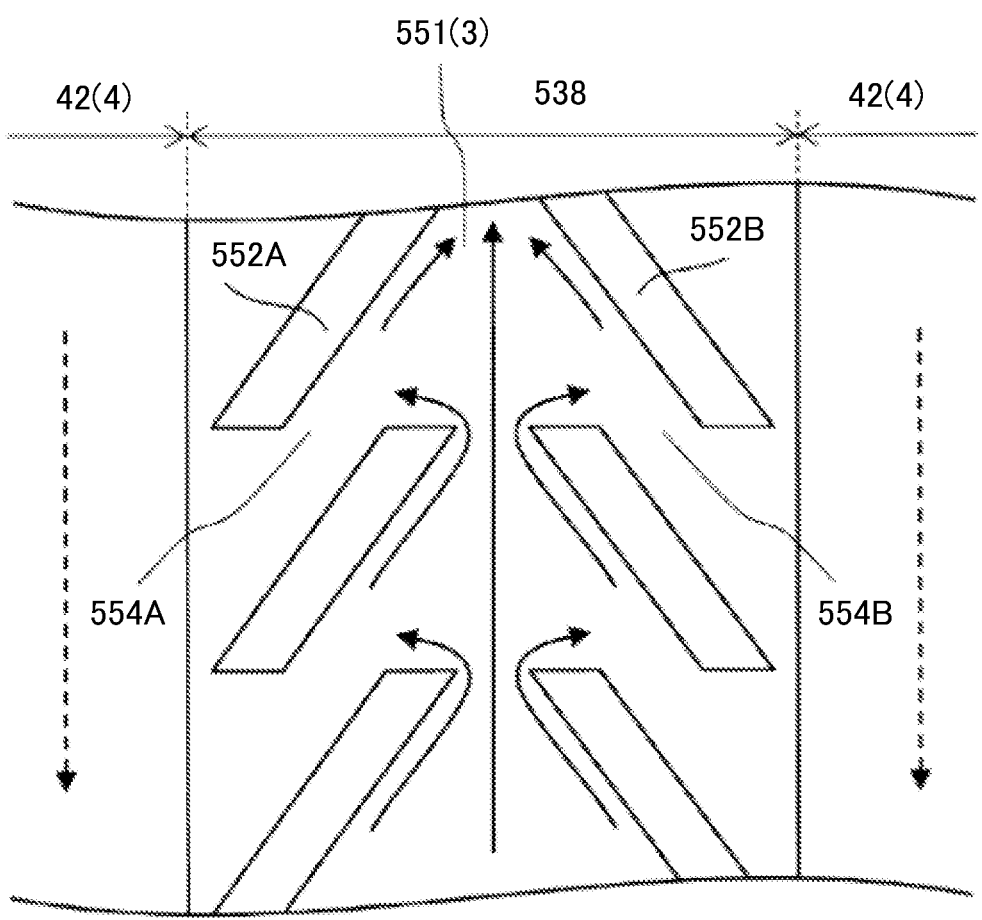
Figure 70:

FIG. 70 explanatorily shows operation of the pairs of the fluid flow path protrusions shown in FIG. 69.

Figure 71:
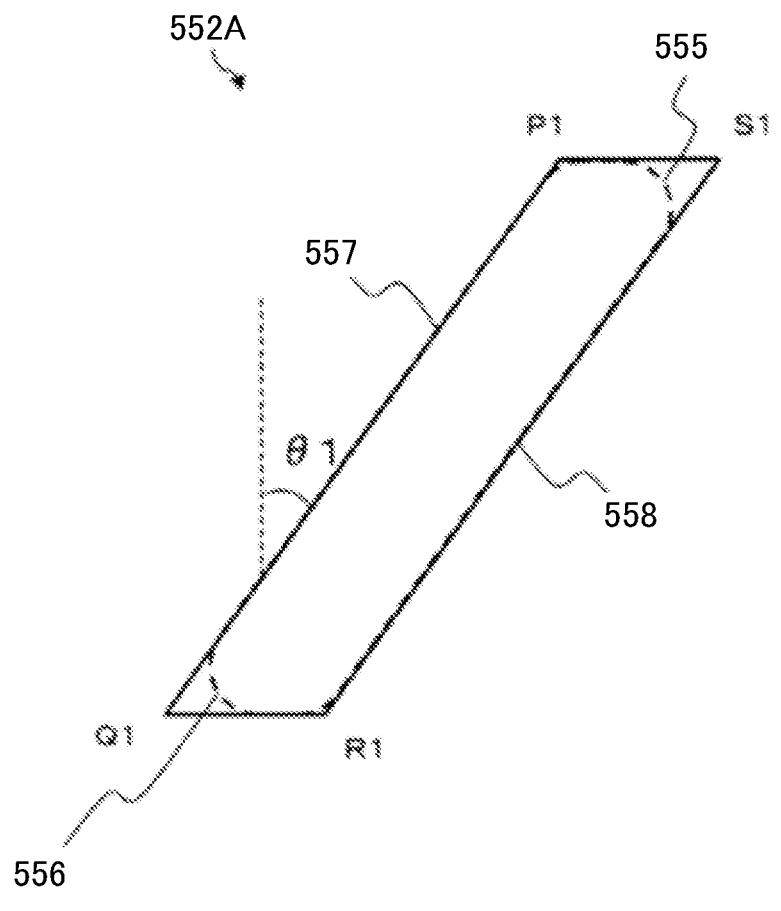

FIG. 71 explanatorily shows an actual form of any of the fluid flow path protrusions shown in FIG. 68.

Figure 72:
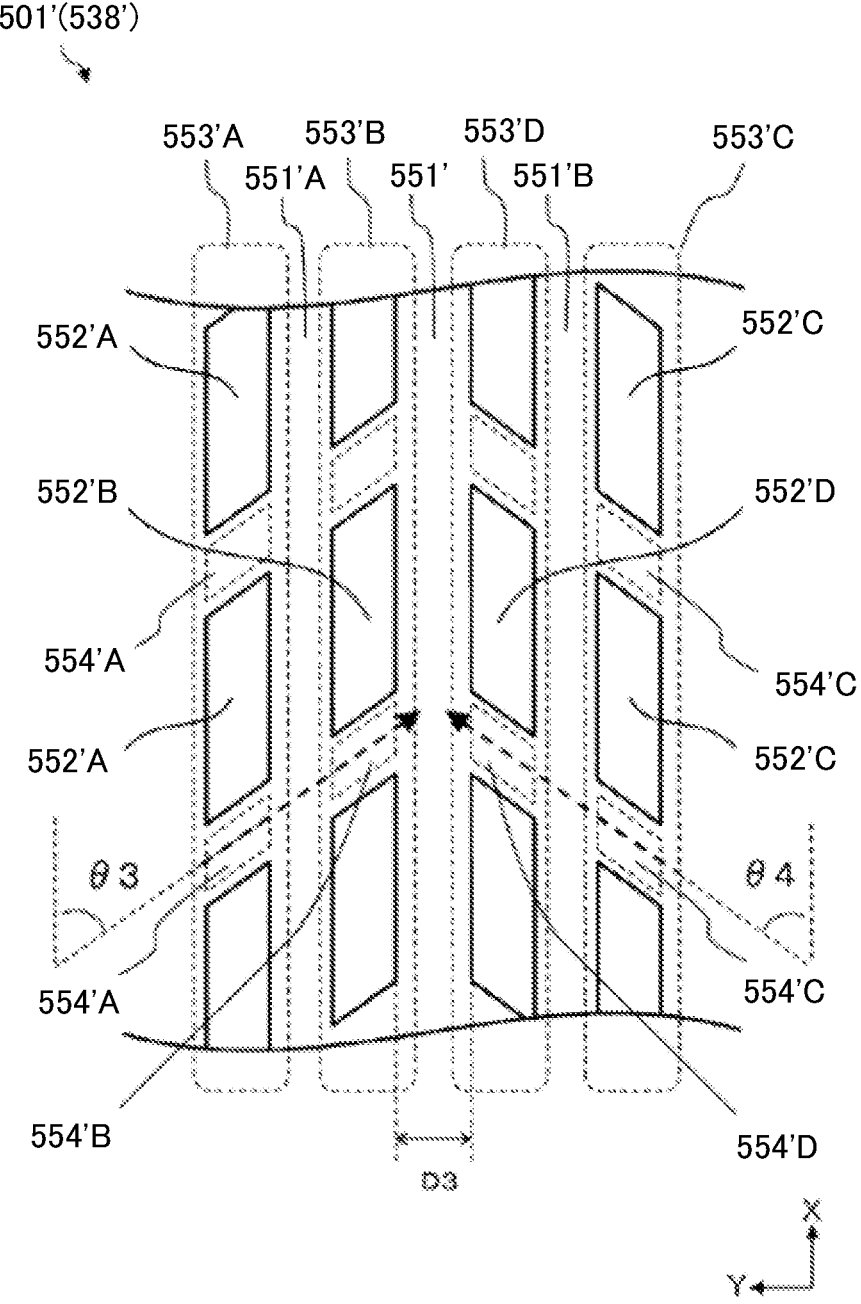

FIG. 72 explanatorily shows an inner side fluid flow path part 538' in a vapor chamber 501'.

Figure 73:
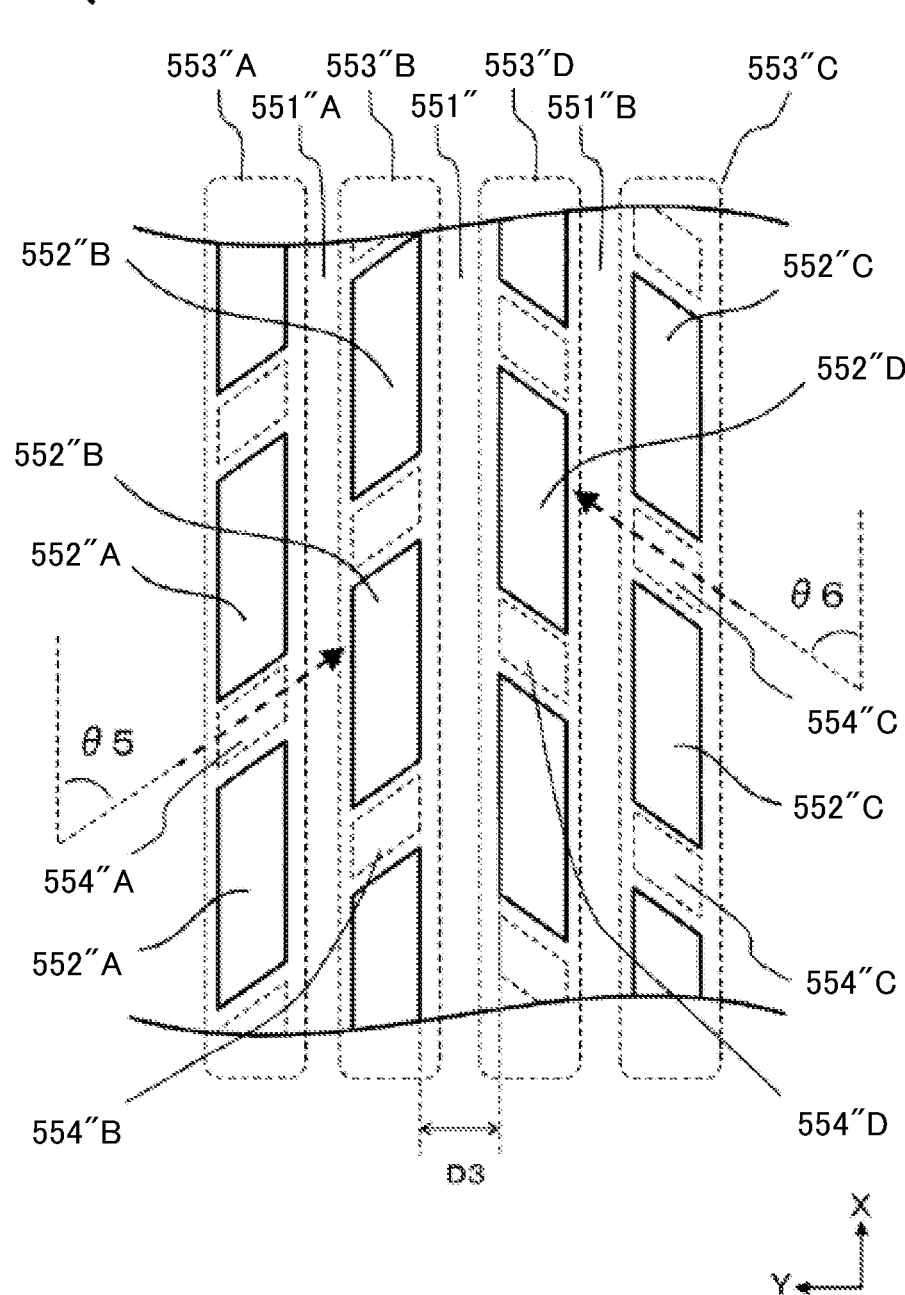

FIG. 73 explanatorily shows an inner side fluid flow path part 538" in a vapor chamber 501".

DESCRIPTION OF EMBODIMENTS

Hereinafter the present disclosure will be described based on the embodiments shown in the drawings. The following drawings may show members in modified or exaggerated size and proportion for understandability. In the following drawings, portions unnecessary for the description, and repeatedly appearing signs may be omitted for visibility.

Terms such as "parallel", "orthogonal" and "same", values of lengths, angles and physical properties, and so on used in the present description to identify shapes, geometrical conditions, physical properties and degrees thereof shall be interpreted as broadly as possible as long as the same functions can be expected, without restrictions to strict meanings thereof. Further, for clarity, the drawings show the shapes of a plurality of portions each of which the same function can be expected regularly. These shapes may be different from each other as long as the same function can be expected, without strict restrictions. The drawings show dividing lines indicating bonding faces or the like between members by simple straight lines for convenience. These lines are not limited to strict straight lines, but there are options for the shapes of the dividing lines as long as desired bondability can be expected.

1. Embodiment 1

1.1. Embodiment 1a

[Components]

Figure 1:
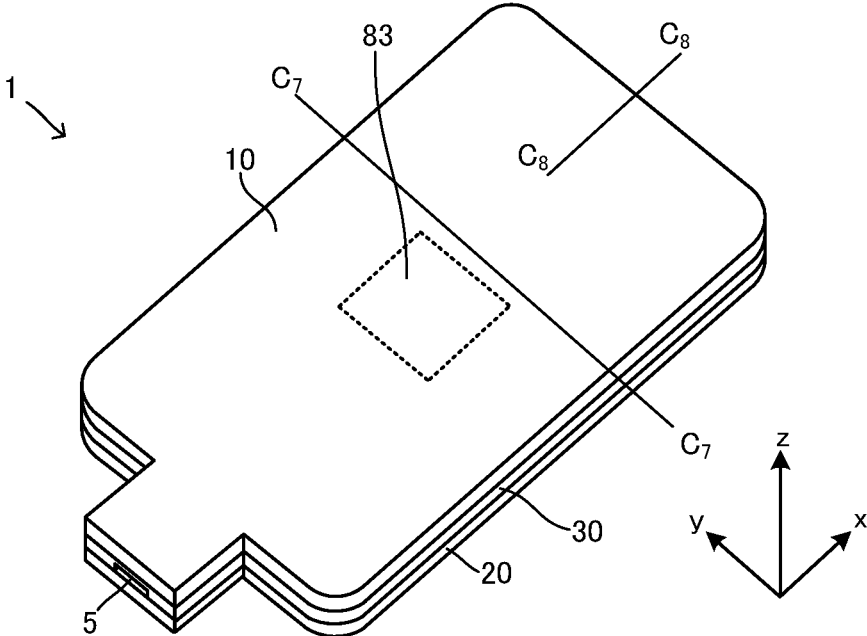
FIG. 1 is a perspective view of a vapor chamber 1.
Figure 2:
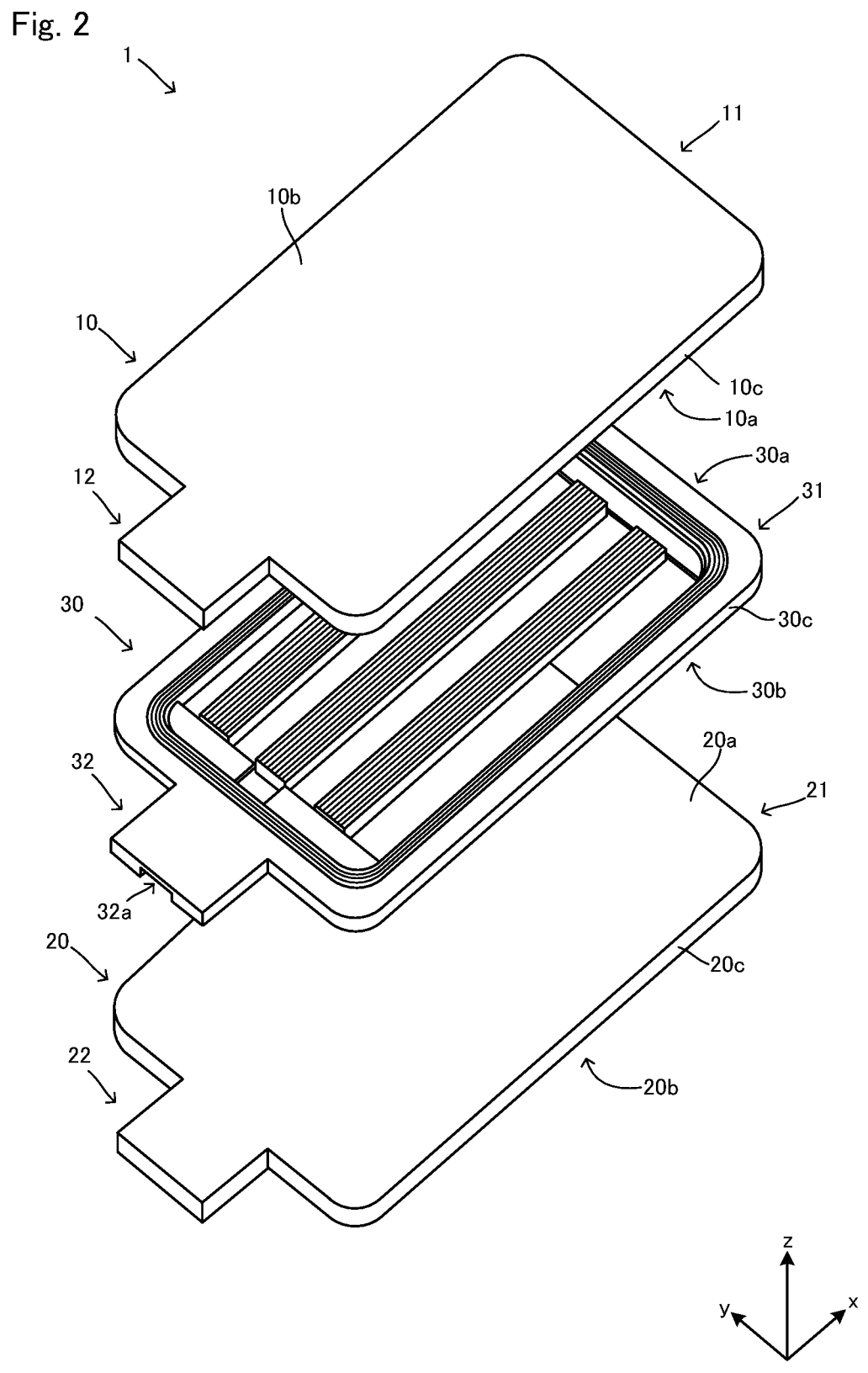

FIG. 1 is an external perspective view of a vapor chamber 1 according to Embodiment 1a. FIG. 2 is an exploded perspective view of the vapor chamber 1. For convenience, these and the following drawings also show arrows (x, y, z) indicating directions corresponding to a three-dimensional orthogonal coordinate system as necessary. Here, directions in the plane xy are tabular face directions of the tabular vapor chamber 1 and the direction z is a thickness direction.

The vapor chamber 1 according to the present embodiment has, as can be seen from FIGS. 1 and 2, a first sheet 10, a second sheet 20 and a third sheet 30 (may be referred to as "middle sheet 30"). As described later, these sheets are superposed and bonded (diffusion bonding, brazing, etc.), to form a sheet for a vapor chamber where a hollow part based on the shape of the third sheet 30 is formed between the first sheet 10 and the second sheet 20. This hollow part is an enclosure 2 (for example, see FIG. 15) when a working fluid is sealed therein, which results in obtention of the vapor chamber 1.

<First Sheet>

In the present embodiment, the first sheet 10 is, as a whole, a sheetlike member having flat front and back faces (one and the other faces in the thickness direction: an inner face 10*a* and an outer face 10*b*). The first sheet 10 is formed of flat faces on the front and back sides. The first sheet 10 includes the flat inner face 10*a*, the flat outer face 10*b* on the opposite side of the inner face 10*a*, and an end face 10*c* that forms thickness across the inner face 10*a* and the outer face 10*b*.

The first sheet 10 also includes a main body 11 and an inlet 12.

The main body 11 is a sheetlike portion to form the hollow part and the enclosure, and in the present embodiment, is a rectangle having the corners formed to be circular arcs (having what is called R) in a plan view.

Other than a quadrangle like the present embodiment, the main body 11 of the first sheet 10 may have any shape necessary for a vapor chamber according to situations. For example, the shape may be a circle, an ellipse, a triangle, any other polygon, a shape having any bend such as an L-shape, a T-shape, a crank-shape and a U-shape, or a shape in combination of at least two of them.

The inlet 12 is a portion via which a working fluid is poured into the hollow part to be formed, and in the present embodiment, is like a sheet of a quadrangle in a plan view which sticks out of one side of the main body 11, which is a rectangle in a plan view.

Such a first sheet 10 has a thickness not particularly limited. The thickness is preferably at most 1.0 mm, and may be at most 0.75 mm, and may be at most 0.5 mm. This thickness is preferably at least 0.01 mm, and may be at least 0.05 mm, and may be at least 0.1 mm. This range of the thickness may be defined by combination of any one of the foregoing plural candidate values for the upper limit and any one of the foregoing plural candidate values for the lower limit. This range of the thickness may be also defined by combination of any two of the plural candidate values for the upper limit or combination of any two of the plural candidate values for the lower limit.

This leads to a thin vapor chamber applicable to more situations.

The first sheet 10 is constituted of any material not particularly limited. The material is preferably a metal of high thermal conductivity. Examples of a metal of high thermal conductivity include copper and copper alloys. The material does not have to be a metallic material, and may be, for example, a ceramic such as AlN, $Si_3N_4$ and $Al_2O_3$, and a resin such as polyimide and epoxy.

A laminate of at least two materials in one sheet may be used. Different materials may be used for different portions.

The first sheet 10 may be a single layer, or may be formed by laminating a plurality of sheets. For example, a sheet formed by laminating a plurality of layers each having different strength (clad material) may be used.

<Second Sheet>

In the present embodiment, the second sheet 20 is also, as a whole, a sheetlike member having flat front and back faces. The second sheet 20 is formed of flat faces on the front and back sides. The second sheet 20 includes a flat inner face 20*a*, a flat outer face 20*b* on the opposite side of the inner face 20*a*, and an end face 20*c* that forms thickness across the inner face 20*a* and the outer face 20*b*.

The second sheet 20 includes a main body 21 and an inlet 22 as well as the first sheet 10.

Other than the foregoing, the second sheet 20 may be considered the same as the first sheet 10. The thickness or the material of the second sheet 20 does not have to be the same as the first sheet 10. The structure of the second sheet 20 may be different from the first sheet 10 in thickness and material.

The second sheet 20 may be a single layer or may be formed by laminating a plurality of sheets as well. For example, a sheet formed by laminating a plurality of layers each having different strength (clad material) may be used.

<Third Sheet>

In the present embodiment, the third sheet 30 is a sheet held between and superposed on the inner face 10*a* of the first sheet 10 and the inner face 20*a* of the second sheet 20. The third sheet 30 has a structure for the enclosure 2 where a working fluid moves.

Figure 3:
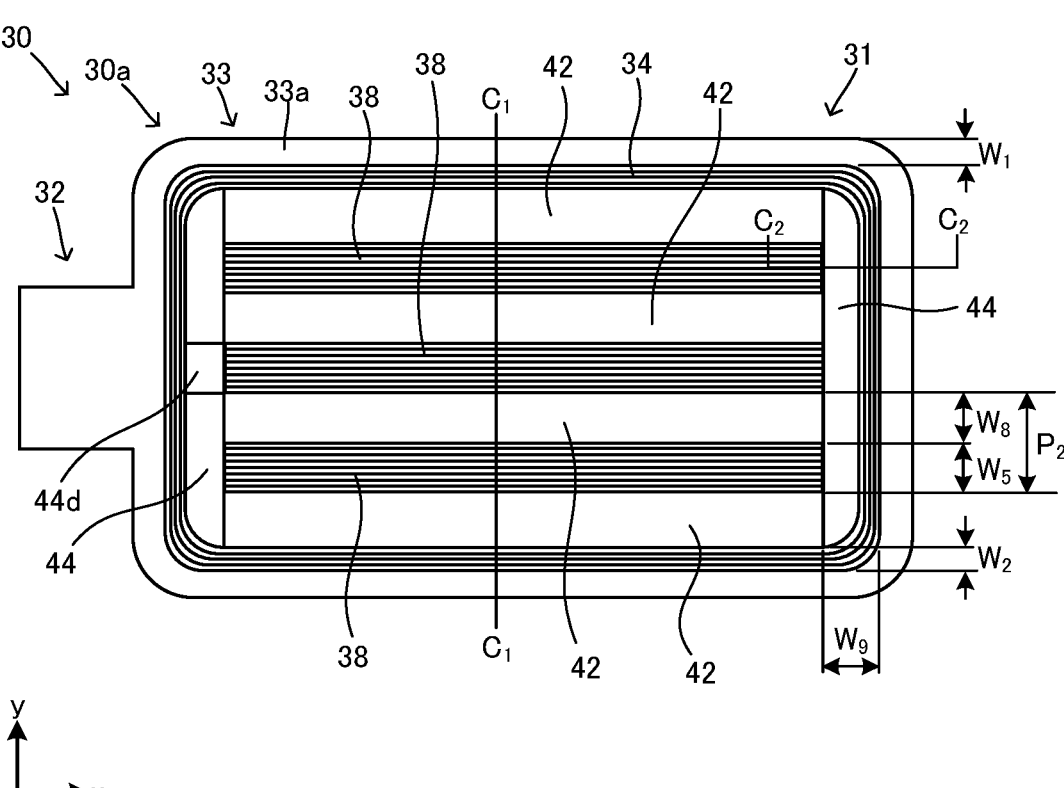
FIG. 3 shows a third sheet 30 in the direction z.
Figure 4:
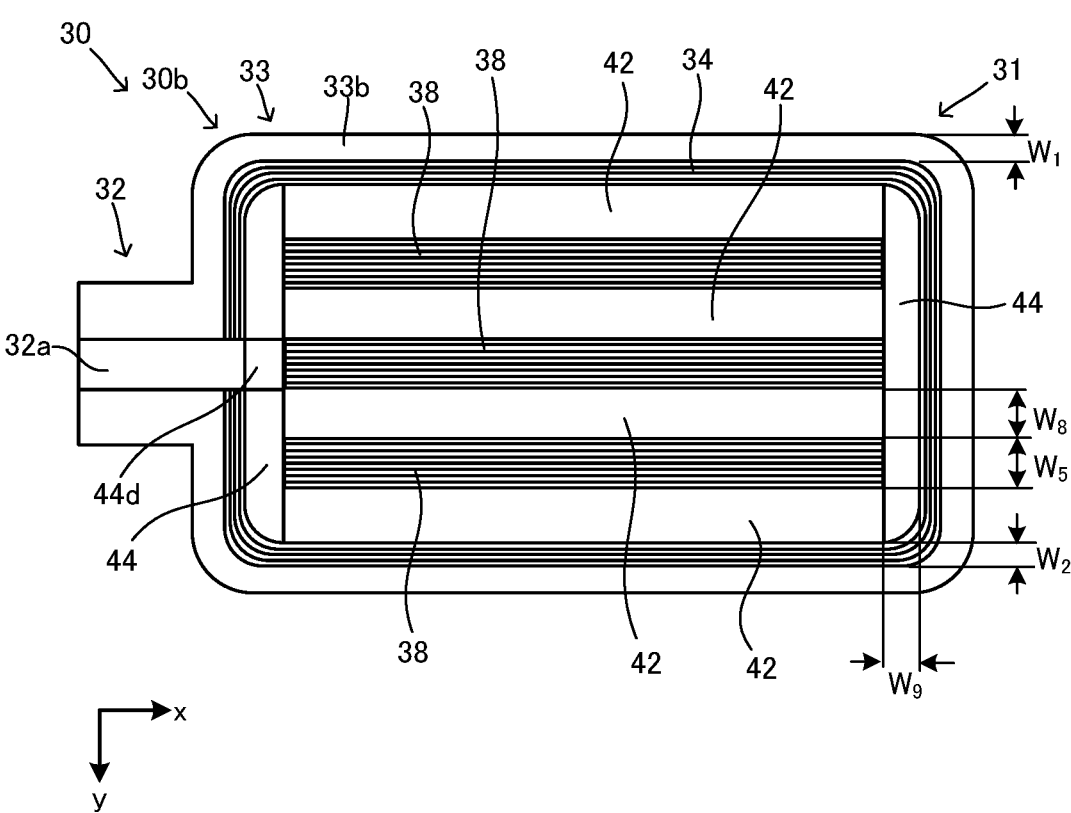
FIG. 4 shows the third sheet 30 viewed on the opposite side of FIG. 3.

FIGS. 3 and 4 are plan views of the third sheet 30 (viewed in the direction z). FIG. 3 shows a face to be superposed on the first sheet 10. FIG. 4 shows a face to be superposed on the second sheet 20.

Figure 5:
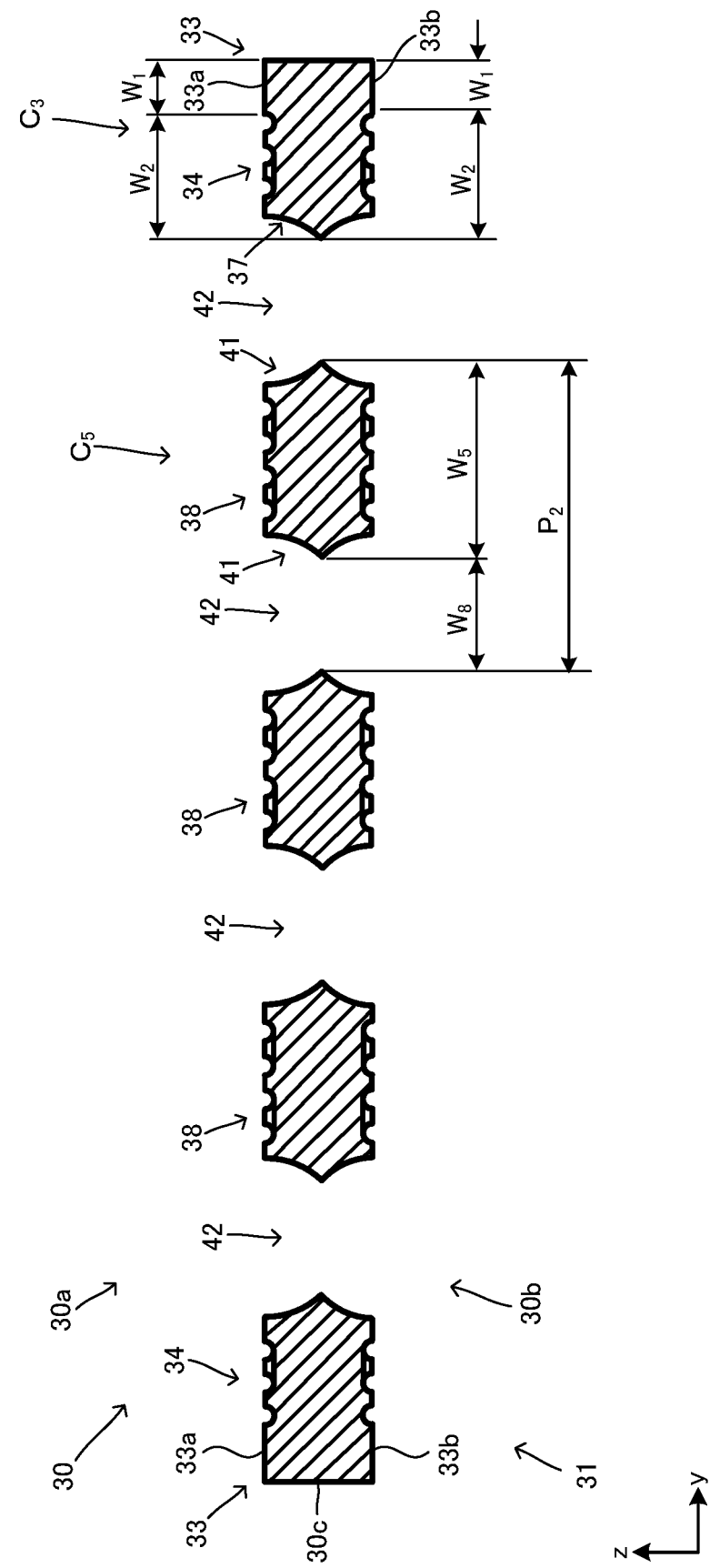
FIG. 5 is a cross-sectional view of the third sheet 30.
Figure 6:
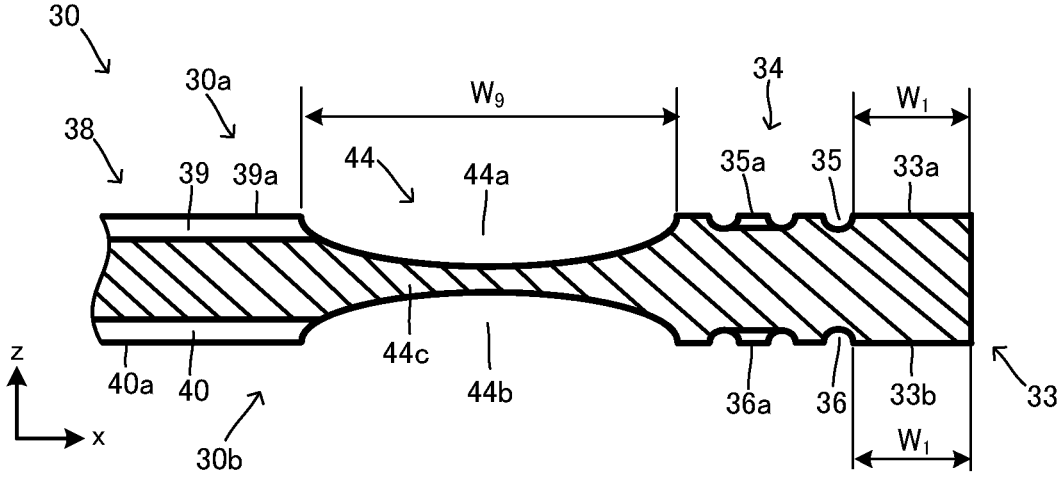
FIG. 6 is another cross-sectional view of the third sheet 30.

FIG. 5 shows a cross section taken along the line $C_1$-$C_1$ in FIG. 3. FIG. 6 shows a cross section taken along the line $C_2$-$C_2$ in FIG. 3. On the cross sections, portions according to cutting planes are shown by hatching (diagonal lines), and portions not according to cutting planes but necessary for display in portions shown in the cross sections are shown without hatching. The same applies to the following drawings.

The third sheet 30 may be a single layer or may be formed by laminating a plurality of sheets, as well. When the third sheet 30 is formed by laminating a plurality of sheets, the following structure may be formed after a plurality of the sheets are laminated, or may be formed by individually processing and thereafter laminating a plurality of the sheets.

In the present embodiment, the third sheet 30 includes a first face 30*a* that is to be superposed on the inner face 10*a* of the first sheet 10, a second face 30*b* that is to be superposed on the inner face 20*a* of the second sheet 20, and an end face 30*c* that forms thickness across the first face 30*a* and the second face 30*b*. Thus, FIG. 3 shows the first face 30*a* and FIG. 4 shows the second face 30*b*.

The third sheet 30 includes a main body 31 and an inlet 32.

The main body 31 is a sheetlike portion to form the hollow part in the sheet for a vapor chamber, and the enclosure in the vapor chamber 1. In the present embodiment, the main body 31 is a rectangle having the corners formed to be circular arcs (having what is called R) in a plan view.

Other than a quadrangle like the present embodiment, the main body 31 may have any shape necessary for a vapor chamber. For example, the shape may be a circle, an ellipse, a triangle, any other polygon, a shape having any bend such as an L-shape, a T-shape, a crank-shape and a U-shape, or a shape in combination of at least two of them.

The inlet 32 is a portion via which a working fluid is poured into the hollow part to be formed, and in the present embodiment, is like a sheet of a quadrangle in a plan view which sticks out of one side of the main body 31, which is a rectangle in a plan view. A groove 32*a* that allows the end face 30*c* to communicate with the main body 31 is disposed on the inlet 32 on the second face 30*b* side.

The third sheet 30 may have a thickness of 0.03 mm to 0.8 mm. The thickness of the third sheet 30 is preferably more than that of each of the first sheet 10 and the second sheet 20. This makes it possible to secure a large cross section of vapor flow paths 4 to be described later, which can lead to smoother movement of the working fluid.

The material of the third sheet 30 may be considered the same as those of the first sheet 10 and the second sheet 20.

A structure for refluxing a working fluid is formed in the main body 31. Specifically, the main body 31 is constituted of a peripheral bonding part 33, a peripheral fluid flow path part 34, inner side fluid flow path parts 38, vapor flow path grooves 42 and vapor flow path communicating grooves 44.

The vapor chamber 1 according to the present embodiment includes the vapor flow paths 4 that are first flow paths and thorough which a vapor of a working fluid passes (see FIG. 15 etc.) and condensate flow paths 3 that are second flow paths and thorough which a condensate that is a working fluid condensing to liquefy passes (see FIG. 18 etc.). The vapor flow path grooves 42 of the third sheet 30 form the vapor flow paths 4, and fluid flow path grooves 35 and fluid flow path grooves 36 (see FIG. 7 etc.) included in the peripheral fluid flow path part 34, and fluid flow path grooves 39 and fluid flow path grooves 40 (see FIGS. 13(*a*) and 13(*b*) etc.) included in the inner side fluid flow path parts 38 form the condensate flow paths 3.

<<Peripheral Bonding Part>>

The peripheral bonding part 33 is a portion disposed along the periphery of the main body 31, and includes a peripheral bonding face 33*a* disposed on the first face 30*a* of the main body 31, and a peripheral bonding face 33*b* disposed on the second face 30*b* thereof. The peripheral bonding face 33*a* is superposed on the periphery of the inner face 10*a* of the first sheet 10, and the peripheral bonding face 33*b* is superposed on the periphery of the inner face 20*a* of the second sheet 20. The peripheral bonding faces 33*a* and 33*b* are each bonded (diffusion bonding, brazing, etc.) to form the hollow part based on the shape of the third sheet 30 between the first sheet 10 and the second sheet 20. The hollow part becomes the enclosure when a working fluid is sealed therein.

The peripheral bonding part 33 (peripheral bonding faces 33*a* and 33*b*) has a width indicated by $W_1$ in FIGS. 3 to 7 (size in a direction orthogonal to the extending direction of the peripheral bonding part 33) which may be suitably set as necessary. This width $W_1$ is preferably at most 3.0 mm, and may be at most 2.5 mm, and may be at most 2.0 mm. The width $W_1$ more than 3.0 mm leads to a small internal volume of the enclosure, which may make it impossible to sufficiently secure the vapor flow paths and the condensate flow paths. The width $W_1$ is preferably at least 0.1 mm, and may be at least 0.4 mm, and may be at least 0.8 mm. The width $W_1$ less than 0.1 mm may lead to lack of the bonding area in misalignment between the sheets in the bonding. The range of the width $W_1$ may be defined by combination of any one of the foregoing plural candidate values for the upper limit and any one of the foregoing plural candidate values for the lower limit. The range of the width $W_1$ may be also defined by combination of any two of the plural candidate values for the upper limit or combination of any two of the plural candidate values for the lower limit.

<<Peripheral Fluid Flow Path Part>>

The peripheral fluid flow path part 34 is a portion that functions as a fluid flow path part, and forms a part of the condensate flow paths 3, which are the second flow paths where a working fluid condensing to liquefy passes. FIGS. 7(*a*) and 7(*b*) each show an enlarged portion indicated by the arrow $C_3$ in FIG. 5. FIG. 8 is an enlarged plan view of the peripheral fluid flow path part 34 viewed in a direction indicated by the arrow $C_4$ in FIG. 7 (viewed in the direction z). That is, FIG. 8 shows part of the peripheral fluid flow path part 34 viewed from the first face 30*a*.

Here, FIG. 7(*a*) is a cross-sectional view taken along the arrows $C_{15}$-$C_{15}$ in FIG. 8, and FIG. 7(*b*) is a cross-sectional view taken along the arrows $C_{16}$-$C_{16}$ in FIG. 8. FIG. 7(*a*) shows a cross section where a protrusion 35*a* is arranged on a guiding part 37 side. FIG. 7(*b*) is a cross section where a communicating opening part 35*b* is arrange on the guiding part 37 side.

As can be seen from these drawings, the peripheral fluid flow path part 34 is a portion of the main body 31 which is formed along the inside of the peripheral bonding part 33 and disposed along the periphery of a portion to be the enclosure 2. The fluid flow path grooves 35 (on the first face 30*a* side) and the fluid flow path grooves 36 (on the second face 30*b* side) which are a plurality of grooves extending in the direction of the periphery of the main body 31 are formed on the first face 30*a* and the second face 30*b* of the peripheral fluid flow path part 34, respectively. A plurality of the fluid flow path grooves 35 and 36 are arranged at given intervals in a direction different from the extending direction thereof. Thus, as can be seen from FIGS. 5 to 7, on the cross section of the peripheral fluid flow path part 34, the fluid flow path grooves 35, which are recesses on the first face 30*a* side, and the protrusions 35*a* between the fluid flow path grooves 35 are formed as recesses and protrusions are repeated.

Further, the fluid flow path grooves 36, which are recesses on the second face 30*b* side, and protrusions 36*a* between the fluid flow path grooves 36 are formed as recesses and protrusions are repeated. That is, in the present embodiment, the fluid flow path grooves to be the condensate flow paths 3 are disposed on one and the other sides (front and back faces) in the thickness direction (direction z).

As described above, the first face 30*a* and the second face 30*b* provided with a plurality of the fluid flow path grooves 35 and 36, respectively, make it possible to secure a suitable magnitude of the cross-sectional area of a flow path as a whole of the condensate flow paths 3 in total to allow a condensate of a necessary flow rate to flow, and also make it possible for the fluid flow path grooves 35 and 36 each having a shallow depth and a narrow width to make the cross-sectional area of the flow paths of the condensate flow paths 3, which are the second flow paths (see FIGS. 17(*a*) and 17(*b*) etc.), small to use a great capillary force.

The depth and width may be each different between the one and the other sides (front and back faces), that is, the fluid flow path grooves 35 and 36. According to this, the flow rate and the capillary force can be independently adjusted according to the final products.

Here, since being grooves, the fluid flow path grooves 35 and 36 each have a bottom portion, and each open on the opposite side facing this bottom portion, in a cross-sectional shape thereof. As described later, these openings form the condensate flow paths 3 when the first sheet 10 and the second sheet 20 are superposed on the third sheet 30 to close the openings.

In the present embodiment, the fluid flow path groove 35 and 36 each have a semi-elliptical cross-sectional shape. This cross-sectional shape is not limited to a semi-elliptical shape, and may be a circle, a quadrangle such as a rectangle, a square and a trapezoid, any other polygon, or a shape of combination of any of them.

Further, in the present embodiment, as can be seen from FIG. 8, in the peripheral fluid flow path part 34, adjacent fluid flow path grooves 35 communicate with each other at given intervals via the communicating opening parts 35*b*. This promotes equalization of the amounts of a condensate between a plurality of the fluid flow path grooves 35, to allow the condensate to efficiently flow, and to make it possible to smoothly reflux the working fluid. FIG. 8 illustrates the fluid flow path grooves 35, the protrusions 35a and the communicating opening parts 35b because showing the first face 30a side. However, the fluid flow path grooves 36 and the protrusions 36a disposed on the second face 30b side provided with communicating opening parts 36b not shown may be considered the same as the fluid flow path grooves 35, the protrusions 35a and the communicating opening parts 35b.

In the present embodiment, as shown in FIG. 8, the communicating opening parts 35b may be arranged at different positions across each of the fluid flow path grooves 35b in the extending direction of the fluid flow path grooves 35b. That is, the protrusions 35a and the communicating opening parts 35b are alternately arranged in a direction orthogonal to the extending direction of the fluid flow path grooves. The present invention is not limited thereto. For example, as shown in FIG. 9, the communicating opening parts 35b may be arranged at the same position so as to face each other across each of the fluid flow path grooves 35b in the extending direction of the fluid flow path grooves 35b.

Figure 10:
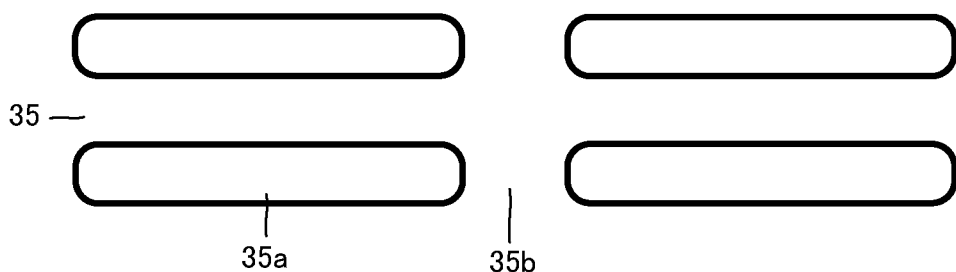
FIG. 10 explanatorily shows a peripheral fluid flow path part of another example.
Figure 11:
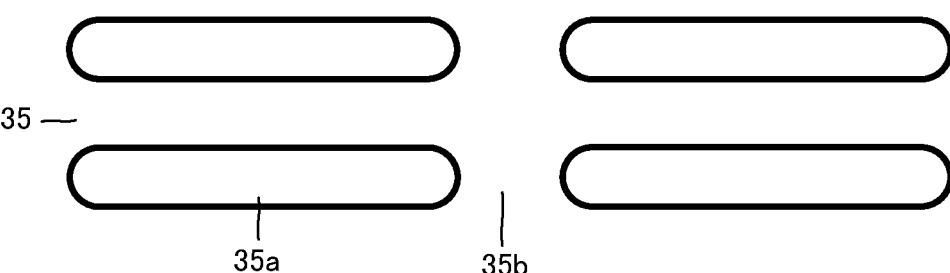
FIG. 11 explanatorily shows a peripheral fluid flow path part of another example.
Figure 12:
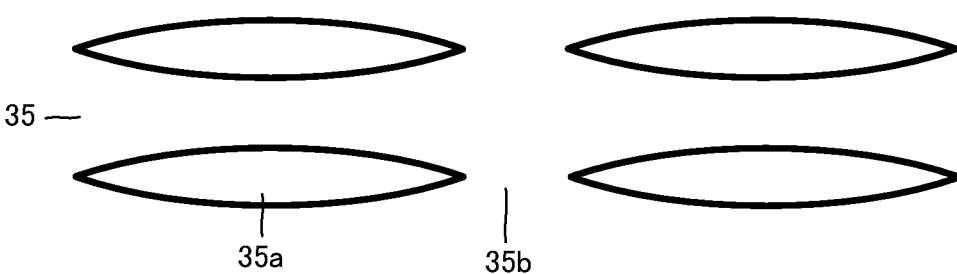
FIG. 12 explanatorily shows a peripheral fluid flow path part of another example.

Other than the foregoing, for example, the forms shown in FIGS. 10 to 12 may be taken. FIGS. 10 to 12 each show one of the fluid flow path grooves 35, two of the protrusions 35a across this fluid flow path groove 35, and the respective ones of the communicating opening parts 35b which are disposed in the protrusions 35a, from the same viewpoint as FIG. 8. All these drawings show the protrusions 35a of different shapes from the example in FIG. 8 from this viewpoint (plan view).

That is, the ends of the protrusions 35a shown in FIG. 8, where the communicating opening parts 35b are formed, each have the constant width same as the other portions thereof. In contrast, the protrusions 35a having the shapes shown in FIGS. 10 to 12 are formed so that the ends thereof, where the communicating opening parts 35b are formed, each have a width narrower than the maximum width of the protrusions 35a. More specifically, FIG. 10 shows such an example that the corners at the ends are like circular arcs to form R at the corners, which makes the width at the ends narrower, FIG. 11 shows such an example that the ends are formed to be like semicircles, which makes the width at the ends narrower and FIG. 12 shows such an example that the ends taper so as to be pointed.

As shown in FIGS. 10 to 12, the ends of the protrusions 35a, where the communicating opening parts 35b are formed, are formed so as to each have a width narrower than the maximum width of the protrusions 35 make it easy for a working fluid to move through the communicating opening parts 35b, to make it easy for a working fluid to move from one to another condensate flow path adjacent to the one.

In the present embodiment, the guiding parts 37 are disposed on the peripheral fluid flow path part 34 as shown in FIG. 5. The guiding parts 37 are portions formed on the boundary surfaces with the vapor flow path grooves 42, and sticking out on the vapor flow path grooves 42 sides. In the present embodiment, the guiding parts 37 each include an apex 37a sticking out most at the center in the thickness direction (direction z), and guiding faces 37b from the apexes 37a towards the first face 30a and the second face 30b (direction z) in the form of concave circular arcs toward the peripheral fluid flow path part 34 in a cross-sectional view.

The form of the guiding parts 37 is not limited to the foregoing. The apexes 37a may be positioned anywhere in the direction z. The guiding faces 37b on the cross section may be straight lines, or may be curved but not arcuate lines. The apexes 37a on the cross section may be points, or may have a length.

Such guiding parts 37 having the foregoing shape make it easy for a condensate to collect on the guiding faces 37b, which makes it possible to smoothly move a working fluid between the condensate flow paths 3 and the vapor flow paths 4 via the guiding parts 37, to further improve a heat transport capability.

The peripheral fluid flow path part 34 having the foregoing structure may further have the following structure. Here, only the first face 30a side will be described because the drawings are referred to, but the second face 30b side (the fluid flow path grooves 36, the protrusions 36a and the communicating opening parts 36b) may be considered the same. This does not mean that the shape on the first face 30a side has to be the same as the shape on the second face 30b side. The shape on the first face 30a side and the shape on the second face 30b side may be the same, and may be different.

The peripheral fluid flow path part 34 has a width indicated by $W_2$ in FIGS. 3 to 5 and 7(a) (size in the aligning direction of the fluid flow path grooves 35 and 36) which may be suitably set according to the size of the whole of the vapor chamber etc. The width $W_2$ is preferably at most 3.0 mm, and may be at most 1.5 mm, and may be at most 1.0 mm. The width $W_2$ more than 3.0 mm may make it impossible to sufficiently secure a space for the inside fluid flow paths and vapor flow paths. The width $W_2$ is preferably at least 0.05 mm, and may be at least 0.1 mm, and may be at least 0.2 mm. The width $W_2$ less than 0.05 mm may make it impossible to obtain a sufficient amount of a fluid refluxing through the periphery. The range of the width $W_2$ may be defined by combination of any one of the foregoing plural candidate values for the upper limit and any one of the foregoing plural candidate values for the lower limit. The range of the width $W_2$ may be also defined by combination of any two of the plural candidate values for the upper limit or combination of any two of the plural candidate values for the lower limit.

Here, both the widths of the peripheral fluid flow path part 34 on the first face 30a side and the second face 30b side indicated by $W_2$. The width of the peripheral bonding face 33a does not have to be the same as, but may be different from the width of the peripheral bonding face 33b.

Figures 7A, 7B:
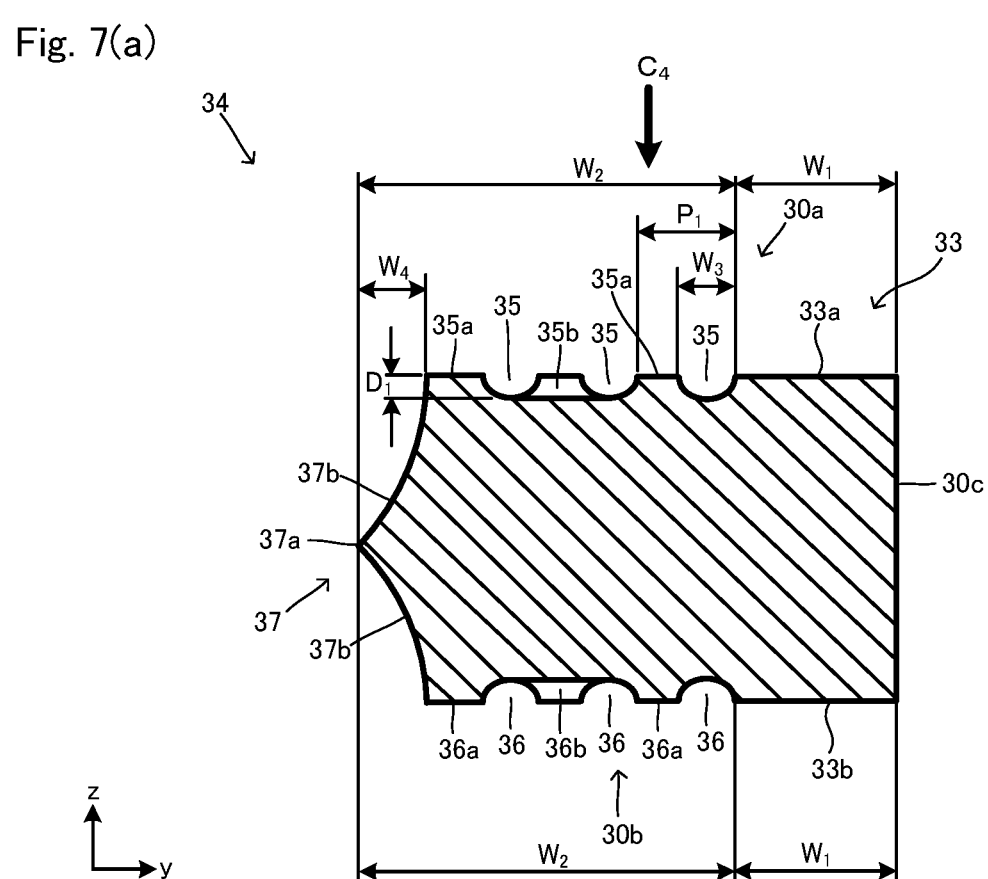
FIGS. 7(a) and 7(b) are cross-sectional views focusing on a peripheral fluid flow path part 34.
Figure 8:
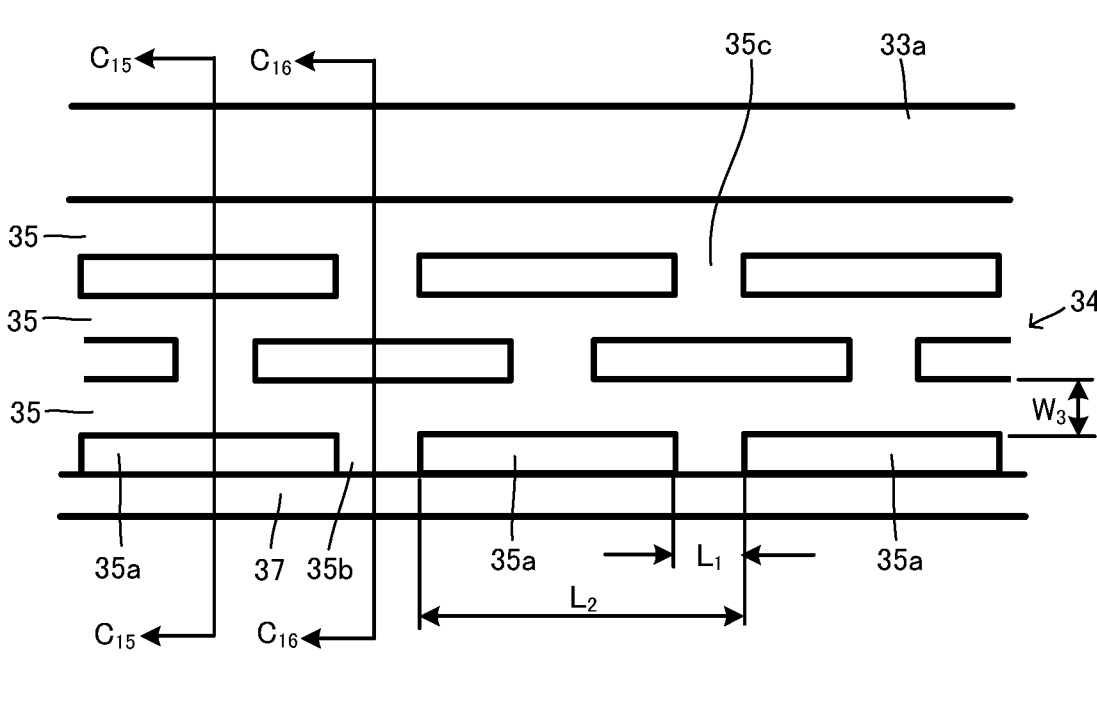
FIG. 8 is a partially enlarged view of the peripheral fluid flow path part 34 in the direction z.
Figure 8:
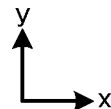
Figure 9:
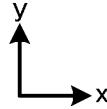
FIG. 9 is a partially enlarged view of a peripheral fluid flow path part of another example in the direction z.

The groove width of each of the fluid flow path grooves 35 indicated by $W_3$ in FIGS. 7(a) and 8 (size in the aligning direction of the fluid flow path grooves 35, width of an opening face of each groove) is preferably at most 1000 μm, and may be at most 500 μm, and may be at most 200 μm. The width $W_3$ is preferably at least 20 μm, and may be at least 45 μm, and may be at least 60 μm. The range of the width $W_3$ may be defined by combination of any one of the foregoing plural candidate values for the upper limit and any one of the foregoing plural candidate values for the lower limit. The range of the width $W_3$ may be also defined by combination of any two of the plural candidate values for the upper limit or combination of any two of the plural candidate values for the lower limit.

The depth of each of the grooves indicated by $D_1$ in FIG. 7(a) is preferably at most 200 μm, and may be at most 150 μm, and may be at most 100 μm. The depth $D_1$ is preferably at least 5 μm, and may be at least 10 μm, and may be at least 20 μm. The range of the depth $D_1$ may be defined by combination of any one of the foregoing plural candidate values for the upper limit and any one of the foregoing plural candidate values for the lower limit. The range of the depth $D_1$ may be also defined by combination of any two of the plural candidate values for the upper limit or combination of any two of the plural candidate values for the lower limit.

The structure as described above can bring about a greater capillary force of the condensate flow paths which is necessary for reflux.

In view of bringing about a greater capillary force of the condensate flow paths, the aspect ratio on a cross section of each flow path which is represented by a value obtained by dividing the groove width $W_3$ by the depth $D_1$ is preferably higher than 1.0. This ratio may be at least 1.5, and may be at least 2.0. Alternatively, the aspect ratio may be lower than 1.0. This ratio may be at most 0.75, and may be at most 0.5.

Among them, in view of production, $W_3$ is preferably more than $D_1$. In such a view, the aspect ratio is preferably higher than 1.3.

The pitch for any of adjacent fluid flow path grooves 35 in a plurality of the fluid flow path grooves 35, which is indicated by $P_1$ in FIG. 7($a$), is preferably at most 1100 μm, and may be at most 550 μm, and may be at most 220 μm. The pitch $P_1$ is preferably at least 30 μm, and may be at least 55 μm, and may be at least 70 μm. This range of the pitch $P_1$ may be defined by combination of any one of the foregoing plural candidate values for the upper limit and any one of the foregoing plural candidate values for the lower limit. The range of the pitch $P_1$ may be also defined by combination of any two of the plural candidate values for the upper limit or combination of any two of the plural candidate values for the lower limit.

This makes it possible to increase the density of the condensate flow paths, and at the same time to suppress the condensate flow paths deforming to crush in the bonding or assembling.

The size of the opening part in each of the communicating opening parts 35$b$ in the extending direction of the fluid flow path grooves 35, which is indicated by $L_1$ in FIG. 8, is preferably at most 1100 μm, and may be at most 550 μm, and may be at most 220 μm. The size $L_1$ is preferably at least 30 μm, and may be at least 55 μm, and may be at least 70 μm. The range of the size $L_1$ may be defined by combination of any one of the foregoing plural candidate values for the upper limit and any one of the foregoing plural candidate values for the lower limit. The range of the size $L_1$ may be also defined by combination of any two of the plural candidate values for the upper limit or combination of any two of the plural candidate values for the lower limit.

The pitch for any of adjacent communicating opening parts 35$b$ in the extending direction of the fluid flow path grooves 35, which is indicated by $L_2$ in FIG. 8, is preferably at most 2700 μm, and may be at most 1800 μm, and may be at most 900 μm. This pitch $L_2$ is preferably at least 60 μm, and may be at least 110 μm, and may be at least 140 μm. This range of the pitch $L_2$ may be defined by combination of any one of the foregoing plural candidate values for the upper limit and any one of the foregoing plural candidate values for the lower limit. The range of the pitch $L_2$ may be also defined by combination of any two of the plural candidate values for the upper limit or combination of any two of the plural candidate values for the lower limit.

The projecting amount of each of the guiding parts 37 (distance from the end of the protrusion 35$a$ to the apex 37$a$) indicated by $W_4$ in FIG. 7($a$) is preferably at most 1000 μm, and may be at most 500 μm, and may be at most 300 μm. The projecting amount $W_4$ is preferably at least 20 μm, and may be at least 45 μm, and may be at least 60 μm. The range of the projecting amount $W_4$ may be defined by combination of any one of the foregoing plural candidate values for the upper limit and any one of the foregoing plural candidate values for the lower limit. The range of the projecting amount $W_4$ may be also defined by combination of any two of the plural candidate values for the upper limit or combination of any two of the plural candidate values for the lower limit.

<<Inner Side Fluid Flow Path Part>>

Returning to FIGS. 1 to 5, the inner side fluid flow path parts 38 will be described. The inner side fluid flow path parts 38 are also portions functioning as fluid flow path parts, and forming a part of the condensate flow paths 3, which are the second flow paths where a working fluid condensing to liquefy passes, and guiding parts 41. FIGS. 13($a$) and 13($b$) each show an enlarged portion indicated by the arrow $C_5$ in FIG. 5. FIGS. 13($a$) and 13($b$) also show cross-sectional shapes of any of the inner side fluid flow path parts 38. FIG. 14 shows an enlarged plan view of one of the inner side fluid flow path parts 38 viewed in the direction indicated by the arrow $C_6$ in FIG. 13.

Here, FIG. 13($a$) is a cross-sectional view taken along the arrows $C_{17}$-$C_{17}$ in FIG. 14, and FIG. 13($b$) is a cross-sectional view taken along the arrows $C_{18}$-$C_{18}$ in FIG. 14. FIG. 13($a$) shows a cross section where protrusions 39$a$ are arranged on guiding parts 41 sides. FIG. 13($b$) is a cross section where communicating opening parts 39$b$ are arranged on the guiding parts 41 sides.

As can be seen from these drawings, the inner side fluid flow path parts 38 are portions formed inside the annular ring of the peripheral fluid flow path part 34 in the main body 31. In a plan view (when viewed in the direction z), the inner side fluid flow path parts 38 according to the present embodiment extend in a direction parallel to a long side of the rectangle of the main body 31 (direction x), and a plurality (three in the present embodiment) of the inner side fluid flow path parts 38 are aligned at given intervals in a direction parallel to a short side thereof (direction y).

The fluid flow path grooves 39 (on the first face 30$a$ side) and the fluid flow path grooves 40 (on the second face 30$b$ side) which are a plurality of grooves extending in the extending direction of the inner side fluid flow path parts 38 are formed on the first face 30$a$ and the second face 30$b$ of the inner side fluid flow path parts 38, respectively. A plurality of the fluid flow path grooves 39 and 40 are arranged at given intervals in a direction different from the extending direction thereof.

Thus, as can be seen from FIG. 13 etc., on the cross section of the inner side fluid flow path parts 38, the fluid flow path grooves 39, which are recesses on the first face 30$a$ side, and the protrusions 39$a$ between the fluid flow path grooves 39 are formed as recesses and protrusions are repeated. Further, the fluid flow path grooves 40, which are recesses on the second face 30$b$ side, and protrusions 40$a$ between the fluid flow path grooves 40 are formed as recesses and protrusions are repeated. That is, in the present embodiment, the fluid flow path grooves to be the condensate flow paths 3 are disposed on one and the other sides (front and back faces) in the thickness direction (direction z).

As described above, a plurality of the fluid flow path grooves 39 and 40 provided with the first face 30$a$ and the second face 30$b$, respectively, make it possible to secure a suitable magnitude of the cross-sectional area of a flow path as a whole of the condensate flow paths 3 in total to allow a condensate of a necessary flow rate to flow, and also make it possible for the fluid flow path grooves 39 and 40 each having a shallow depth and a narrow width to make the cross-sectional area of the flow paths of the condensate flow paths 3, which are the second flow paths (see FIG. 18 etc.), small to use a great capillary force.

Here, since being grooves, the fluid flow path grooves 39 and 40 each have a bottom portion, and each open on the opposite side facing this bottom portion, in a cross-sectional shape thereof. As described later, these openings form the condensate flow paths 3 when the first sheet 10 and the second sheet 20 are superposed on the third sheet 30 to close the openings.

In the present embodiment, the fluid flow path grooves 39 and 40 each have a semi-elliptical cross-sectional shape. This cross-sectional shape is not limited to a semi-elliptical shape, and may be a circle, a quadrangle such as a rectangle, a square and a trapezoid, any other polygon, or a shape of combination of any of them.

Further, in the present embodiment, as can be seen from FIG. 14, in the inner side fluid flow path parts 38, adjacent fluid flow path grooves 39 communicate with each other at given intervals via the communicating opening parts 39*b*. This promotes equalization of the amount of a condensate between a plurality of the fluid flow path grooves 39, to allow the condensate to efficiently flow, and to make it possible to smoothly reflux the working fluid. FIG. 14 illustrates the fluid flow path grooves 39, the protrusions 39*a* and the communicating opening parts 39*b* because showing the first face 30*a* side. However, the fluid flow path grooves 40 and the protrusions 40*a* disposed on the second face 30*b* side provided with communicating opening parts 40*b* not shown may be considered the same as the fluid flow path grooves 39, the protrusions 39*a* and the communicating opening parts 39*b*.

According to the example shown in FIG. 9, these communicating opening parts 39*b* may be arranged at the same position in a direction orthogonal to the extending direction of the fluid flow path grooves 39 and 40, as well as the communicating opening parts 35*b*. The communicating opening parts 39*b* and the protrusions 39*a* may have shapes according to any of the examples in FIGS. 10 to 12.

In the present embodiment, the guiding parts 41 are disposed on the inner side fluid flow path parts 38. The guiding parts 41 are portions formed on the boundary surfaces with the vapor flow path grooves 42, and sticking out on the vapor flow path grooves 42 sides. In the present embodiment, the guiding parts 37 each include an apex 41*a* sticking out most at the center in the thickness direction (direction z), and guiding faces 41*b* from the apex 41*a* toward the first face 30*a* and the second face 30*b* (direction z) in the form of concave circular arcs toward the inner side fluid flow path parts 38 in a cross-sectional view.

The form of the guiding parts 41 is not limited to the foregoing. The apexes 41*a* may be positioned anywhere in the direction z. The guiding faces 41*b* on the cross section may be straight lines, or may be curved but not arcuate lines. The apexes 41*a* on the cross section may be points, or may have a length, Such guiding parts 41 having the foregoing shape make it easy for a condensate to collect on the guiding faces 41*b*, which makes it possible to smoothly move a working fluid between the condensate flow paths 3 and the vapor flow paths 4 via the guiding parts 41, to further improve a heat transport capability.

Preferably, the inner side fluid flow path parts 38 having the foregoing structure further have the following structure.

The width of each of the inner side fluid flow path parts 38 indicated by $W_5$ in FIGS. 3, 4, 5 and 13(*a*) (largest value in the size thereof in the aligning direction of the inner side fluid flow path parts 38 and the vapor flow path grooves 42)

is preferably at most 3000 μm, and may be at most 2000 μm, and may be at most 1500 μm. This width $W_5$ is preferably at least 100 μm, and may be at least 200 μm, and may be at least 400 μm. This range of the width $W_5$ may be defined by combination of any one of the foregoing plural candidate values for the upper limit and any one of the foregoing plural candidate values for the lower limit. The range of the width $W_5$ may be also defined by combination of any two of the plural candidate values for the upper limit or combination of any two of the plural candidate values for the lower limit.

The pitch for a plurality of the inner side fluid flow path parts 38, which is indicated by $P_2$ in FIGS. 3 and 5, is preferably at most 5000 μm, and may be at most 3500 μm, and may be at most 3000 μm. This pitch $P_2$ is preferably at least 200 μm, and may be at least 400 m, and may be at least 800 μm. This range of the pitch $P_2$ may be defined by combination of any one of the foregoing plural candidate values for the upper limit and any one of the foregoing plural candidate values for the lower limit. The range of the pitch $P_2$ may be also defined by combination of any two of the plural candidate values for the upper limit or combination of any two of the plural candidate values for the lower limit.

This lowers the resistance in the vapor flow paths, which makes it possible to move a vapor and to reflux a condensate in a well-balanced manner.

The inner side fluid flow path parts 38 having the foregoing structure may further have the following structure. Here, only the first face 30*a* side will be described because the drawings are referred to, but the second face 30*b* side (the fluid flow path grooves 40, the protrusions 40*a* and the communicating opening parts 40*b*) may be considered the same. This does not mean that the shape on the first face 30*a* side has to be the same as the shape on the second face 30*b* side. The shapes on the first face 30*a* side and the shape on the second face 30*b* side may be the same, and may be different.

The groove width of each of the fluid flow path grooves 39 indicated by $W_6$ in FIGS. 13(*a*) and 14 (size in the aligning direction of the fluid flow path grooves 39, width of an opening face of each groove) is preferably at most 1000 μm, and may be at most 500 μm, and may be at most 200 μm. This width $W_6$ is preferably at least 20 μm, and may be at least 45 μm, and may be at least 60 μm. This range of the width $W_6$ may be defined by combination of any one of the foregoing plural candidate values for the upper limit and any one of the foregoing plural candidate values for the lower limit. The range of the width $W_6$ may be also defined by combination of any two of the plural candidate values for the upper limit or combination of any two of the plural candidate values for the lower limit.

The depth of each of the fluid flow path grooves 39, which is indicated by $D_2$ in FIG. 13(*a*), is preferably at most 200 μm, and may be at most 150 μm, and may be at most 100 μm. This depth $D_2$ is preferably at least 5 μm, and may be at least 10 μm, and may be at least 20 μm. This range of the depth $D_2$ may be defined by combination of any one of the foregoing plural candidate values for the upper limit and any one of the foregoing plural candidate values for the lower limit. The range of the depth $D_2$ may be also defined by combination of any two of the plural candidate values for the upper limit or combination of any two of the plural candidate values for the lower limit.

This can bring about a greater capillary force of the condensate flow paths which is necessary for reflux.

In view of bringing about a greater capillary force of the flow paths, the aspect ratio on a cross section of each flow path which is represented by a value obtained by dividing the groove width $W_6$ by the depth $D_2$ is preferably higher than 1.0. The aspect ratio is represented by a value obtained by dividing the groove width $W_6$ by the depth $D_2$. This ratio may be at least 1.5, and may be at least 2.0. Alternatively, the aspect ratio may be lower than 1.0, may be at most 0.75, and may be at most 0.5.

Among them, in view of production, the groove width $W_6$ is preferably more than the depth $D_2$. In such a view, the aspect ratio is preferably higher than 1.3.

Figure 13A:
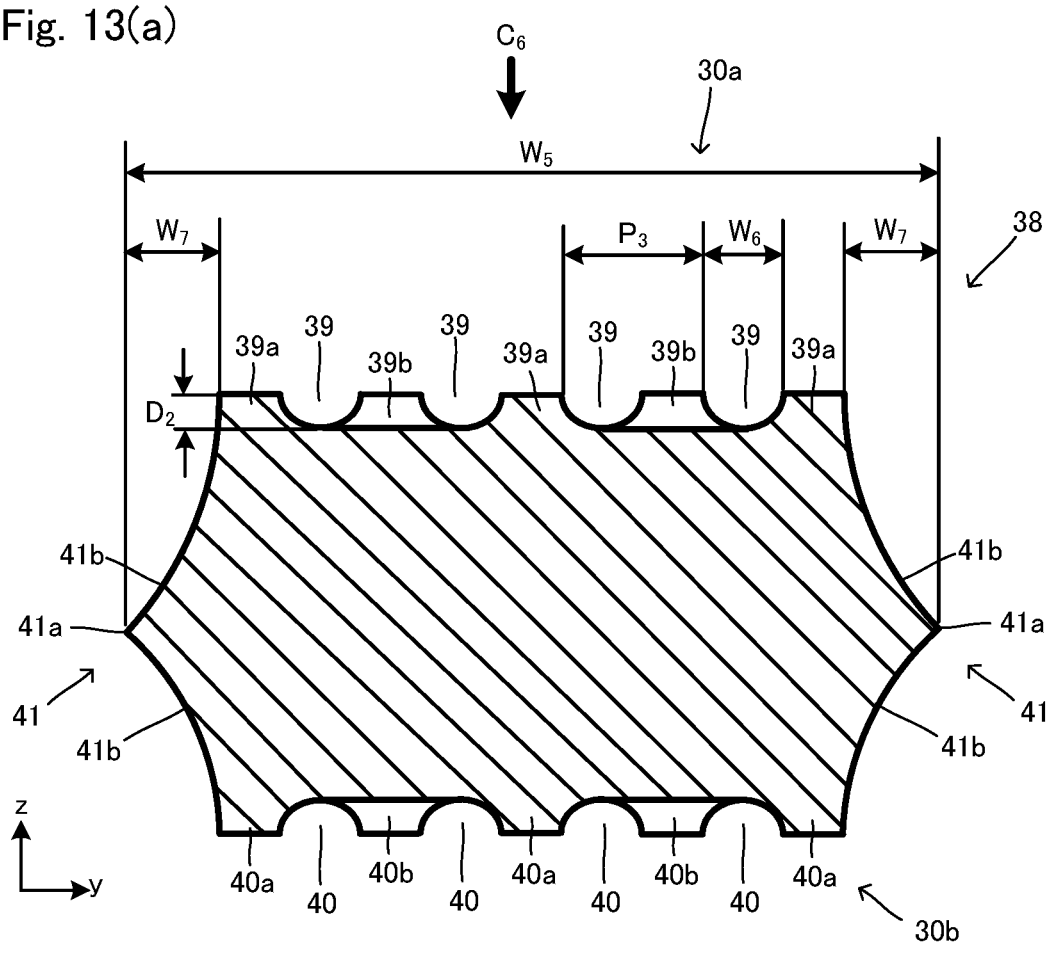
FIGS. 13(a) and 13(b) are cross-sectional views focusing on an inner side fluid flow path part 38.
Figure 14:
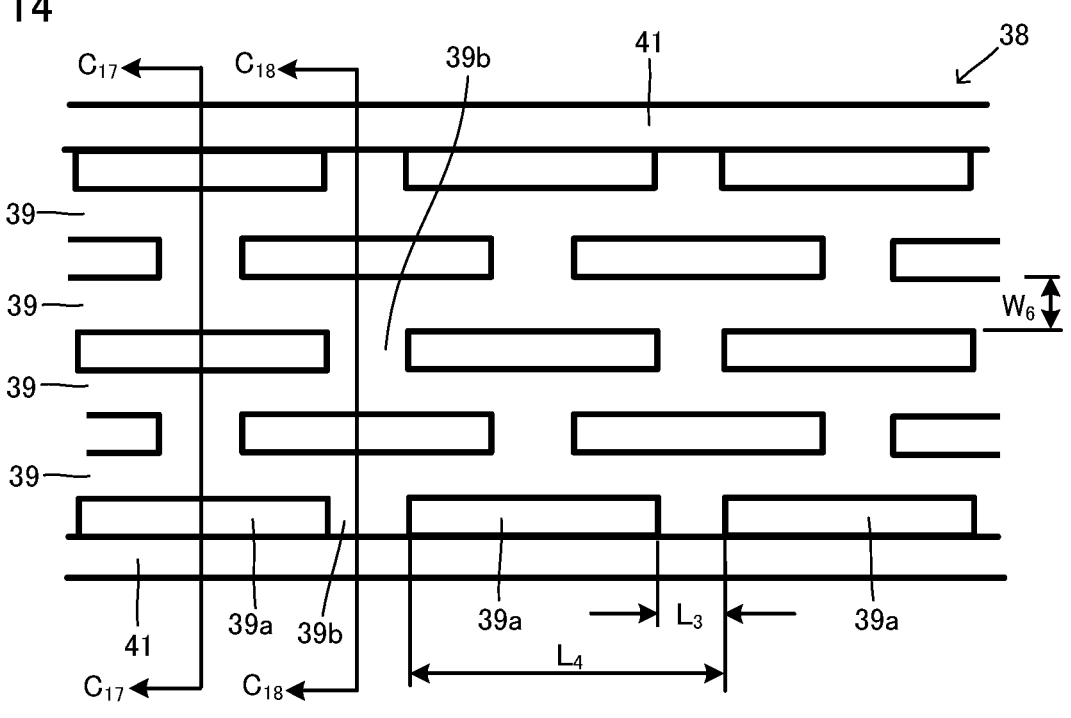
FIG. 14 is a partially enlarged view of the inner side fluid flow path part 38 in the direction z.
Figure 14:
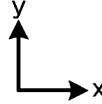

The pitch for any of adjacent fluid flow path grooves 39 in a plurality of the fluid flow path grooves 39, which is indicated by $P_3$ in FIG. 13(a), is preferably at most 1100 μm, and may be at most 550 μm, and may be at most 220 μm. This pitch $P_3$ is preferably at least 30 μm, and may be at least 55 μm, and may be at least 70 μm. This range of the pitch $P_3$ may be defined by combination of any one of the foregoing plural candidate values for the upper limit and any one of the foregoing plural candidate values for the lower limit. The range of the pitch $P_3$ may be also defined by combination of any two of the plural candidate values for the upper limit or combination of any two of the plural candidate values for the lower limit.

This makes it possible to increase the density of the condensate flow paths, and at the same time to suppress the flow paths deforming to crush in the bonding or assembling.

Further, the size of the opening part in each of the communicating opening parts 39b in the extending direction of the fluid flow path grooves 39, which is indicated by $L_3$ in FIG. 14, is preferably at most 1100 μm, and may be at most 550 μm, and may be at most 220 μm. This size $L_3$ is preferably at least 30 μm, and may be at least 55 μm, and may be at least 70 μm. This range of the size $L_3$ may be defined by combination of any one of the foregoing plural candidate values for the upper limit and any one of the foregoing plural candidate values for the lower limit. The range of the size $L_3$ may be also defined by combination of any two of the plural candidate values for the upper limit or combination of any two of the plural candidate values for the lower limit.

The pitch for any of adjacent communicating opening parts 39b in the extending direction of the fluid flow path grooves 39, which is indicated by $L_4$ in FIG. 14, is preferably at most 2700 μm, and may be at most 1800 μm, and may be at most 900 μm. This pitch $L_4$ is preferably at least 60 μm, and may be at least 110 μm, and may be at least 140 μm. This range of the pitch $L_4$ may be defined by combination of any one of the foregoing plural candidate values for the upper limit and any one of the foregoing plural candidate values for the lower limit. The range of the pitch $L_4$ may be also defined by combination of any two of the plural candidate values for the upper limit or combination of any two of the plural candidate values for the lower limit.

The fluid flow path grooves 35 and 36, and the fluid flow path grooves 39 and 40 according to the present embodiment are separated at regular intervals and arranged in parallel to each other, respectively. The present invention is not limited to this. As long as the capillary action can be brought about, the pitches for the grooves may be irregular, and the grooves do not have to be in parallel to each other.

The projecting amount of each of the guiding parts 41 (distance from the end of one of the protrusions 39a to the corresponding apex 41a) indicated by $W_7$ in FIG. 13(a) is preferably at most 1000 μm, and may be at most 500 μm, and may be at most 300 μm. The projecting amount $W_7$ is preferably at least 20 μm, and may be at least 45 μm, and may be at least 60 μm. The range of the projecting amount $W_7$ may be defined by combination of any one of the foregoing plural candidate values for the upper limit and any one of the foregoing plural candidate values for the lower limit. The range of the projecting amount $W_7$ may be also defined by combination of any two of the plural candidate values for the upper limit or combination of any two of the plural candidate values for the lower limit.

<<Vapor Flow Path Groove>>

Next, the vapor flow path grooves 42 will be described. The vapor flow path grooves 42 are portions where a vapor that is a working fluid evaporating to vaporize passes, and form a part of the vapor flow paths 4, which are the first flow paths (see FIG. 15 etc.). FIGS. 3 and 4 each show a shape of the vapor flow path grooves 42 in a plan view. FIG. 5 shows a cross-sectional shape of the vapor flow path grooves 42.

As can be seen from these drawings, in the present embodiment, the vapor flow path grooves 42 are each formed of a groove (slit) formed inside the annular ring of the peripheral fluid flow path part 34 of the main body 31. Specifically, the vapor flow path grooves 42 according to the present embodiment are formed between the adjacent inner side fluid flow path parts 38 and between the peripheral fluid flow path part 34 and the inner side fluid flow path parts 38, are grooves extending in a direction parallel to a long side of the rectangle of the main body 31 in a plan view (direction x), and a plurality (four in the present embodiment) of the vapor flow path grooves 42 are aligned in a direction parallel to a short side thereof (direction y). The vapor flow path grooves 42 according to the present embodiment are formed so as to allow the first face 30a of the third sheet 30 to communicate with the side of the second face 30b thereof, that is, are slitlike grooves. The vapor flow path grooves 42 penetrate through the third sheet 30 in the thickness direction, open on the first face 30a and second face 30b sides, and extend along a sheet plane of the third sheet 30 (the first face 30a and the second face 30b).

Thus, as can be seen from FIG. 5, the third sheet 30 has a shape of the peripheral fluid flow path part 34 and the inner side fluid flow path parts 38, and the vapor flow path grooves 42 alternately repeating in the direction y.

The vapor flow path grooves 42 having such a structure may further have the following structure.

The width of each of the vapor flow path grooves 42 indicated by $W_8$ in FIGS. 3, 4 and 5 (size in the aligning direction of the inner side fluid flow path parts 38 and the vapor flow path grooves 42, width of an opening face of each vapor flow path grooves) is formed wider than at least the width $W_3$ of each of the fluid flow path grooves 35 and 37, and the width $W_6$ of each of the fluid flow path grooves 39 and 40. The width $W_8$ is preferably at most 2500 μm, and may be at most 2000 μm, and may be at most 150 μm. This width $W_8$ is preferably at least 100 μm, and may be at least 200 μm, and may be at least 400 μm. This range of the width $W_8$ may be defined by combination of any one of the foregoing plural candidate values for the upper limit and any one of the foregoing plural candidate values for the lower limit. The range of the width $W_8$ may be also defined by combination of any two of the plural candidate values for the upper limit or combination of any two of the plural candidate values for the lower limit.

The pitch for the vapor flow path grooves 42 is usually fixed according to the pitch for the inner side fluid flow path parts 38.

The cross-sectional area of a flow path of each of the vapor flow path grooves larger than that of each of the fluid flow path grooves makes it possible to smoothly reflux a vapor having a larger volume than a condensate due to properties of a working fluid.

In the present embodiment, the vapor flow path grooves 42 each have a cross-sectional shape based on the guiding parts 37 and 41. If the guiding parts 41 are not disposed, this cross-sectional shape may be a quadrangle such as a rectangle, a square and a trapezoid, a triangle, or combination of any of them. Since less flow resistance of the vapor in the vapor flow paths makes it possible for a working fluid to smoothly reflux, the cross-sectional shape of each of the flow paths can be also determined in such a view.

In the present embodiment, the example such that each of the vapor flow path grooves 42 is formed between pairs of the adjacent inner side fluid flow path parts 38. The present invention is not limited to this. At least two vapor flow path grooves may be aligned between respective pairs of adjacent inner side fluid flow path parts.

<<Vapor Flow Path Communicating Groove>>

The vapor flow path communicating grooves 44 are grooves allowing a plurality of the vapor flow path grooves 42 to communicate. According to this, equalization of a vapor in a plurality of the vapor flow path grooves 42 is achieved, and a vapor is transported into a wider area, which makes it possible to efficiently use a lot of the condensate flow paths 3. Therefore, a working fluid can reflux more smoothly.

As can be seen from FIGS. 3, 4 and 6, the vapor flow path communicating grooves 44 according to the present embodiment are formed between the peripheral fluid flow path part 34 and either end in the extending direction of the inner side fluid flow path parts 38 and the vapor flow path grooves 42.

The vapor flow path communicating grooves 44 are formed so that the adjacent vapor flow path grooves 42 communicate with each other. In the present embodiment, the vapor flow path communicating grooves 44 each include, as can be seen from FIG. 6, a groove 44a on the first face 30a side, a groove 44b on the second face 30b side, and a linking part 44c between the grooves 44a and 44b. This linking part 44c links the inner side fluid flow path parts 38 and the peripheral fluid flow path part 34, and holds the inner side fluid flow path parts 38.

As shown in FIGS. 3 and 4, in the present embodiment, a hole 44d is disposed in the linking part 44c at a portion of the vapor flow path communicating grooves 44 where an end of the groove 32a, which is disposed on the inlet 32 of the third sheet 30, so that the groove 44a communicates with the groove 44b. This makes it possible to more smoothly pour a working fluid but not to prevent a working fluid from being poured via the groove 32a.

The shape of the vapor flow path communicating grooves 44 is not particularly limited as long as allowing a plurality of the vapor flow path grooves 42 to communicate with each other. For example, the vapor flow path communicating grooves 44 may have the following structure.

The width of each of the vapor flow path communicating grooves 44 indicated by $W_9$ in FIGS. 3, 4 and 6 (size in a direction orthogonal to the communicating direction, width on an opening face of each of the grooves) is preferably at most 2500 μm, and may be at most 2000 μm, and may be at most 1500 μm. This width $W_9$ is preferably at least 100 μm, and may be at least 200 μm, and may be at least 400 μm. This range of the width $W_9$ may be defined by combination of any one of the foregoing plural candidate values for the upper limit and any one of the foregoing plural candidate values for the lower limit. The range of the width $W_9$ may be also defined by combination of any two of the plural candidate values for the upper limit or combination of any two of the plural candidate values for the lower limit.

In the present embodiment, the cross-sectional shape of each of the grooves 44a and 44b of the vapor flow path communicating grooves 44 is a semi-ellipse. The present invention is not limited to this. This cross-sectional shape may be a quadrangle such as a rectangle, a square and a trapezoid, a triangle, a semicircle, a semicircle at the bottom, a semi-ellipse at the bottom, or combination of any of them. Since less flow resistance of a vapor in the vapor flow path communicating grooves makes it possible for a working fluid to smoothly reflux, the cross-sectional shape of each of the flow paths can be also determined in such a view.

<Structure of Vapor Chamber>

Next, the structure of the vapor chamber 1 constituted of the first sheet 10, the second sheet and the third sheet 30 in combination will be described. The shape of the vapor chamber 1, and the arrangement, size, shape, etc. of each component that the first sheet 10, the second sheet and the third sheet 30 should have are further understood by this description.

Figure 15:
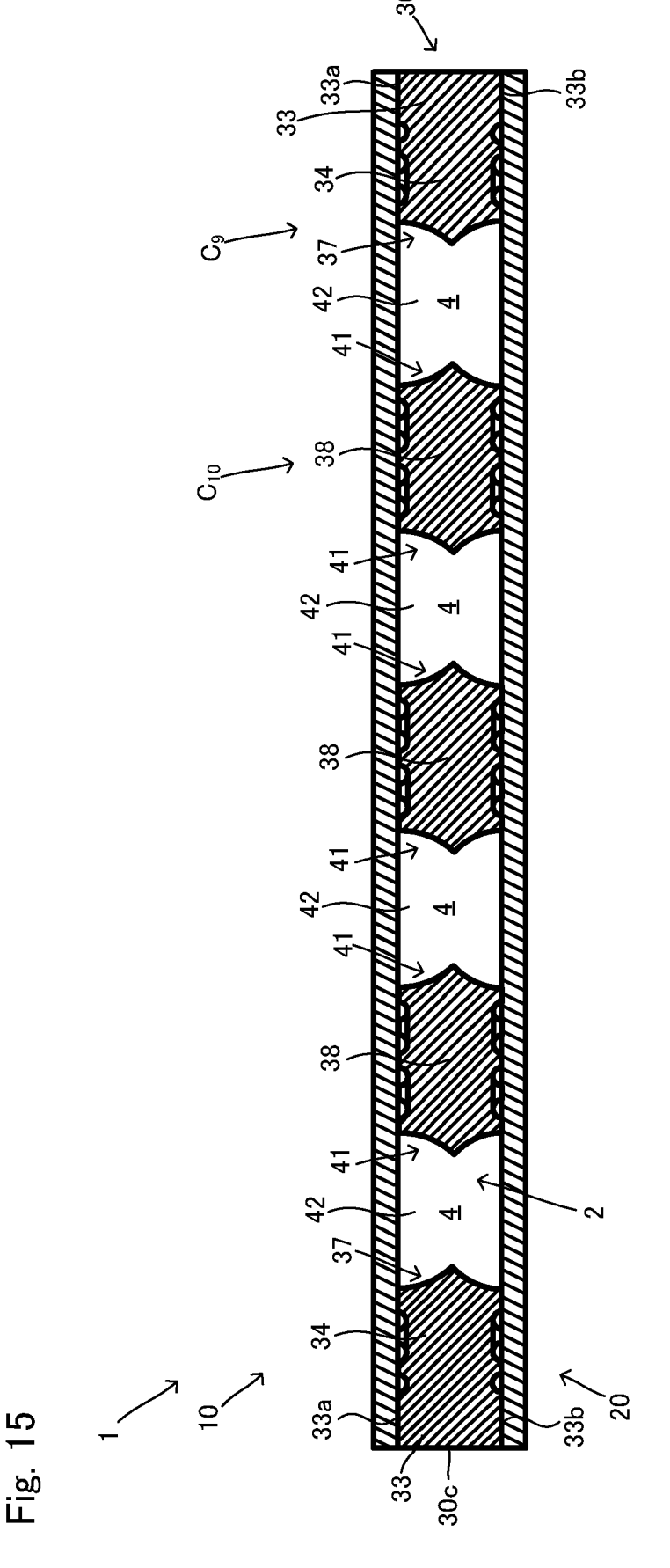
FIG. 15 is a cross-sectional view of the vapor chamber 1.
Figure 16:
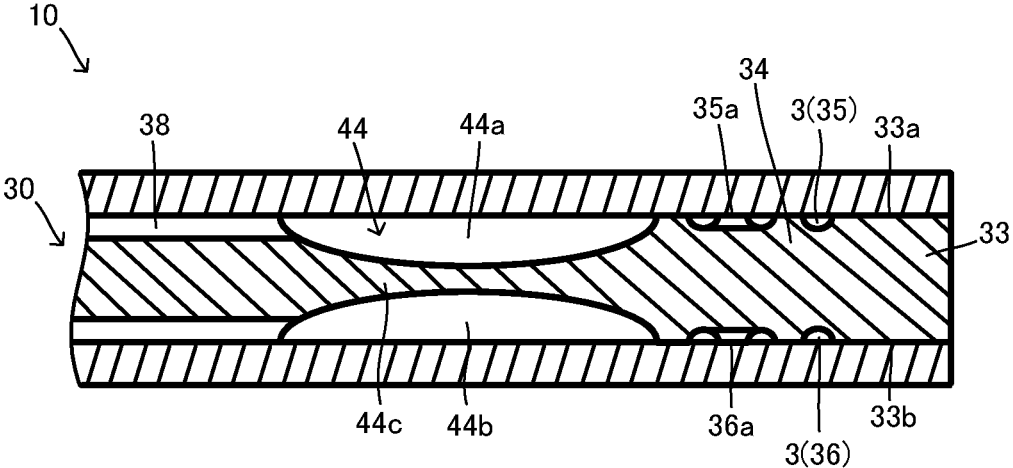
FIG. 16 is another cross-sectional view of the vapor chamber 1.
Figure 16:
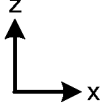

FIG. 15 shows a cross section of the vapor chamber 1 taken along the direction y indicated by $C_7$-$C_7$ in FIG. 1 in the thickness direction. FIG. 16 shows a cross section of the vapor chamber 1 taken along the direction x indicated by $C_8$-$C_8$ in FIG. 1 in the thickness direction.

Figure 17A:
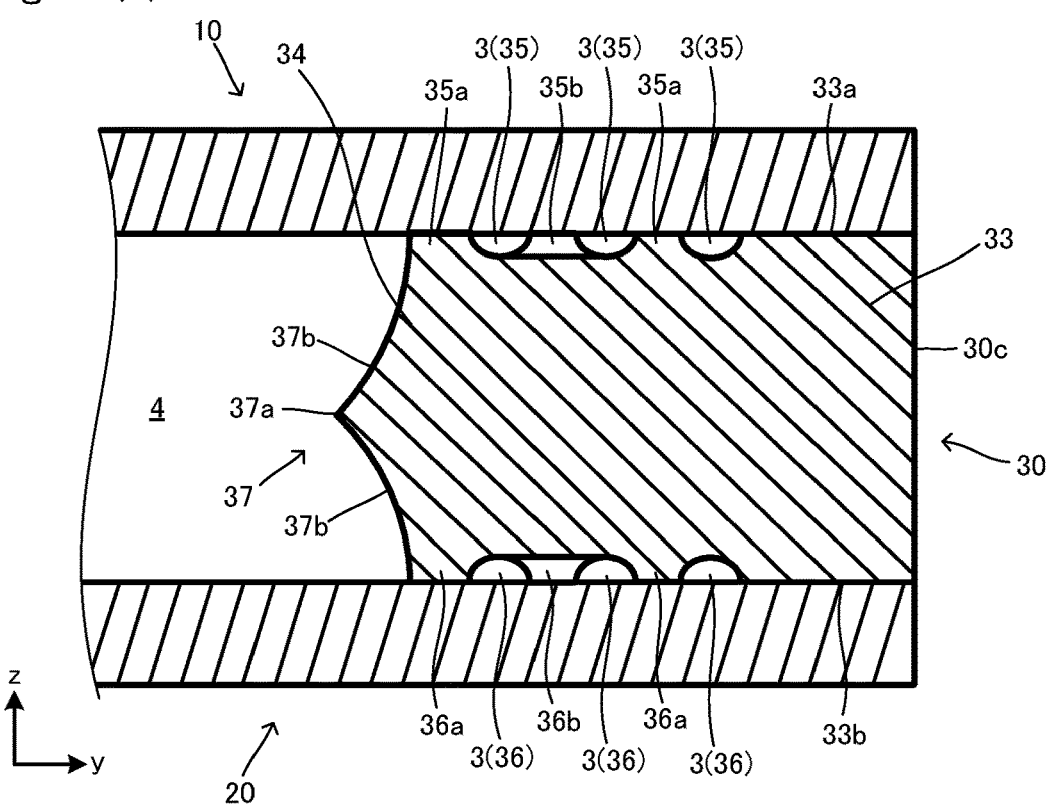
FIGS. 17(a) and 17(b) are partially enlarged cross-sectional views of FIG. 15.
Figure 17B:
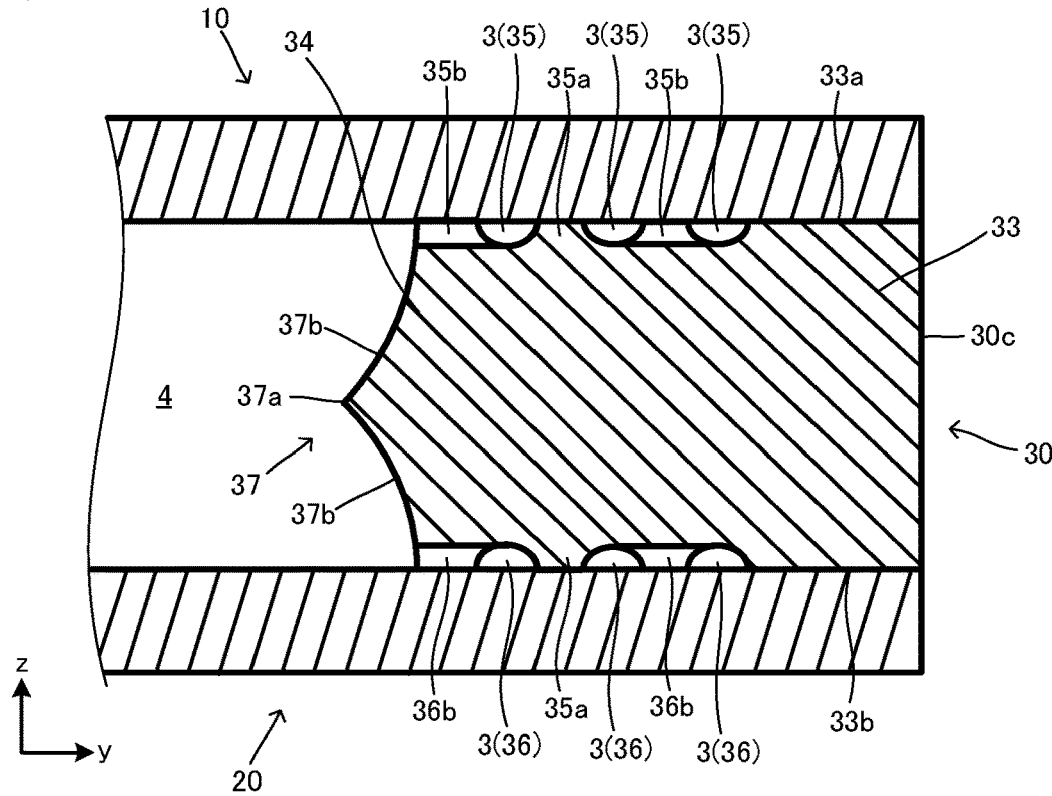
Figure 18A:
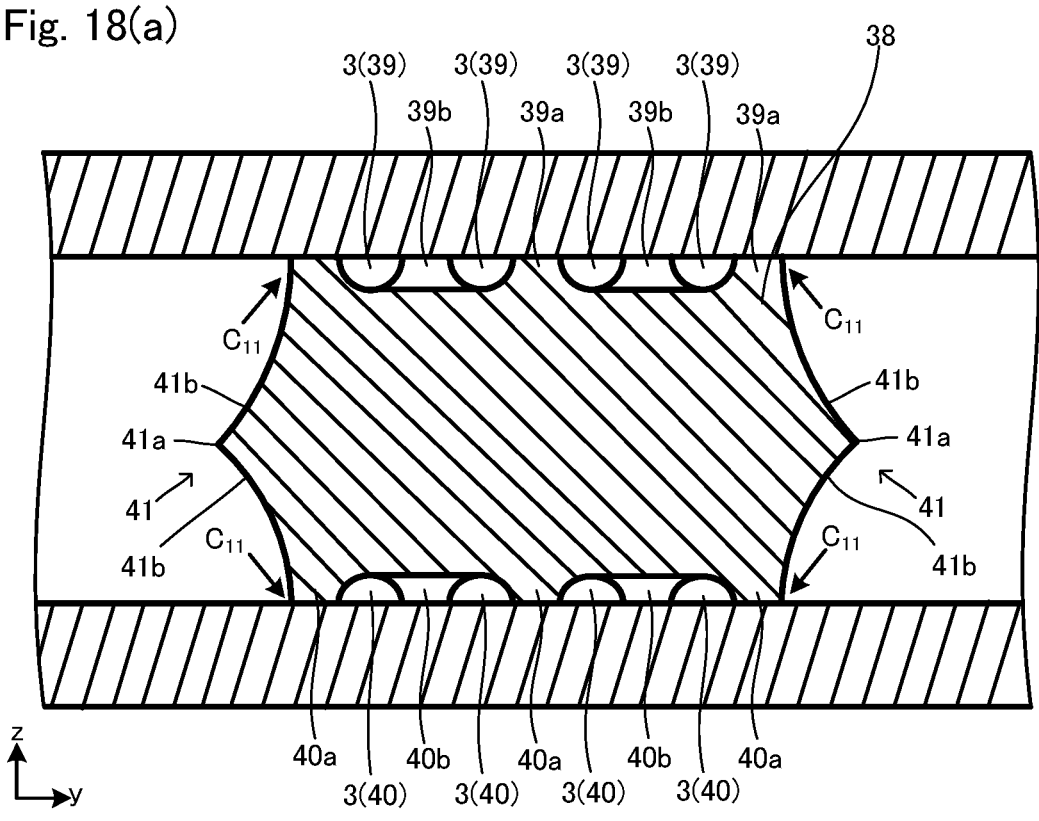
FIGS. 18(a) and 18(b) are partially enlarged cross-sectional views of FIG. 15.
Figure 18B:
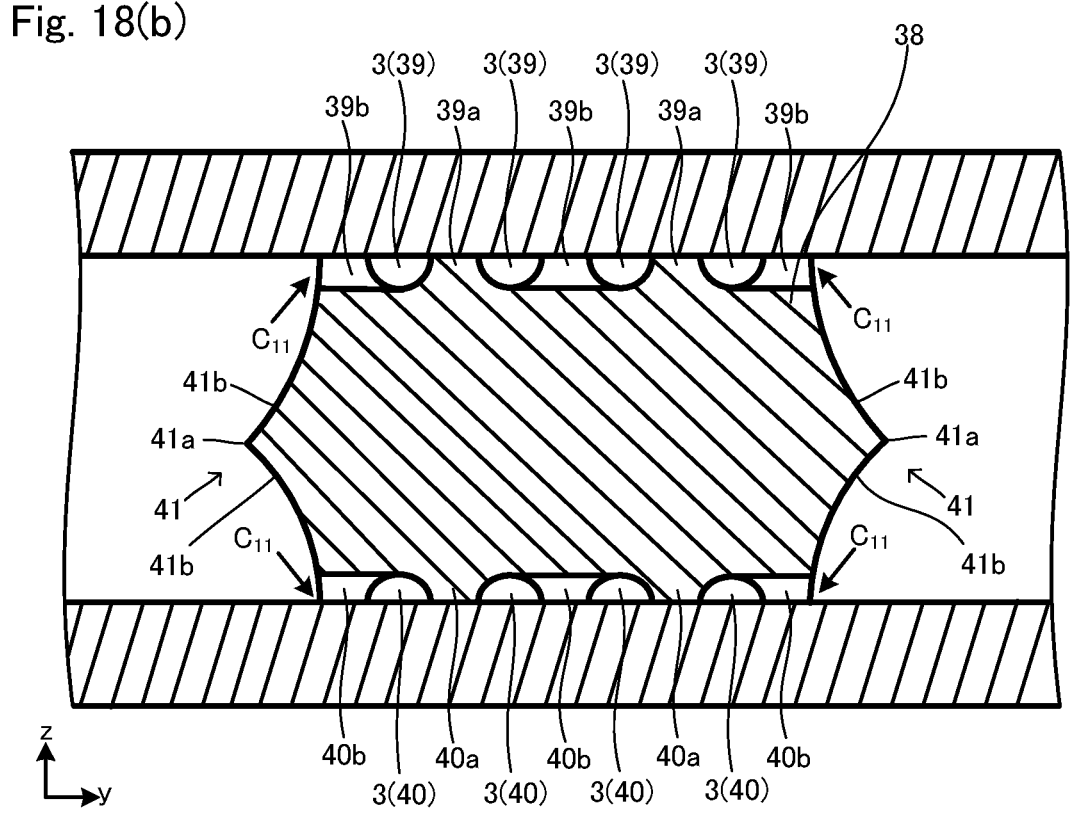

FIG. 17(a) shows a cross section corresponding to FIG. 7(a) and FIG. 17(b) shows a cross section corresponding to FIG. 7(b), in a portion indicated by $C_9$ in FIG. 15. FIG. 18(a) shows a cross section corresponding to FIG. 13(a) and FIG. 18(b) shows a cross section corresponding to FIG. 13(b), in a portion indicated by $C_{10}$ in FIG. 15.

The protrusions 35a or 39a separate the vapor flow paths 4 and the vapor flow paths 3 on the cross sections shown in FIGS. 15, 16, 17(a) and 18(a). As illustrated in FIGS. 8 and 14, the protrusions 35a and 39a each include the communicating opening parts 35b and 39b, respectively. Thus, the vapor flow paths 4 and the vapor flow paths 3 communicate with each other via the communicating opening parts 35b or 39b according to a cross section where the vapor flow paths 4 are in contact with the communicating opening parts 35b or 39b as shown in FIGS. 17(b) and 18(b).

As can be seen from FIGS. 1, 2 and 15 to 18, the first sheet 10, the second sheet 20 and the third sheet 30 are arranged so that the inner face 10a of the first sheet 10 is superposed on the third sheet 30 on the first face 30a side and the inner face 20a of the second sheet 20 is superposed on the third sheet 30 on the second face 30b side, to be bonded to constitute the vapor chamber 1. At this time, the main body 31 of the third sheet 30 is superposed on the main body 11 of the first sheet 10 and the main body 31 of the third sheet 30 is superposed on the main body 21 of the second sheet 20, and the inlet 32 of the third sheet 30 is superposed on the inlet 12 of the first sheet 10 and the inlet 32 of the third sheet 30 is superposed on the inlet 22 of the second sheet 20.

Such a laminate of the first sheet 10, the second sheet 20 and the third sheet 30 leads to the arrangement of each component included in the main bodies 11, 21 and 31 as shown in FIGS. 15 to 18(b). The arrangement is specifically as follows.

The peripheral bonding face 33a disposed on the third sheet 30 on the first face 30a side, and a face of the periphery of the inner face 10a of the first sheet 10 are arranged so as to be superposed; and the peripheral bonding face 33b disposed on the third sheet 30 on the second face 30b side, and a face of the periphery of the inner face 20a of the second sheet 20 are arranged so as to be superposed; to be bonded by diffusion bonding, brazing, or the like. This leads to formation of the hollow part based on the shape of the third sheet 30 between the first sheet 10 and the second sheet 20. This hollow part is the enclosure 2 when a working fluid is sealed therein.

The inner face 10*a* of the first sheet 10 is arranged on the peripheral fluid flow path part 34 of the third sheet 30 on the first face 30*a* side so as to be superposed. As a result of this, the openings of the fluid flow path grooves 35 are closed by the first sheet 10 to form part of the hollow part, and are the condensate flow paths 3, which are the second flow paths where a condensate that is a working fluid sealed in the hollow part condensing to liquefy flows.

Similarly, the inner face 20*a* of the second sheet 20 is arranged on the peripheral fluid flow path part 34 of the third sheet 30 on the second face 30*b* side so as to be superposed. As a result of this, the openings of the fluid flow path grooves 36 are closed by the second sheet 20 to form part of the hollow part, and are the condensate flow paths 3, which are the second flow paths where a condensate that is a working fluid sealed in the hollow part condensing to liquefy flows.

The inner face 10*a* of the first sheet 10 is arranged on the inner side fluid flow path parts 38 of the third sheet 30 on the first face 30*a* side so as to be superposed. As a result of this, the openings of the fluid flow path grooves 39 are closed by the first sheet 10 to form part of the hollow part, and are the condensate flow paths 3, which are the second flow paths where a condensate that is a working fluid sealed in the hollow part condensing to liquefy flows.

Similarly, the second face 20*a* of the second sheet 20 is arranged on the inner side fluid flow path parts 38 of the third sheet 30 on the second face 30*b* side so as to be superposed. As a result of this, the openings of the fluid flow path grooves 40 are closed by the second sheet 20 to form part of the hollow part, and are the condensate flow paths 3, which are the second flow paths where a condensate that is a working fluid sealed in the hollow part condensing to liquefy flows.

As described above, thin flow paths all surrounded by walls on the cross section are formed, which can lead to movement of a condensate by a greater capillary force to smoothly circulate the condensate. That is, when a flow path where a condensate is assumed to flow is considered, the condensate flow paths 3 can lead to obtention of a great capillary force compared with a flow path having one continuously opening face, a so-called groove.

In addition, the condensate flow paths 3 are formed separately from the vapor flow paths 4, which are the first flow paths, thereby can lead to smooth circulation of a working fluid.

Further, in the present embodiment, the condensate flow paths 3 by the fluid flow path grooves 35 and 39, and the condensate flow paths 3 by the fluid flow path grooves 36 and 40 are included, so that the condensate flow paths 3 are included in the vapor chamber 1 on each of one and the other sides in the thickness direction (direction z).

This makes it possible to secure a large cross-sectional area of the flow paths of the condensate flow paths 3 in total while the cross-sectional area of a flow path of each of the condensate flow paths 3 is small (while each of the condensate flow paths 3 is thin), which makes it possible to smooth the flow of a condensate as a great capillary force is maintained.

In addition, this can give a working fluid in the vapor chamber 1 an opportunity not only to move in in-plane directions (directions xy) but also to move in the thickness direction (direction z), which makes more uniform heat transfer and heat transport expectable.

The shape of the condensate flow paths 3 may be considered based on the shape and measures described above concerning the third sheet 30.

Other portions will be described. As can be seen from FIG. 15, the openings of the vapor flow path grooves 42 are closed by the first sheet 10 and the second sheet 20 to form part of the hollow part, and are flow paths for the working fluid, which is sealed in, to be the vapor flow paths 4, which are the first flow paths where a vapor flows.

Here, the faces of the first sheet 10 and the second sheet 20 on the vapor flow paths 4 sides, which constitute part of the vapor flow paths 4, are preferably flat. In the present embodiment, the surfaces of the first sheet 10 and the second sheet 20 are not processed but are flat tabular faces, which leads to smooth inner walls of the vapor flow paths 4 to make it possible to suppress the resistance when a vapor moves.

Here, the condensate flow paths 3, which are the second flow paths, are formed so as to have a cross-sectional area of the flow paths smaller than that of the vapor flow paths 4, which are the first flow paths. More specifically, when the average cross-sectional area of flow paths of pairs of the adjacent vapor flow paths 4 (in the present embodiment, respective vapor flow path grooves 42, respective flow paths surrounded by the first sheet 10 and the second sheet 20) is defined as $A_g$, and the average cross-sectional area of flow paths of a plurality of the condensate flow paths 3 which are arranged between the respective pairs of the adjacent vapor flow paths 4 (in the present embodiment, the respective inner side fluid flow path parts 38, a plurality of the respective condensate flow paths 3 surrounded by the first sheet 10 and the second sheet 20) is defined as $A_l$; the condensate flow paths 3 and the vapor flow paths 4 shall have such relationship that $A_l$ is at most 0.5 times, preferably at most 0.25 times, as much as $A_g$. This makes it easier for a working fluid to selectively pass through the first flow paths and the second flow paths according to its phase aspect (vapor phase, fluid phase).

This relationship may be satisfied in at least part of the entire vapor chamber. It is further preferable to satisfy this relationship in the entire vapor chamber.

The shape of the vapor flow paths 4 may be considered based on the shape and measures described above concerning the third sheet 30.

Since the guiding parts 37 and 41 are disposed in the present embodiment, each of the vapor flow paths 4 is formed so as to be in contact with two of the guiding parts.

As can be seen from FIG. 16, the openings of the grooves 44*a* of the vapor flow path communicating grooves 44 of the third sheet 30 are closed by the first sheet 10 and the openings of the grooves 44*b* thereof are closed by the second sheet 20, to form the hollow part where a plurality of the vapor flow paths 4 communicate. These become flow paths for a working fluid.

Concerning the inlets 12, 22 and 32 as well, as shown in FIGS. 1 and 2, the inlet 12 is superposed on the inlet 32 on the first face 30*a* side and the inlet 22 is superposed on the inlet 32 on the second face 30 side; and the opening of the inlet groove 32*a* of the third sheet 30 on the second face 30*b* side is closed by the inlet 22 of the second sheet 20 to form an inlet flow path 5 that allows the outside and the hollow part (the condensate flow paths 3 and the vapor flow paths 4) to communicate.

Since the inlet flow path 5 is closed to be the enclosure 2 after a working fluid is poured to the hollow part via the inlet flow path 5, the hollow part does not communicate with the outside in the vapor chamber 1 in the final form.

In the present embodiment, the example such that the inlets 12, 22 and 32 are disposed at one of a pair of the ends of the vapor chamber 1 in the longitudinal direction is shown. The present invention is not limited to this. The inlets 12, 22 and 32 may be arranged at any other end, or at plural ends. When arranged at plural ends, for example, the inlets 12, 22 and 32 may be arranged at each of a pair of the ends of the vapor chamber 1 in the longitudinal direction. Alternatively, the inlets 12, 22 and 32 may be arranged at one of the other pair of the ends.

A working fluid is sealed in the enclosure 2 of the vapor chamber 1. The working fluid is not particularly limited. Any working fluid used for usual vapor chambers, such as pure water, ethanol, methanol, acetone, and any mixtures thereof may be used.

[Production of Vapor Chamber]

For example, a vapor chamber as described above may be made as follows.

The fluid flow path grooves 35, 36, 39 and 40, the vapor flow path grooves 42 and the grooves 44*a* and 44*b* are formed on a sheet having an outer circumferential shape of the third sheet 30 by half etching. Half etching is to perform etching in the middle without penetration in the thickness direction.

It is noted that the vapor flow path grooves 42 are subjected to half etching from both of the first face 30*a* and second face 30*b* sides so as to penetrate in the thickness direction. Such etching can lead to formation of the shape of the guiding parts 37 and 41.

Next, the first sheet 10 is superposed on the third sheet 30 on the first face 30*a* side and the second sheet 20 is superposed on the third sheet 30 on the second face 30*b* side, to be tentatively fixed. The tentative fixation is performed by a particularly nonlimited way, and examples thereof include resistance welding, ultrasonic welding, and bonding with an adhesive.

After the tentative fixation, the first sheet 10, the second sheet 20 and the third sheet 30 are permanently bonded by diffusion bonding, to be a sheet for a vapor chamber.

Instead of diffusion bonding, brazing may be used for the bonding. "(Being) permanently bonded" here means being bonded to such an extent that the bonding can be maintained so that the airtightness of the enclosure 2 can be kept when the vapor chamber 1 operates, but is not restricted to a strict meaning thereof.

After the bonding, the hollow part is evacuated via the formed inlet flow path 5, and the pressure thereinside is reduced. Thereafter, a working fluid is poured to the hollow part, inside which the pressure is reduced, via the inlet flow path 5, and is put inside the hollow part. Then, the inlet flow path 5 is closed by welding using fusing or by caulking on the superposed inlets 12, and 22 and 32. This leads to secure retainment of the working fluid inside the enclosure 2.

In the vapor chamber according to the present embodiment, the inner side fluid flow path parts 38 function as pillars, which can suppress the enclosure collapsing during the bonding and reducing the pressure.

Production of the vapor chamber by etching has been described. The production method is not limited to this. The vapor chamber may be produced by pressing, cutting, laser processing, or processing by a 3D printer.

For example, when the vapor chamber is produced by a 3D printer, it is not necessary to make the vapor chamber by bonding a plurality of sheets, so that the vapor chamber without any bonding parts can be realized.

[Structure of Electronic Device and Operation of Vapor Chamber]

Figure 19:
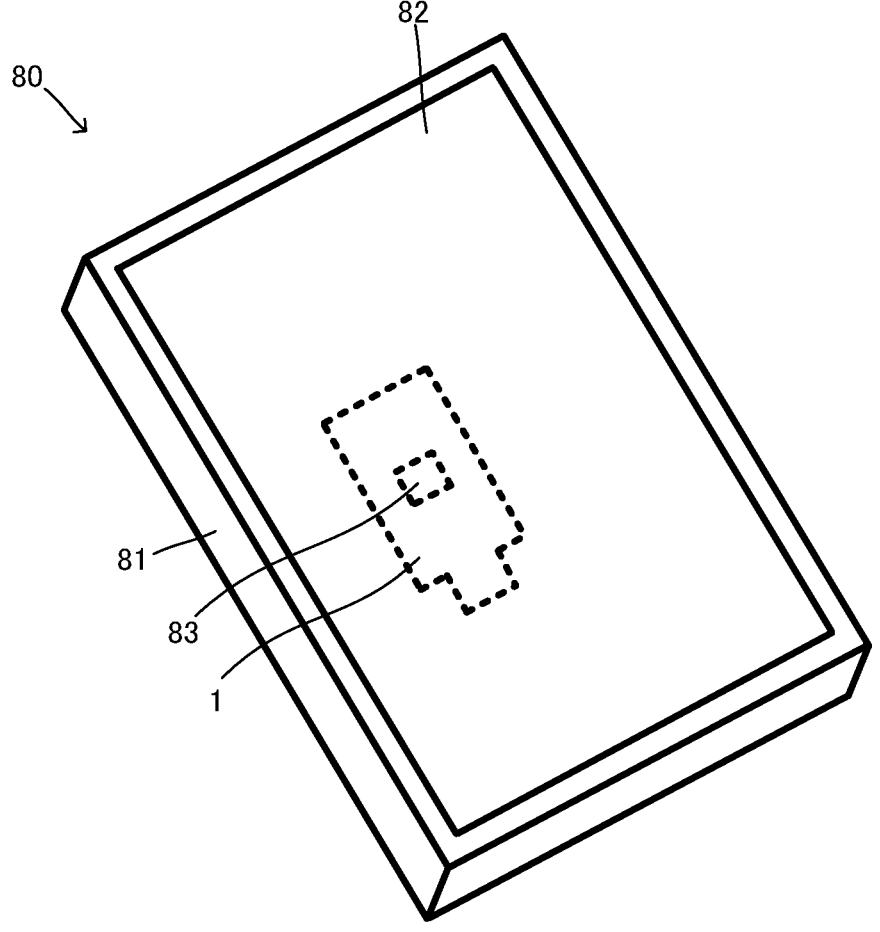
FIG. 19 explanatorily shows an electronic device 50.

Next, the operation of the vapor chamber 1 will be described. FIG. 19 schematically shows a portable terminal 80 that is one embodiment of an electronic device, in a state where the vapor chamber 1 is disposed thereinside. Here, the vapor chamber 1 is shown by the dotted lines because arranged inside a housing 81 of the portable terminal 80. Such a portable terminal 80 is constituted of the housing 81 that contains various electronic components, and a display unit 82 that is exposed so that an image can be seen from the outside through an opening of the housing 81. As one of these electronic components, an electronic component 83 to be cooled by the vapor chamber 1 is disposed inside the housing 81.

The vapor chamber 1 is disposed inside a housing of a portable terminal or the like, and is attached to the electronic component 83 such as CPU, which is to be cooled. The electronic component is attached to an outer face, or an outer face of the vapor chamber 1 directly or via a high thermal-conductive adhesive, sheet, tape, or the like. The electronic component 83 is attached to any position not particularly limited in the vapor chamber. This position is suitably set in relation to the arrangement of the other members in the portable terminal or the like. In the present embodiment, as shown by the dotted lines in FIG. 1, the electronic component 83 is arranged at the center of the main body 21 in the directions xy on a face of the second sheet 20 on the opposite side of the side where the third sheet 30 is disposed. Therefore, the electronic component 83 is invisible in a blind spot in FIG. 1, and thus is shown by the dotted lines.

Figure 20:
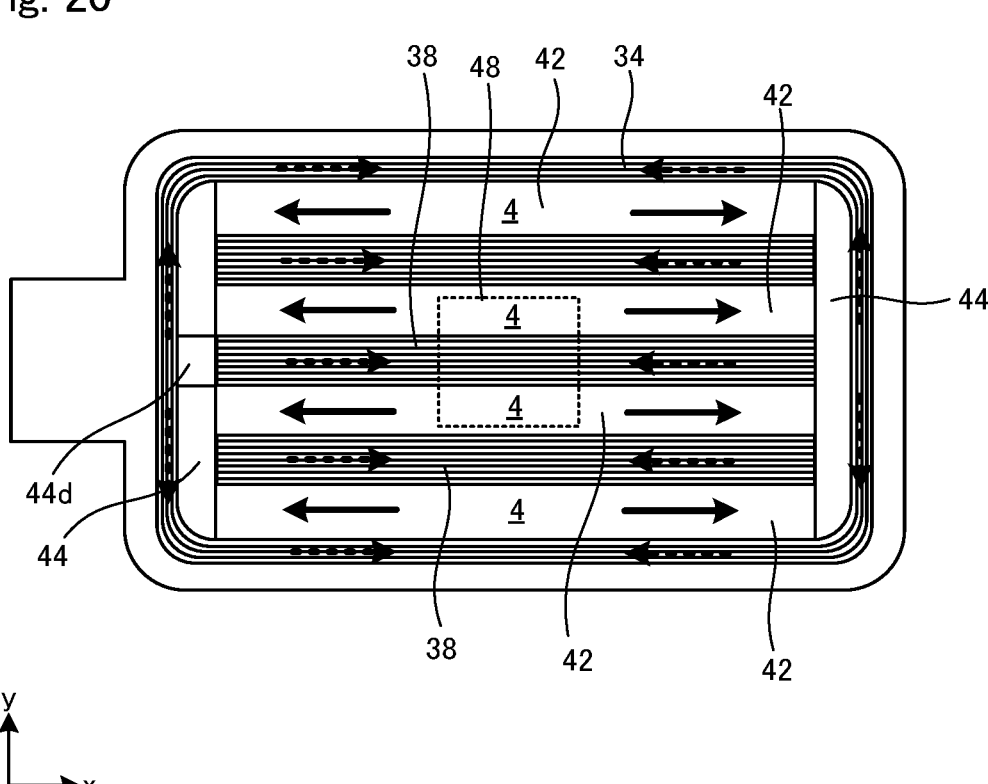
FIG. 20 explanatorily shows flows of a working fluid.

FIG. 20 explanatorily shows the flows of a working fluid. For easy description, in this drawing, the third sheet 30 on the inner face 30*a* side inside the vapor chamber 1 shows.

When the electronic component 83 generates heat, the heat is conducted inside the second sheet 20 by thermal conduction, and part of a condensate in the enclosure 2 which is present near the electronic component 83 receives the heat. The condensate receiving this heat absorbs heat, and evaporates to vaporize. This causes the electronic component 83 to be cooled.

A vapor that is the vaporized working fluid flows in the vapor flow paths 4 to move as shown by the solid straight arrows in FIG. 20. These flows are generated in separating directions from the electronic component 83, which allows the vapor to move in the separating directions from the electronic component 83.

The vapor inside the vapor flow paths 4 is separated from the electronic component 83, which is a heat source, to move to the outer circumferential part of the vapor chamber 1, which is at relatively low temperature, and is cooled as the heat thereof is taken by the first sheet 10, the second sheet 20 and the third sheet 30 in order when moving to the outer circumferential part. The first sheet 10, the second sheet 20 and the third sheet 30 taking the heat from the vapor conduct the heat to, for example, the housing 81 of the electronic device 80 in contact with the vapor chamber. Finally, the heat is released to the outside.

The working fluid from which the heat is taken as moving the vapor flow paths 4 condenses to liquefy. This condensate is adhered to wall faces of the vapor flow paths 4. Because the vapor continuously flows in the vapor flow paths 4, the condensate moves to the condensate flow paths 3 as if the condensate were pushed by the vapor as shown by the arrows $C_{11}$ in FIG. 18. Because the condensate flow paths 3 according to the present embodiment include the communicating opening parts 35*b*, 36*b*, 39*b* and 40*b* as shown in FIG. 14, the condensate passes through these communicating opening parts to be distributed into a plurality of the condensate flow paths 3.

In the present embodiment, the condensate flow paths 3 are included in the vapor chamber 1 on both sides in the thickness direction, which makes it possible to increase the opportunity to move from the vapor flow paths 4 to the condensate flow paths 3, which can lead to smoother movement of the condensate.

At this time, the form including the guiding parts 37 and 41 leads to formation of portions surrounded by the guiding faces 37b and 41b, the first sheet 10 and the second sheet 20. The condensate tends to collect in these portions by the effect of the capillary force. This leads to further smooth guiding of the condensate into the condensate flow paths 3.

The condensate entering the condensate flow paths 3 moves so as to approach the electronic component 83, which is a heat source, as shown by the dotted straight arrows in FIG. 20 by the capillary force by the condensate flow paths, and by pushing by the vapor.

The condensate then vaporizes again by the heat of the electronic component 83, which is a heat source, and the foregoing is repeated.

As described above, the vapor chamber 1 leads to good reflux of the condensate in the condensate flow paths by a great capillary force, which can increase the heat transport amount.

Further, in the present embodiment, the condensate flow paths 3 are included in the vapor chamber 1 on both of one and the other sides in the thickness direction (direction z).

This makes it possible to secure a large cross-sectional area of the flow paths of the condensate flow paths 3 in total while the cross-sectional area of a flow path of each of the condensate flow paths 3 is small (while each of the condensate flow paths 3 is thin), which makes it possible to smooth the flow of the condensate as a great capillary force is maintained.

In addition, this can give the working fluid in the vapor chamber 1 an opportunity not only to move in in-plane directions (directions xy) but also to move in the thickness direction (direction z), which makes more uniform heat transfer and heat transport expectable.

[Number of Sheets]

The vapor chamber 1 as described above is an example of the structure constituted of three sheets of the first sheet 10, the second sheet 20 and the third sheet 30. The structure constituted of three sheets as described above does not need complex superposition of the sheets, compared with a case where more sheets than this structure are used, which leads to easy production and makes bonding of each sheet more robust. Among them, as in the present embodiment, the first sheet 10 and the second sheet 20 in a flat form without any process on the surfaces thereof do not require care in positioning (alignment) for forming the condensate flow paths and the vapor flow paths when the sheets are superposed, which makes easier production possible.

Regardless of the number of the sheets, the condensate flow paths have only to be included in the vapor chamber on one and the other sides in the thickness direction. The number of the sheets may be 4, and can be 5.

As described above, a vapor chamber constituted of at least three sheets makes it easy to form the guiding faces 41b as shown in FIG. 18, and makes it easy for a working fluid to condense on the guiding faces 41b, which allows the working fluid to move more smoothly, compared with a case where the vapor chamber is constituted of two sheets.

Figure 21:
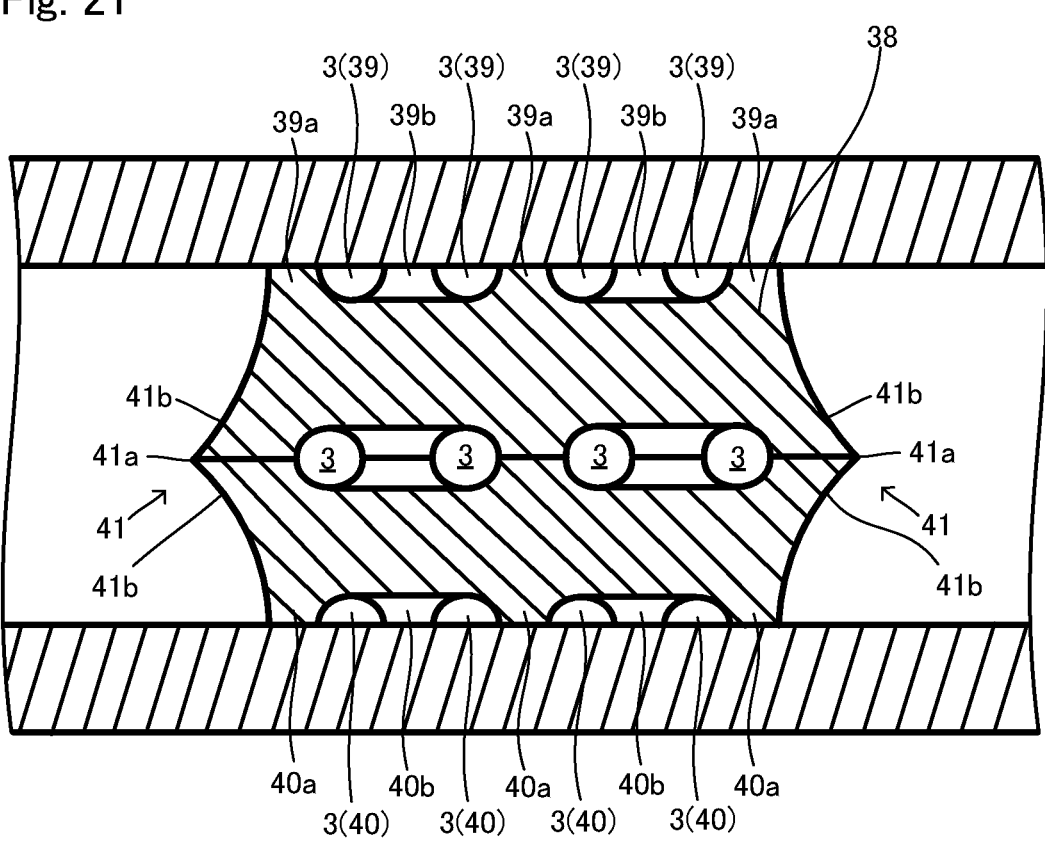
FIG. 21 explanatorily shows an example of four sheets.
Figure 21:

In addition, for example, as shown in FIG. 21, when the third sheet is divided in the thickness direction so that the vapor chamber is constituted of four sheets in total, grooves may be also formed at the center of the inner side fluid flow path parts 38 in the thickness direction, to dispose the condensate flow paths.

1.2. Embodiment 1b

FIGS. 22 to 25 explanatorily show a vapor chamber 51 according to Embodiment 1b.

Figure 22:
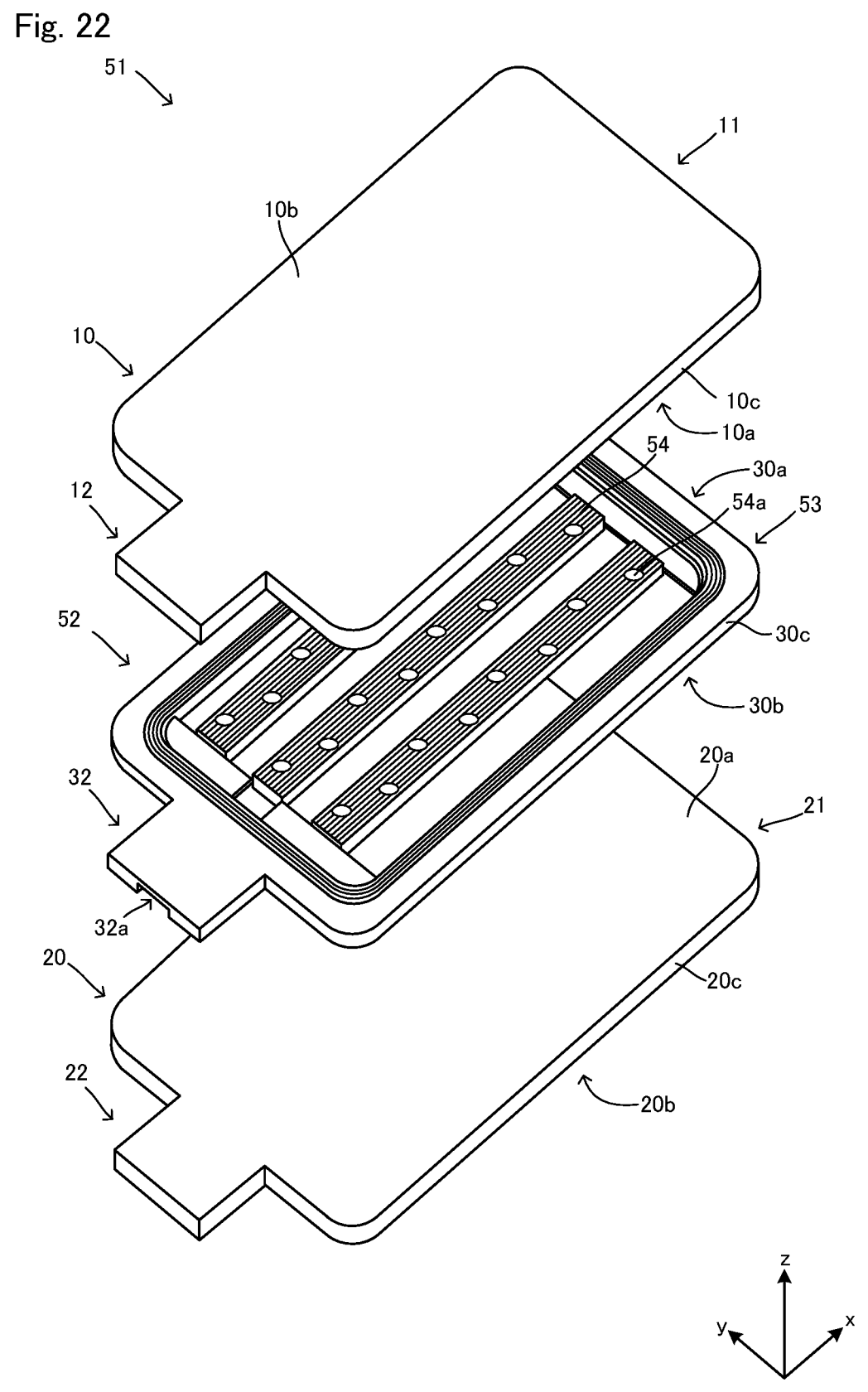
Figure 23:
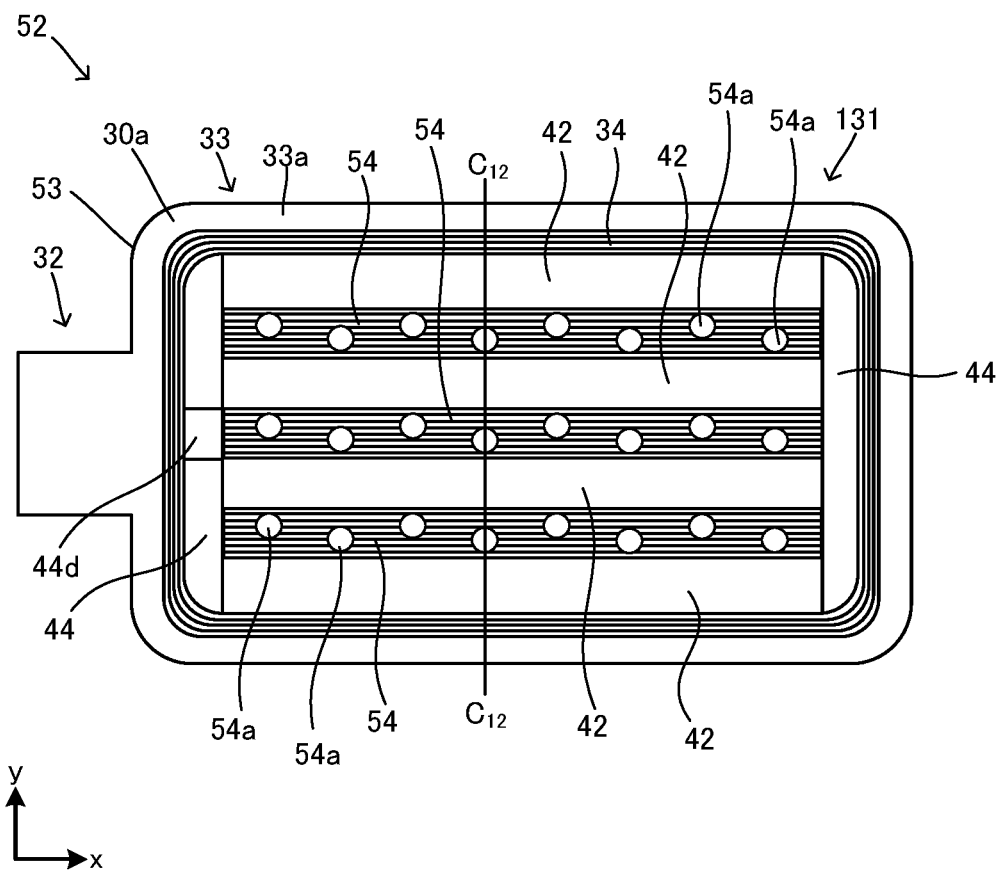
FIG. 23 explanatorily shows an enclosure of the vapor chamber 51.
Figure 24:
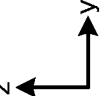
FIG. 24 is a cross-sectional view of the vapor chamber 51.
Figure 25:
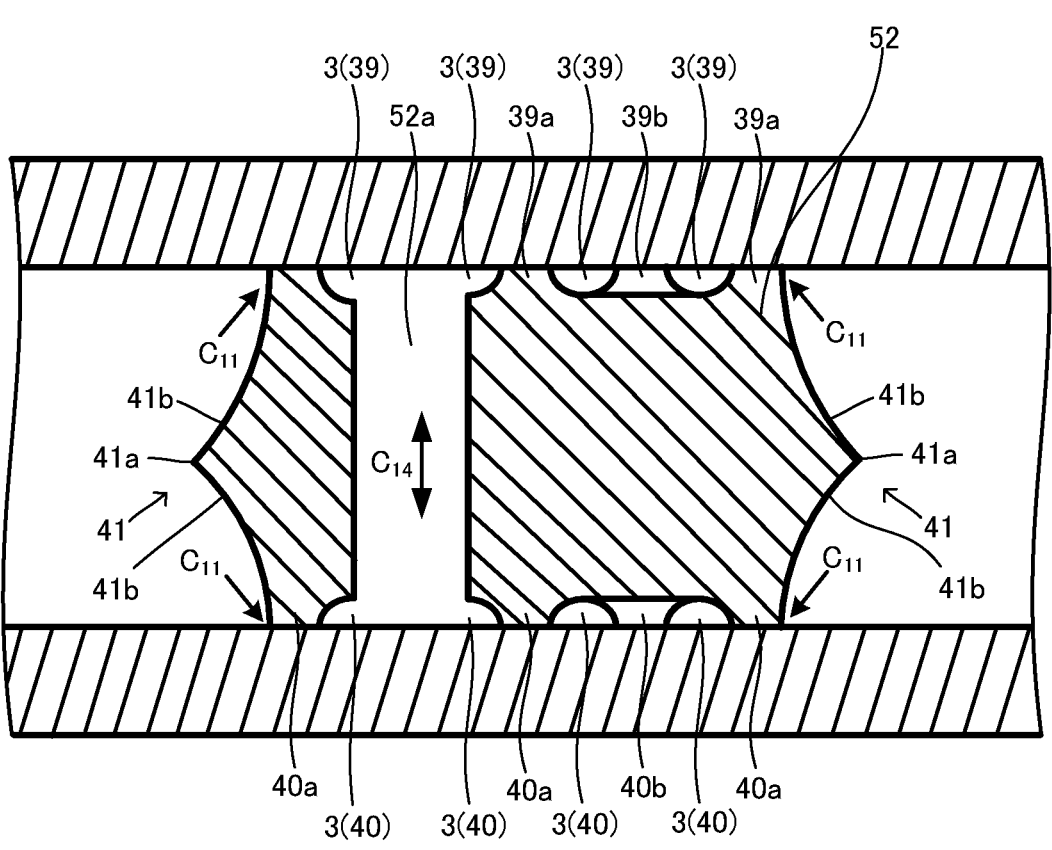
FIG. 25 is a partially enlarged view of FIG. 24.
Figure 25:

FIG. 22 is an exploded perspective view of the vapor chamber 51 and corresponds to FIG. 2. In FIG. 23, the enclosure 2 of the vapor chamber 51, and a third sheet 52 on the first face 30a side show. FIG. 24 is a cross-sectional view of the vapor chamber 51 cut at the position indicated by $C_{12}$-$C_{12}$. FIG. 25 is an enlarged view around the portion indicated by $C_{13}$ of FIG. 24 (inner side fluid flow path parts 54), and corresponds to FIG. 18.

The vapor chamber 51 is different from the vapor chamber 1 in that the third sheet 52 is applied instead of the third sheet 30 and the third sheet 52 is provided with thickness direction communicating holes 54a in inner side fluid flow path parts 54 of a main body 53 thereof. The description of the vapor chamber 1 is applicable to the other members and portions, and thus the same reference sings are added thereto in the drawings and the description thereof are omitted. Therefore, here, the thickness direction communicating holes 54a disposed in the inner side fluid flow path parts 54 are focused on and described.

The thickness direction communicating holes 54a are disposed in the inner side fluid flow path parts 54 of the third sheet 52, and are holes communicating with the first face 30a and the second face 30b. These thickness direction communicating holes 54a allow the fluid flow path grooves 39 and 40 to communicate with each other, to allow the condensate flow paths 3 on the first face 30a side and the condensate flow paths 3 on the second face 30b side to communicate with each other.

This allows the condensate flow paths 3 disposed dividedly in the thickness direction to communicate without the vapor flow paths 4 as shown by the arrows $C_{14}$ in FIG. 25, which can further equalize the distribution of a condensate, which makes it possible for a working fluid to more smoothly flow.

The thickness direction communicating holes 54a have only to allow the condensate flow paths 3 disposed on one and the other sides of each of the inner side fluid flow path parts 54 in the thickness direction to communicate, and its specific form therefor is not particularly limited. For example, this form can be described as follows.

The thickness direction communicating holes 54a each have a lateral cross-sectional shape shown in FIGS. 22 and 23 which is not particularly limited. This lateral cross-sectional shape may be a circle, an ellipse, a triangle, a quadrangle, any other polygon, or a geometric shape of any combination thereof.

The thickness direction communicating holes 54a each have a shape in the extending direction thereof (direction z) shown in FIGS. 24 and 25 which is not particularly limited either. The lateral cross-sectional shape may be the same, and may change in any position in the direction z. For example, the thickness direction communicating holes 54a may each have a lateral cross-sectional area of a portion in contact with the condensate flow paths 3 which is much larger than that of any other portion.

The number of the condensate flow paths 3 linked by each of the thickness direction communicating holes 54a is not particularly limited either. Each two of the condensate flow paths 3 on the first face 30a side and each two of the condensate flow paths 3 on the second face 30b side may be formed to communicate as in the present embodiment. Each or at least each three of the condensate flow paths 3 may be formed to communicate on one face side in the thickness direction.

The thickness direction communicating hole 54a brings about the effect thereof even if the number of the thickness direction communicating holes 54a included in the vapor chamber 51 is only one. For a more remarkable effect, a plurality of the thickness direction communicating holes 54a are preferably included.

Such an aspect that a plurality of the thickness direction communicating holes 54a are included is not particularly limited. One thickness direction communicating hole may be disposed in each of the inner side fluid flow path parts 54. A plurality of the thickness direction communicating holes 54a may be disposed in each of the inner side fluid flow path parts 54. When arranged in each of the inner side fluid flow path parts 54, a plurality of the thickness direction communicating holes 54a may be aligned in a straight line, or the positions of pairs of the adjacent thickness direction communicating holes 54a may shift in a direction orthogonal to the aligning direction (direction y) as shown in FIG. 23.

In the present embodiment, the thickness direction communicating holes 54a are disposed only in the inner side fluid flow path parts 54. The thickness direction communicating holes may be disposed only in the peripheral fluid flow path part 34 instead, or may be disposed in both the inner side fluid flow path parts 54 and the peripheral fluid flow path part 34.

2. Embodiment 2

2.1. Embodiment 2a

[Components]

Figure 26:
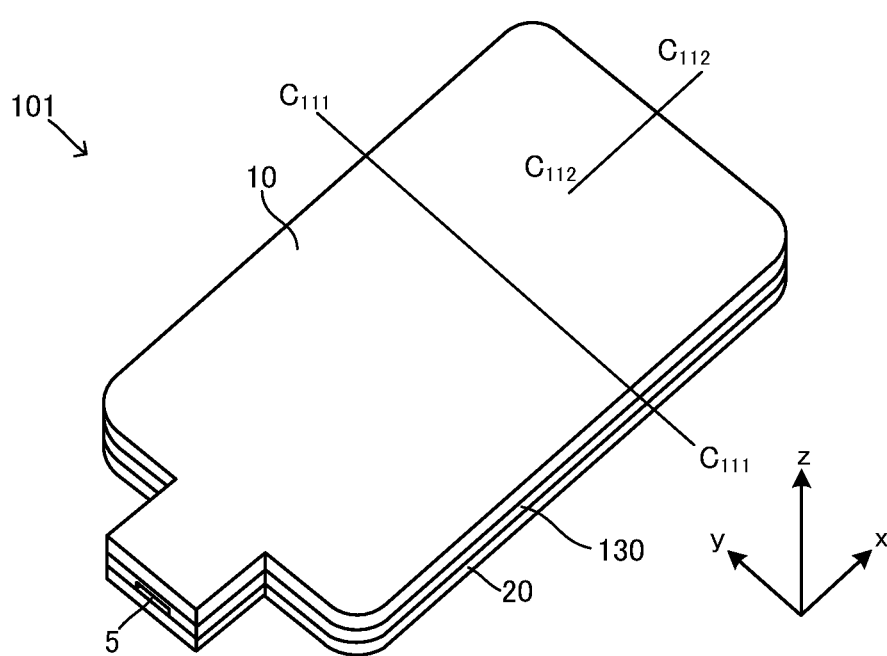
FIG. 26 is a perspective view of a vapor chamber 101.
Figure 27:
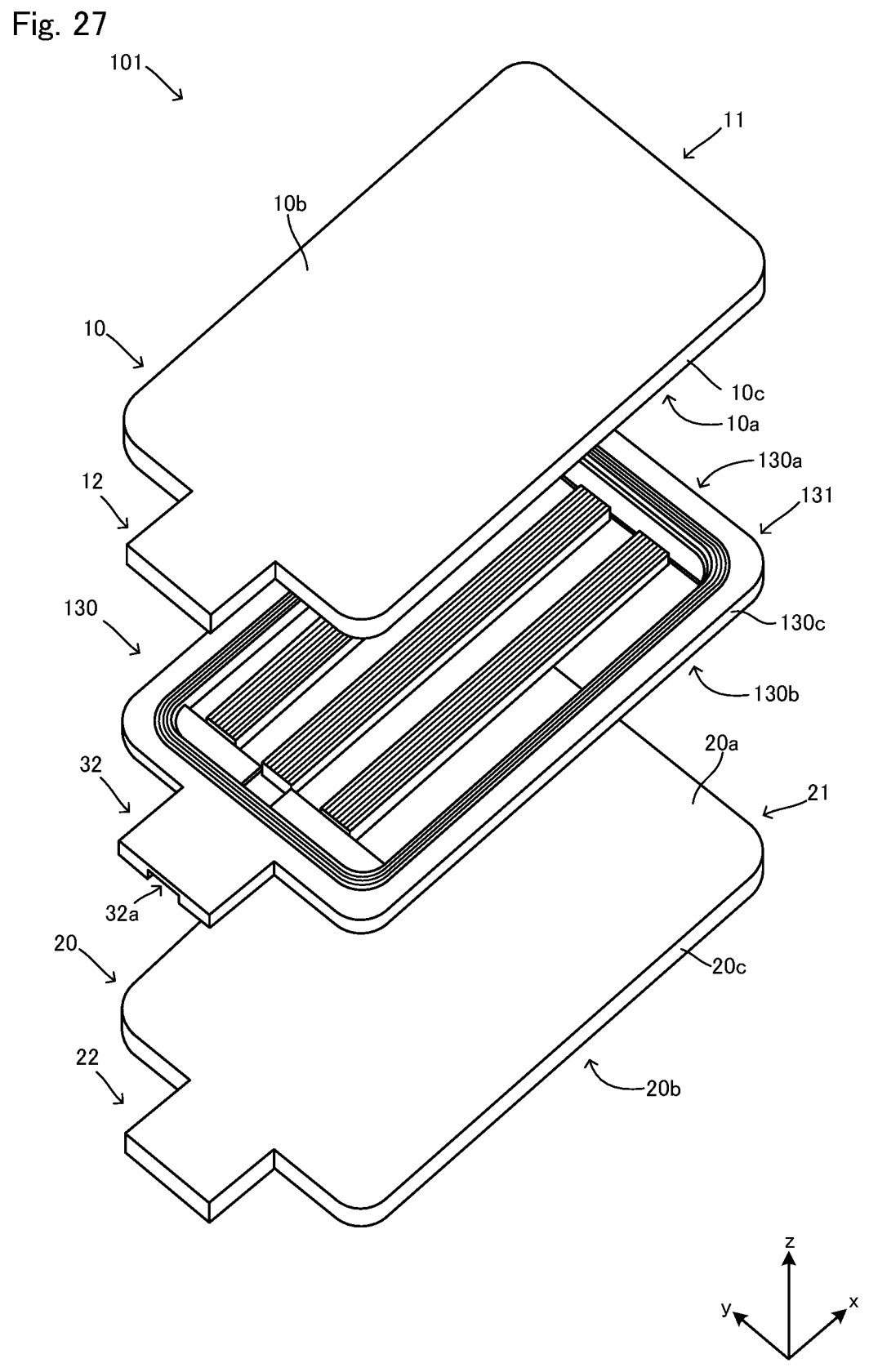

FIG. 26 is an external perspective view of a vapor chamber 101 according to Embodiment 2a. FIG. 27 is an exploded perspective view of the vapor chamber 101. The vapor chamber 101 according to the present embodiment has, as can be seen from FIGS. 26 and 27, the first sheet 10, the second sheet 20 and a third sheet 130 (may be referred to as "middle sheet 130"). As described later, these sheets are superposed and bonded (diffusion bonding, brazing, etc.), to form a sheet for a vapor chamber where a hollow part based on the shape of the third sheet 130 is formed between the first sheet 10 and the second sheet 20. This hollow part is an enclosure 102 (for example, see FIG. 19) when a working fluid is sealed therein, which results in obtention of the vapor chamber 101.

The first sheet 10 and the second sheet 20 included in the present embodiment may be considered the same as the first sheet 10 and the second sheet 20 described in Embodiment 1. Thus, here, the same reference signs are added thereto, and the description thereof is omitted.

<Third Sheet>

In the present embodiment, the third sheet 130 is a sheet held between and superposed on the inner face 10a of the first sheet 10 and the inner face 20a of the second sheet 20. The third sheet 130 has a structure for the enclosure 102 where a working fluid moves.

FIGS. 28 and 29 are plan views of the third sheet 130 (viewed in the direction z). FIG. 28 shows a face to be superposed on the first sheet 10. FIG. 29 shows a face to be superposed on the second sheet 20.

FIG. 30 shows a cross section taken along the line $C_{101}$-$C_{101}$ in FIG. 28. FIG. 29 shows a cross section taken along the line $C_{102}$-$C_{102}$ in FIG. 28.

The third sheet 130 may be a single layer or may be formed by laminating a plurality of sheets, as well. When the third sheet 130 is formed by laminating a plurality of sheets, the following structure may be formed after a plurality of the sheets are laminated, or may be formed by individually processing and thereafter laminating a plurality of the sheets.

In the present embodiment, the third sheet 130 includes a first face 130a that is to be superposed on the inner face 10a of the first sheet 10, a second face 130b that is to be superposed on the inner face 20a of the second sheet 20, and an end face 130c that forms thickness across the first face 130a and the second face 120b. Thus, FIG. 28 shows the first face 130a and FIG. 29 shows the second face 30b.

The third sheet 130 includes a main body 131 and the inlet 32. The inlet 32 according to the present embodiment may be also considered the same as the inlet 32 shown in Embodiment 1. Thus, here, the same reference sign is added thereto, and the description thereof is omitted.

The main body 131 is a sheetlike portion to form the hollow part in the sheet for a vapor chamber, and the enclosure in the vapor chamber 101. In the present embodiment, the main body 131 is a rectangle having the corners formed to be circular arcs (what is called R) in a plan view.

Other than a quadrangle like the present embodiment, the main body 31 may have any shape necessary for a vapor chamber. For example, the shape may be a circle, an ellipse, a triangle, any other polygon, a shape having any bend such as an L-shape, a T-shape, a crank-shape and a U-shape, or a shape in combination of at least two of them.

The thickness and material of the third sheet 130 may be considered the same as, but does not need to be the same as those of the first sheet 10. The third sheet 130 may be formed to be different from the first sheet 10 in thickness and material.

A structure for refluxing a working fluid is formed in the main body 131. Specifically, the main body 131 is constituted of the peripheral bonding part 33, a peripheral fluid flow path part 134, inner side fluid flow path parts 138, vapor flow path grooves 142 and vapor flow path communicating grooves 144.

The vapor chamber 101 according to the present embodiment includes the vapor flow paths 4, which are the first flow paths and thorough which a vapor of a working fluid passes (see FIG. 38 etc.), and the condensate flow paths 3, which are the second flow paths and thorough which a condensate that is a working fluid condensing to liquefy passes (see FIG. 42 etc.). The vapor flow path grooves 142 of the third sheet 130 form the vapor flow paths 4, and the fluid flow path grooves 35 included in the peripheral fluid flow path part 134, and the fluid flow path grooves 39 included in the inner side fluid flow path parts 138 form the condensate flow paths 3.

<<Peripheral Bonding Part>>

The peripheral bonding part 33 may be considered the same as the peripheral bonding part 33 described in Embodiment 1. Thus, here, the same reference sign is added thereto, and the description thereof is omitted.

<<Peripheral Fluid Flow Path Part>>

The peripheral fluid flow path part 134 functions as a fluid flow path part, forms part of the condensate flow paths 3, which are the second flow paths where a working fluid condensing to liquefy passes, and includes a portion to constitute a heat insulating part 6. FIG. 32 is an enlarged view of the portion indicated by the arrow $C_{103}$ in FIG. 30. FIG. 33 is an enlarged view of the peripheral fluid flow path part 134 viewed in a direction indicated by the arrow $C_{105}$ in FIG. 32, in the direction z. That is, FIG. 33 shows part of the peripheral fluid flow path part 134 viewed from the second face 130*b*.

As can be seen from these drawings, the peripheral fluid flow path part 134 is a portion of the main body 131 which is formed along the inside of the peripheral bonding part 33 and disposed along the periphery of a portion to be the enclosure 102.

The fluid flow path grooves 35 which are a plurality of grooves extending parallel to the direction of the periphery of the main body 131 are formed on the first face 130*a* of the peripheral fluid flow path part 134. A plurality of the fluid flow path grooves 35 are arranged at given intervals in a direction different from the extending direction thereof.

The fluid flow path grooves 35 may be considered the same as the fluid flow path grooves 35 described in Embodiment 1. Thus, here, the same reference sign is added thereto, and the description thereof is omitted.

As can be seen from FIGS. 29 to 33, in this embodiment, the peripheral fluid flow path part 134 includes a groove for a heat insulating part 136 on the second face 130*b* side.

The groove for a heat insulating part 136 is a groove extending in the extending direction of the peripheral fluid flow path part 134, does not communicate with the vapor flow path grooves 42 or the fluid flow path grooves 35, and is formed so that a working fluid does not flow therein.

Here, since being a groove, the groove for a heat insulating part 136 has a bottom portion, and opens on the opposite side facing this bottom portion (second face 130*b* side), in a cross-sectional shape thereof. As described later, this opening forms the heat insulating part 6 when the second sheet 20 is superposed on the third sheet 130 to close the opening.

In the present embodiment, the groove for a heat insulating part 136 has a semi-elliptical cross-sectional shape. This cross-sectional shape is not limited to a semi-elliptical shape, and may be a circle, a quadrangle such as a rectangle, a square and a trapezoid, any other polygon, or a shape of combination of any of them.

FIG. 34 shows a cross section taken along the line $C_{106}$-$C_{106}$ in FIG. 33. That is, FIG. 34 is a cross-sectional view of the peripheral fluid flow path part 134 at a portion including a pillar 136*a*. In contrast, the cross section shown in FIG. 32 is a cross section of the peripheral fluid flow path part 134 at a portion of the groove for a heat insulating part 136 where no pillar 136*a* is disposed.

As can be seen from these drawings, a plurality of the pillars 136*a* standing from the bottom portion are aligned at intervals in the groove for a heat insulating part 136. These pillars 136*a* suppress crushing of the groove for a heat insulating part 136 when the third sheet 130 is bonded to the second sheet 20, and can also improve the strength of the vapor chamber 101 itself.

The pillars each have a shape in a plan view (shape seen from the viewpoint of FIG. 33) not particularly limited. Other than a rectangle as in the present embodiment, a polygon such as a triangle and a pentagon, a circle, an ellipse, or any shape is applicable.

The pitch and the number of the pillars to be disposed are not particularly limited, but may be suitably set. Therefore, the number of the pillars may be one or small so that each of the pillar(s) is formed to extend long along the groove for the heat insulating part.

In the present embodiment, the guiding parts 37 are disposed on the peripheral fluid flow path part 134 as shown in FIG. 30. The guiding parts 37 may be considered the same as the guiding part 37 described in Embodiment 1. Thus, here, the same reference sign is added thereto, and the description thereof is omitted.

The peripheral fluid flow path part 134 having the foregoing structure may further have the following structure.

The peripheral fluid flow path part 134 has a width indicated by $W_{102}$ in FIGS. 28 to 30 and 32 (size in the aligning direction of the fluid flow path grooves 35) which may be suitably set according to the size of the whole of the vapor chamber etc. The width $W_{102}$ is preferably at most 3.0 mm, and may be at most 1.5 mm, and may be at most 1.0 mm. The width $W_{102}$ more than 3.0 mm may make it impossible to sufficiently secure a space for the inside fluid flow paths and the vapor flow paths. The width $W_{102}$ is preferably at least 0.05 mm, and may be at least 0.1 mm, and may be at least 0.2 mm. The width $W_{102}$ less than 0.05 mm may make it impossible to obtain a sufficient amount of a fluid refluxing through the periphery. The range of the width $W_{102}$ may be defined by combination of any one of the foregoing plural candidate values for the upper limit and any one of the foregoing plural candidate values for the lower limit. The range of the width $W_{102}$ may be also defined by combination of any two of the plural candidate values for the upper limit or combination of any two of the plural candidate values for the lower limit.

Here, both the widths of the peripheral fluid flow path part 134 on the first face 130*a* and second face 130*b* sides are shown in $W_{102}$. The width of the peripheral bonding face 33*a* does not have to be the same as, but may be different from the width of the peripheral bonding face 33*b*.

The groove width of the groove for a heat insulating part 136 indicated by $W_{104}$ in FIG. 32 is preferably at most 1500 μm, and may be at most 1000 μm, and may be at most 700 m. The width $W_{104}$ is preferably at least 20 μm, and may be at least 45 μm, and may be at least 60 μm. The range of the width $W_{104}$ may be defined by combination of any one of the foregoing plural candidate values for the upper limit and any one of the foregoing plural candidate values for the lower limit. The range of the width $W_{104}$ may be also defined by combination of any two of the plural candidate values for the upper limit or combination of any two of the plural candidate values for the lower limit.

The depth of the groove indicated by $D_{102}$ in FIG. 32 is preferably at most 200 μm, and may be at most 150 μm, and may be at most 100 μm. The depth $D_{102}$ is preferably at least 5 μm, and may be at least 10 μm, and may be at least 20 μm. The range of the depth $D_{102}$ may be defined by combination of any one of the foregoing plural candidate values for the upper limit and any one of the foregoing plural candidate values for the lower limit. The range of the depth $D_{102}$ may be also defined by combination of any two of the plural candidate values for the upper limit or combination of any two of the plural candidate values for the lower limit.

<<Inner Side Fluid Flow Path Part>>

Returning to FIGS. 26 to 30, the inner side fluid flow path parts 138 will be described. The inner side fluid flow path parts 138 are also portions to constitute a part of the condensate flow paths 3, which are the second flow paths where a working fluid condensing to liquefy passes, a part to constitute the heat insulating part 6, and the guiding parts 41. FIG. 35 is an enlarged view of the portion indicated by the arrow $C_{107}$ in FIG. 30. FIG. 35 also shows cross-sectional shapes of any of the inner side fluid flow path parts 38, a corresponding groove for a heat insulating part 140, and the guiding parts 41. FIG. 36 shows an enlarged plan view of one of the inner side fluid flow path part 138 viewed in the direction indicated by the arrow $C_{109}$ in FIG. 35.

As can be seen from these drawings, the inner side fluid flow path parts 138 are portions formed inside the annular ring of the peripheral fluid flow path part 134 in the main body 131. In a plan view (when viewed in the direction z), the inner side fluid flow path parts 138 according to the present embodiment extend in a direction parallel to a long side of the rectangle of the main body 131 (direction x), and a plurality (three in the present embodiment) of the inner side fluid flow path parts 138 are aligned at given intervals in a direction parallel to a short side thereof (direction y).

The fluid flow path grooves 39 which are a plurality of grooves extending in the extending direction of the inner side fluid flow path parts 138 are formed on the first face 130a of the inner side fluid flow path parts 138. A plurality of the fluid flow path grooves 39 are arranged at given intervals in a direction different from the extending direction thereof.

Here, the fluid flow path grooves 39 may be considered the same as the fluid flow path grooves 39 described in Embodiment 1. Thus, the same reference sign is added thereto, and the description thereof is omitted.

As can be seen from FIGS. 29, 30, 35 and 36, the inner side fluid flow path parts 138 include the grooves for a heat insulating part 140 on the second face 130b.

The grooves for a heat insulating part 140 are grooves extending in the extending direction of the inner side fluid flow path parts 138, do not communicate with the vapor flow path grooves 42 or the fluid flow path grooves 39, and are formed so that a working fluid does not flow thereinto.

Here, since being grooves, the grooves for a heat insulating part 140 each have a bottom portion, and each open on the opposite side facing this bottom portion (second face 130b side), in a cross-sectional shape thereof. As described later, these openings form the heat insulating part 6 when the second sheet 20 is superposed on the third sheet 130 to close the openings.

In the present embodiment, the grooves for a heat insulating part 140 each have a semi-elliptical cross-sectional shape. This cross-sectional shape is not limited to a semi-elliptical shape, and may be a circle, a quadrangle such as a rectangle, a square and a trapezoid, other polygon, or a shape of combination of any of them.

FIG. 37 shows a cross section taken along the line $C_{110}$-$C_{110}$ in FIG. 36. That is, FIG. 37 is a cross-sectional view of one of the inner side fluid flow path parts 138 at a portion including a pillar 140a. In contrast, the cross section shown in FIG. 35 is a cross section of one of the inner side fluid flow path parts 138 at a portion of the groove for a heat insulating part 140 where no pillar 140a is disposed.

As can be seen from these drawings, a plurality of the pillars 140a standing from the bottom portion are aligned at intervals in each of the grooves for a heat insulating part 140. These pillars 140a suppress crushing of the grooves for a heat insulating part 140 when the third sheet 130 is bonded to the second sheet 20, and can also improve the strength of the vapor chamber 101 itself.

The pillars each have a shape in a plan view (shape seen from the viewpoint of FIG. 36) not particularly limited. Other than a rectangle as in the present embodiment, a polygon such as a triangle and a pentagon, a circle, an ellipse, or any shape is applicable.

The pitch and the number of the pillars to be disposed are not particularly limited, and may be suitably set. Therefore, the number of the pillars may be one or small so that each of the pillar(s) is formed to extend long along the grooves for the heat insulating part, In the present embodiment, the guiding parts 41 are disposed on the inner side fluid flow path parts 138. These guiding parts 41 may be considered the same as the guiding part 41 described in Embodiment 1. Thus, the same reference sign is added thereto, and the description thereof is omitted.

Preferably, the inner side fluid flow path parts 138 having the foregoing structure further have the following structure.

The width of each of the inner side fluid flow path parts 138 indicated by $W_{106}$ in FIGS. 28 to 30 and 35 (largest value in the size thereof in the aligning direction of the inner side fluid flow path parts 138 and the vapor flow path grooves 42) is preferably at most 3000 m, and may be at most 2000 μm, and may be at most 1500 μm. This width $W_{106}$ is preferably at least 100 μm, and may be at least 200 μm, and may be at least 400 μm. This range of the width $W_{106}$ may be defined by combination of any one of the foregoing plural candidate values for the upper limit and any one of the foregoing plural candidate values for the lower limit. The range of the width $W_{106}$ may be also defined by combination of any two of the plural candidate values for the upper limit or combination of any two of the plural candidate values for the lower limit.

The pitch for a plurality of the inner side fluid flow path parts 138, which is indicated by $P_{102}$ in FIG. 30, is preferably at most 5000 μm, and may be at most 3500 μm, and may be at most 3000 μm. This pitch $P_{102}$ is preferably at least 200 μm, and may be at least 400 μm, and may be at least 800 μm. This range of the pitch $P_{102}$ may be defined by combination of any one of the foregoing plural candidate values for the upper limit and any one of the foregoing plural candidate values for the lower limit. The range of the pitch $P_{102}$ may be also defined by combination of any two of the plural candidate values for the upper limit or combination of any two of the plural candidate values for the lower limit.

This lowers the resistance in the vapor flow paths, which makes it possible to move a vapor and to reflux a condensate in a well-balanced manner.

The inner side fluid flow path parts 138 having the foregoing structure may further have the following structure.

The groove width of each of the grooves for a heat insulating part 140 indicated by $W_{108}$ in FIG. 35 is preferably at most 1500 μm, and may be at most 1000 μm, and may be at most 700 μm. This width $W_{108}$ is preferably at least 20 μm, and may be at least 45 μm, and may be at least 60 μm. The range of the width $W_{108}$ may be defined by combination of any one of the foregoing plural candidate values for the upper limit and any one of the foregoing plural candidate values for the lower limit. The range of the width $W_{108}$ may be also defined by combination of any two of the plural candidate values for the upper limit or combination of any two of the plural candidate values for the lower limit.

The depth of each of the grooves indicated by $D_{104}$ in FIG. 35 is preferably at most 200 μm, and may be at most 150 μm, and may be at most 100 μm. The depth $D_{104}$ is preferably at least 5 μm, and may be at least 10 μm, and may be at least 20 μm. The range of the depth $D_{104}$ may be defined by combination of any one of the foregoing plural candidate values for the upper limit and any one of the foregoing plural candidate values for the lower limit. The range of the depth $D_{104}$ may be also defined by combination of any two of the plural candidate values for the upper limit or combination of any two of the plural candidate values for the lower limit.

<<Vapor Flow Path Groove>>

Next, the vapor flow path grooves 142 will be described. The vapor flow path grooves 142 are portions where a vapor that is a working fluid evaporating to vaporize passes, and form a part of the vapor flow paths 4, which are the first flow paths (see FIG. 19 etc.). FIGS. 28 and 29 each show a shape of the vapor flow path grooves 142 in a plan view. FIG. 30 shows a cross-sectional shape of the vapor flow path grooves 142.

As can be seen from these drawings, in the present embodiment, the vapor flow path grooves 142 are each formed of a groove (slit) formed inside the annular ring of the peripheral fluid flow path part 134 of the main body 131. Specifically, the vapor flow path grooves 142 according to the present embodiment are formed between the adjacent inner side fluid flow path parts 138 and between the peripheral fluid flow path part 134 and the inner side fluid flow path parts 138, are grooves extending in a direction parallel to a long side of the rectangle of the main body 131 in a plan view (direction x), and a plurality (four in the present embodiment) of the vapor flow path grooves 142 are aligned in a direction parallel to a short side thereof (direction y). The vapor flow path grooves 142 according to the present embodiment are formed so as to allow the first face 130a of the the third sheet 130 to communicate with the side of the second face 130b thereof, that is, are slitlike grooves. The vapor flow path grooves 142 open on the first face 130a and second face 130b sides.

Thus, as can be seen from FIG. 30, the third sheet 130 has a shape of the peripheral fluid flow path part 134 and the inner side fluid flow path parts 138, and the vapor flow path grooves 142 alternately repeated in the direction y.

The structure of the vapor flow path grooves 142 having such a structure may be considered the same as the vapor flow path grooves 42 described in Embodiment 1.

<<Vapor Flow Path Communicating Groove>>

The vapor flow path communicating grooves 44 are grooves allowing a plurality of the vapor flow path grooves 142 to communicate. The vapor flow path communicating grooves 44 may be considered the same as the vapor flow path communication grooves 44 described in Embodiment 1. Thus, the same reference sign is added thereto, and the description is omitted.

<Structure of Vapor Chamber>

Next, the structure of the vapor chamber 101 constituted of the first sheet 10, the second sheet and the third sheet 130 in combination will be described. The shape of the vapor chamber 101, and the arrangement, size, shape, etc. of each component that the first sheet 10, the second sheet and the third sheet 130 should have are further understood by this description.

FIG. 38 shows a cross section of the vapor chamber 101 taken along the direction y indicated by $C_{111}$-$C_{111}$ in FIG. 26 in the thickness direction. FIG. 39 shows a cross section of the vapor chamber 101 taken along the direction x indicated by $C_{112}$-$C_{112}$ in FIG. 26 in the thickness direction.

FIG. 40 shows the portion indicated by $C_{113}$ in FIG. 38, FIG. 41 shows a portion of the peripheral fluid flow path part 134 which includes the pillars 136a, FIG. 42 shows the portion indicated by $C_{114}$ in FIG. 38, and FIG. 43 shows a portion of one of the inner side fluid flow path parts 138 which includes the pillars 140a, all of which are enlarged views of those portions.

The protrusions 35a or 39a separate the vapor flow paths 4 and the condensate flow paths 3 on the cross sections shown in FIGS. 38 to 43. The protrusions 35a and 39a include the communicating opening parts 35b and 39b, respectively. Thus, the vapor flow paths 4 and the condensate flow paths 3 communicate with each other via the communicating opening parts 35b or 39b.

As can be seen from FIGS. 26, 27 and 38 to 42, the first sheet 10, the second sheet 20 and the third sheet 130 are arranged so that the inner face 10a of the first sheet 10 is superposed on the third sheet 130 on the first face 130a side and the inner face 20a of the second sheet 20 is superposed on the third sheet 130 on the second face 130b side, to be bonded to constitute the vapor chamber 101. At this time, the main body 131 of the third sheet 130 is superposed on the main body 11 of the first sheet 10 and the main body 131 of the third sheet 130 is superposed on the main body 21 of the second sheet 20, and the inlet 32 of the third sheet 130 is superposed on the inlet 12 of the first sheet 10 and the inlet 32 of the third sheet 130 is superposed on the inlet 22 of the second sheet 20.

Such a laminate of the first sheet 10, the second sheet 20 and the third sheet 130 leads to the arrangement of each component included in the main bodies 11, 21 and 131 as shown in FIGS. 38 to 42. The arrangement is specifically as follows.

The peripheral bonding face 33a disposed on the third sheet 130 on the first face 130a side, and a face of the periphery of the inner face 10a of the first sheet 10 are arranged so as to be superposed; and the peripheral bonding face 33b disposed on the third sheet 130 on the second face 30b side, and a face of the periphery of the inner face 20a of the second sheet 20 are arranged so as to be superposed; to be bonded by diffusion bonding, brazing, or the like. This leads to formation of the hollow part based on the shape of the third sheet 130 between the first sheet 10 and the second sheet 20. This hollow part is the enclosure 102 when a working fluid is sealed therein.

The inner face 10a of the first sheet 10 is arranged on the peripheral fluid flow path part 134 of the third sheet 130 on the first face 130a side so as to be superposed. As a result of this, the openings of the fluid flow path grooves 35 are closed by the first sheet 10 to form part of the hollow part, and are the condensate flow paths 3, which are the second flow paths where a condensate that is a working fluid sealed in the hollow part condensing to liquefy flows.

The inner face 20a of the second sheet 20 is arranged on the peripheral fluid flow path part 134 of the third sheet 130 on the second face 30b side so as to be superposed. As a result of this, the opening of the groove for a heat insulating part 136 is closed by the second sheet 20 to form the heat insulating part 6. The heat insulating part 6 is formed so as not to communicate with the condensate flow paths 3 or the vapor flow paths 4. The heat insulating part 6 is formed to have lower thermal conductivity than any material adjacent thereto. There are no specific limitations, but a vacuum has only to form in the heat insulating part 6, or the heat insulating part 6 has only to be filled with air or any other gas or a material having low thermal conductivity.

The inner face 10a of the first sheet 10 is arranged on the inner side fluid flow path parts 138 of the third sheet 130 on the first face 130a side so as to be superposed. As a result of this, the openings of the fluid flow path grooves 39 are closed by the first sheet 10 to form part of the hollow part, and are the condensate flow paths 3, which are the second flow paths where a condensate that is a working fluid sealed in the hollow part condensing to liquefy flows.

The inner face 20a of the second sheet 20 is arranged on the inner side fluid flow path parts 138 of the third sheet 130 on the second face 130b side so as to be superposed. As a result of this, the openings of the grooves for a heat insulating part 140 are closed by the second sheet 20 to form the heat insulating part 6. The heat insulating part 6 is formed so as not to communicate with the condensate flow paths 3 or the vapor flow paths 4. The heat insulating part 6 is formed to have lower thermal conductivity than any material adjacent thereto. There are no specific limitations, but a vacuum has only to form in the heat insulating part 6, or the heat insulating part 6 has only to be filled with air or any other gas or a material having low thermal conductivity.

As described above, in the condensate flow paths 3, thin flow paths all surrounded by walls on the cross section are formed, which can lead to movement of a condensate by a greater capillary force to smoothly circulate the condensate. That is, when a flow path where a condensate is assumed to flow is considered, the condensate flow path 3 can lead to obtention of a great capillary force compared with a flow path having one continuously opening face, a so-called groove.

In addition, the condensate flow paths 3 are formed separately from the vapor flow paths 4, which are the first flow paths, thereby can lead to smooth circulation of a working fluid.

The heat insulating part of low thermal conductivity is disposed in the vapor chamber 101 on the opposite side of the condensate flow paths 3 in the thickness direction (direction z). This makes heat transfer to a working fluid moderate to reduce a local temperature rise and a local temperature drop, which can improve uniformity. More specifically, dryout due to rapid heating, prevention of the flow of the working fluid by condensate clogging due to condensation faster than necessary, etc. can be suppressed, thereby the heat transport capability may be improved.

The shapes of the condensate flow paths 3 and the heat insulating part 6 may be considered the same as the shapes and measures as described above concerning the third sheet 130.

Other portions will be described. As can be seen from FIG. 38, the openings of the vapor flow path grooves 142 are closed by the first sheet 10 and the second sheet 20, to form part of the hollow part, and form flow paths for a working fluid to be the vapor flow paths 4, which are the first flow paths where a vapor flows. The relationship between the cross-sectional area of the flow paths of the condensate flow paths 3 and that of the vapor flow paths 4 may be considered the same as the relationship between the cross-sectional area of the flow paths of the condensate flow paths 3 and that of the vapor flow paths 4 described in Embodiment 1.

The shape of the vapor flow paths 4 may be considered based on the shape and measures described above concerning the third sheet 130.

Since the guiding parts 37 and 41 are disposed in the present embodiment, each of the vapor flow paths 4 is formed so as to be in contact with two of the guiding parts.

As can be seen from FIG. 39, the openings of the grooves 44*a* of the vapor flow path communicating grooves 44 of the third sheet 130 are closed by the first sheet 10 and the openings of the grooves 44*b* thereof are closed by the second sheet 20, to form the hollow part where a plurality of the vapor flow paths 4 communicate. These become flow paths for a working fluid.

A working fluid is sealed in the enclosure 102 of the vapor chamber 101. The working fluid is not particularly limited. Any working fluid used for usual vapor chambers, such as pure water, ethanol, methanol, acetone, and any mixtures thereof may be used.

[Production of Vapor Chamber]

For example, a vapor chamber as described above may be made as follows.

The fluid flow path grooves 35, the groove for a heat insulating part 136, the fluid flow path grooves 39, the grooves for a heat insulating part 140, the vapor flow path grooves 142, and the grooves 44*a* and 44*b* are formed on a sheet having an outer circumferential shape of the third sheet 130 by half etching. It is noted that the vapor flow path grooves 142 are subjected to half etching from both of the first face 130*a* and second face 130*b* sides so as to penetrate in the thickness direction. Such etching can also lead formation of the shape of the guiding parts 37 and 41.

Next, the first sheet 10 is superposed on the third sheet 130 on the first face 130*a* side and the second sheet 20 is superposed on the third sheet 130 on the second face 130*b* side, to be tentatively fixed. The tentative fixation is performed by a particularly nonlimited way, and examples thereof include resistance welding, ultrasonic welding, and bonding with an adhesive.

After the tentative fixation, the first sheet 10, the second sheet 20 and the third sheet 130 are permanently bonded by diffusion bonding, to be a sheet for a vapor chamber. Instead of diffusion bonding, brazing may be used for the bonding. "(Being) permanently bonded" here means being bonded to such an extent that the bonding can be maintained so that the airtightness of the enclosure 102 can be kept when the vapor chamber 101 operates, but is not restricted to a strict meaning thereof.

This bonding in a vacuum can lead to formation of a vacuum in the heat insulating part 6. This bonding in air or any other gas makes it possible to fill the heat insulating part 6 with a gas according to air or any other gas. The groove for a heat insulating part 136 including the pillars 136*a* and the grooves for a heat insulating part 140 including the pillars 140*a* can suppress crushing and expansion of the heat insulating part 6 in the bonding, or when the pressure in the hollow part is reduced or when a working fluid is poured as described later. When a solid material is put in the heat insulating part 6, such a material has only to be put in the grooves for the heat insulating part before the bonding.

After the bonding, the hollow part is evacuated via the formed inlet flow path 5, and the pressure thereinside is reduced. Thereafter, a working fluid is poured to the hollow part, inside which the pressure is reduced, via the inlet flow path 5, and is put inside the hollow part. Then, the inlet flow path 5 is closed by welding using fusing or by caulking on the superposed inlets 12, and 22 and 32. This leads to secure retainment of the working fluid inside the enclosure 202.

In the vapor chamber according to the present embodiment, the inner side fluid flow path parts 138 function as pillars, which can suppress the enclosure collapsing during the bonding and reducing the pressure.

[Operation of Vapor Chamber]

Next, the operation of the vapor chamber 101 will be described. The arrangement of the vapor chamber 101 in an electronic device is as described in Embodiment 1 (FIGS. 1 and 19). The concept of movement of a working fluid and diffusion of heat in the condensate flow paths 3 and the vapor flow paths 4 may be also considered the same as described in Embodiment 1.

In the present embodiment, the heat insulating part 6 is disposed in the vapor chamber 101 on the opposite side of the condensate flow paths 3 in the thickness direction (direction z). This makes heat transfer to a working fluid moderate to reduce a local temperature rise and a local temperature drop, which can improve uniformity. That is, dryout due to rapid heating, prevention of the flow of the working fluid by condensate clogging due to condensation faster than necessary, etc. can be suppressed, thereby the heat transport capability may be improved.

Accordingly, the heat insulating part is not necessarily disposed all over the vapor chamber, but may be disposed only at a portion where a local heat transfer is assumed. Examples of such a portion include a portion where a heat source (electronic component) is disposed, and, conversely, an end or the like of the vapor chamber which is separated from the heat source.

The form including the guiding parts 37 and 41 leads to formation of portions surrounded by the guiding faces 37b and 41b, the first sheet 10 and the second sheet 20. The condensate tends to collect in these portions by the effect of the capillary force. This leads to further smooth guiding of the condensate into the condensate flow paths 3.

2.2. Other Embodiments

FIG. 44 shows such an example of the grooves for a heat insulating part 140 disposed on part of the second face 130b of the third sheet 130. FIG. 44 corresponds to FIG. 29. According to this, the heat insulating part 6 is also limited to be disposed on the portion where the grooves for a heat insulating part 140 are disposed. This makes it possible to dispose the heat insulating part according to thermal design such that, for example, the heat insulating part 6 is disposed on a portion near an object to be cooled, and a portion where condensation is desired to be suppressed but is not disposed on a portion where rapid condensation is desired to be performed.

FIGS. 45 to 47 show examples of the heat insulating part(s) 6 also disposed for the vapor flow paths 4. All FIGS. 45 to 47 correspond to FIG. 38.

FIG. 45 shows such an example of the heat insulating parts 6 each disposed for the condensate flow paths 3 and the vapor flow paths 4. FIG. 46 shows an example of the heat insulating part 6 communicating across the condensate flow paths 3 and the vapor flow paths 4. FIG. 47 shows such an example of the heat insulating parts 6 disposed only for the vapor flow paths 4.

3. Embodiment 3

The guiding parts 37 and 39 have been described in Embodiments 1 and 2. In Embodiment 3, the guiding parts will be described in detail. Therefore, the description of the structure except the guiding parts will be omitted because this structure may be considered the same as in Embodiments 1 and 2. In Embodiment 1, the second face 30b of the third sheet 30 includes the fluid flow path grooves 40 and in Embodiment 2, the second face 130b of the third sheet 130 includes the grooves for a heat insulating part 140. However, the second face of the third sheet does not always have to include these elements. Here, such an example of the second face of the third sheet which does not include that these elements will be described. This does not prevent the second face of the third sheet from including the fluid flow path grooves 40 or the grooves for a heat insulating part 140.

In the following description, the reference signs used in Embodiment 1 will be used for the elements other than the guiding parts.

3.1. Embodiment 3a

Figure 13B:
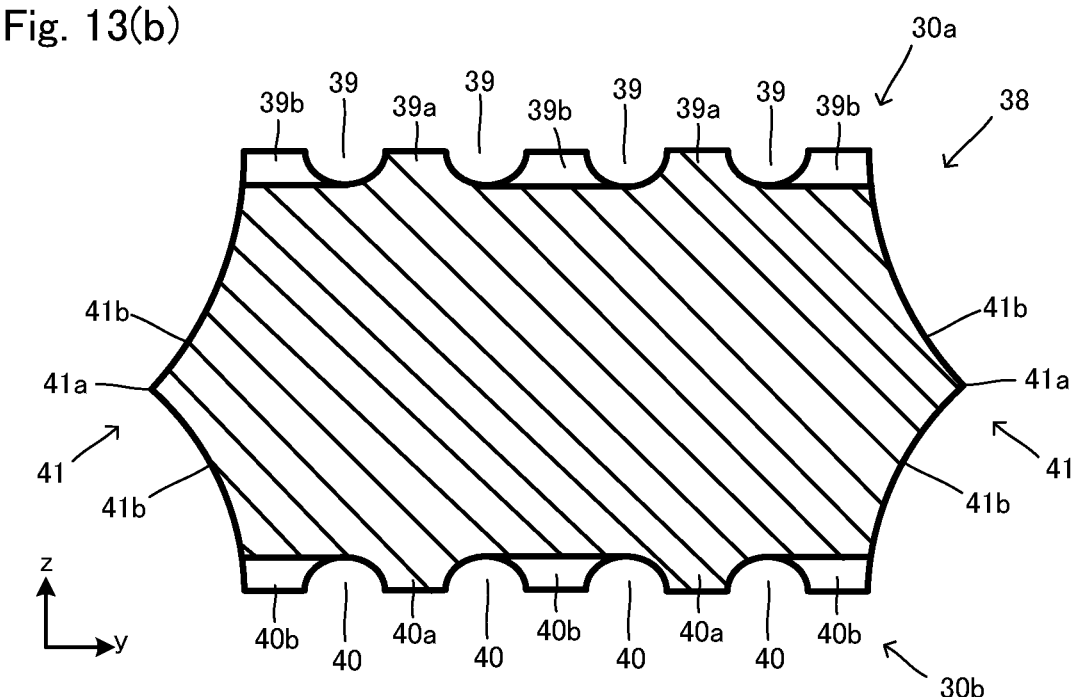
Figure 48A:
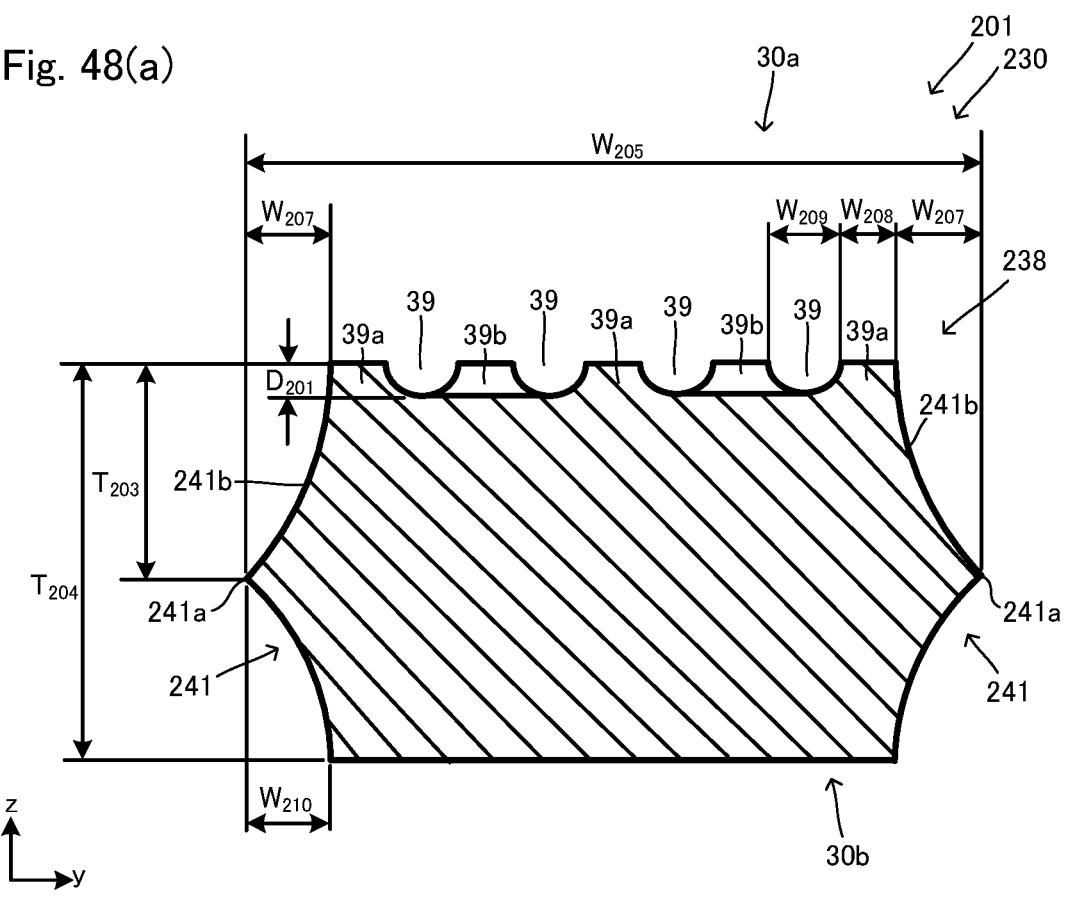
Figure 48B:
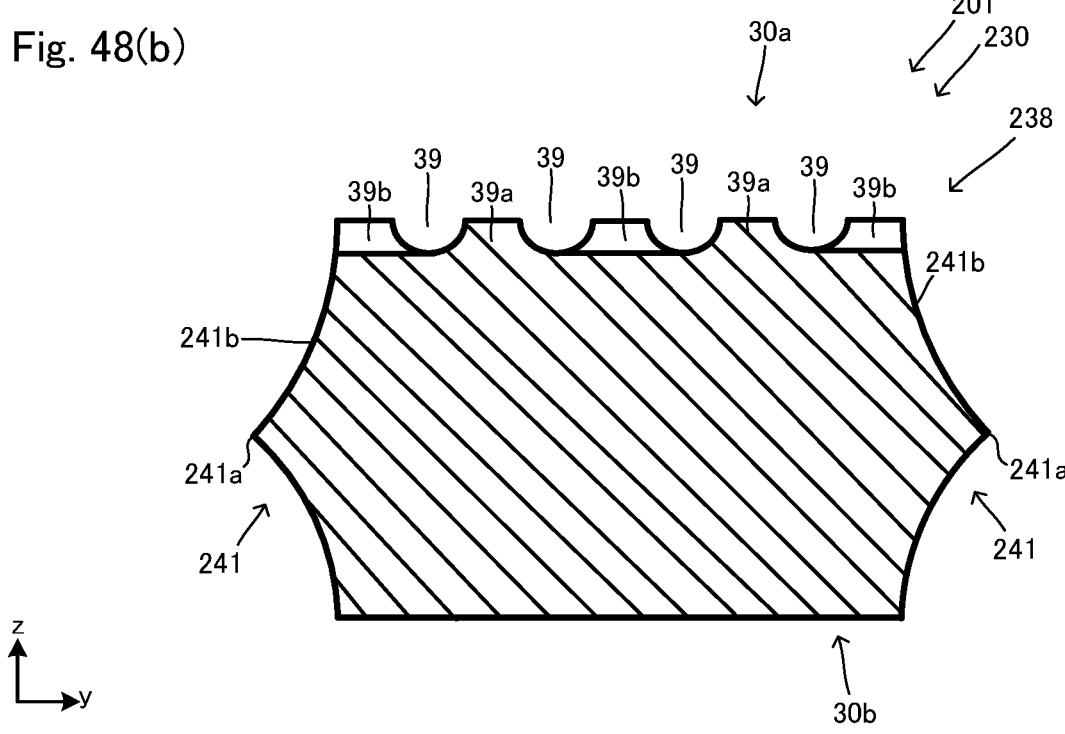

FIGS. 48(a) and 48(b) explanatorily show an inner side fluid flow path part 238 and correspond to FIGS. 13(a) and 13(b). Here, guiding parts 241 will be described using the inner side fluid flow path parts 238. Guiding parts included in the peripheral fluid flow path part may be also considered the same.

In the present embodiment, the guiding parts 241 are disposed on the inner side fluid flow path parts 238. The guiding parts 241 are portions formed on the boundary surfaces with the vapor flow path grooves 42, and sticking out on the vapor flow path grooves 42 sides. Therefore, in the present embodiment, the guiding parts 241 are arranged on both sides of the inner side fluid flow path parts 238 in the width direction (direction y).

In the present embodiment, the guiding parts 241 each include an apex 241a that sticks out most at a position from the first face 30a (apexes of the protrusions 39a of the fluid flow path groove) by $T_{203}$ in the thickness direction (direction z), and a guiding face 241b of a recessed circular arc toward the inner side fluid flow path part 238 in the cross-sectional view, from the apex 241a to the fluid flow path grooves 39. The guiding face 241b does not have to have the shape of a circular arc, and may have a curved shape other than a recessed circular arc toward the inner side fluid flow path part 238 side in the cross-sectional view.

Other examples of the form of the guiding parts will be described later. Every guiding part is a portion sticking out on the vapor flow path grooves 42 side, and includes a face (guiding face) including a face from the most sticking apex towards the fluid flow path grooves (condensate flow paths).

The guiding parts 241 as described above make it easy for a condensate to collect on the guiding faces 241b, which makes it possible to smoothly move a working fluid between the condensate flow paths 3 and the vapor flow paths 4 via the guiding parts 241, to improve a heat transport capability.

The surfaces of the guiding faces 241b are not particularly limited, but may be a rough face, or a micro steplike face. This can improve power for holding a condensate.

The surface roughness (ISO 25178) of each guiding face may be measured with, for example, a laser microscope (model number: VK-X250) manufactured by Keyence Corporation. The arithmetic mean height Sa of this surface roughness is preferably at least 0.005 μm, and more preferably at least 0.03 μm. The maximum height Sz is preferably at least 0.05 μm, and more preferably at least 0.3 μm.

Preferably, the guiding parts 241 having the foregoing structure further have the following structure.

The width of each of the inner side fluid flow path parts 238 indicated by $W_{205}$ in FIG. 48(a) (largest value in the size thereof in the aligning direction of the inner side fluid flow path parts 238 and the vapor flow path grooves 42) is preferably at most 3000 μm, and may be at most 2000 μm, and may be at most 1500 μm. This width $W_{205}$ is preferably at least 100 μm, and may be at least 200 μm, and may be at least 400 μm. This range of the width $W_{205}$ may be defined by combination of any one of the foregoing plural candidate values for the upper limit and any one of the foregoing plural candidate values for the lower limit. The range of the width $W_{205}$ may be also defined by combination of any two of the plural candidate values for the upper limit or combination of any two of the plural candidate values for the lower limit.

The projecting amount (distance from the end of one of the protrusions 39a to the corresponding apex 241a) indicated by $W_{207}$ in FIG. 48(a) is preferably at most 1000 μm, and may be at most 500 μm, and may be at most 300 μm. The projecting amount $W_{207}$ is preferably at least 20 μm, and may be at least 45 μm, and may be at least 60 μm. The range of the projecting amount $W_{207}$ may be defined by combination of any one of the foregoing plural candidate values for the upper limit and any one of the foregoing plural candidate values for the lower limit. The range of the projecting amount $W_{207}$ may be also defined by combination of any two of the plural candidate values for the upper limit or combination of any two of the plural candidate values for the lower limit.

The distance from the apex of one of the protrusions 39*a* to the corresponding apex 241*a* of the guiding part 241 in the thickness direction, which is indicated by $T_{203}$ in FIG. 48(*a*), is such that: a value obtained by dividing $T_{203}$ by $T_{204}$ is preferably at least 0.05, and may be at least 0.15, and may be at least 0.3 where the thickness of the inner side fluid flow path parts 238 is defined as $T_{204}$; and has only to be at most 1.0, and may be at most 0.8, and may be at most 0.6. The range of the value obtained by dividing $T_{203}$ by $T_{204}$ may be defined by the combination of any one of the foregoing plural candidate values for the upper limit, and any one of the foregoing plural candidate values for the lower limit. The range of the value obtained by dividing $T_{203}$ by $T_{204}$ may be also defined by the combination of any two of the plural candidate values for the upper limit or the combination of any two of the plural candidate values for the lower limit.

In the present embodiment, the foregoing value is 0.5, and the apexes 241*a* are arranged at the central positions of the inner side fluid flow path parts 238 in the thickness direction.

Further, as shown in FIG. 48(*a*), the following relationship is preferable:

$$D_{201} \times (W_{209}/2) < T_{203} \times W_{207} < (T_{204} - T_{203}) \times W_{210}$$

where the width of the fluid flow path groove 39 closest to the guiding parts 241 is defined as $W_{209}$, the depth of the fluid flow path groove 39 closest to the guiding parts 241 is defined as $D_{201}$ and the projecting amount of each of the guiding parts 241 on the face 30*b* (face on the side where the fluid flow path grooves 39 are not included) side is defined as $W_{210}$.

This makes it easy to collect a working fluid in a condensing and liquifying state in the condensate flow paths 3, and makes it easy to move the working fluid in a liquefying state between the vapor flow paths 4 and the condensate flow paths 3. This also makes it easy for the working fluid in a liquefying state to evaporate in the vapor flow paths 4.

Next, the case where the first sheet 10, the second sheet and the third sheet 30 are combined to be the vapor chamber 1 will be described. FIGS. 49(*a*) and 49(*b*) correspond to FIGS. 18(*a*) and 18(*b*).

The protrusions 39*a* separate the vapor flow paths 4 and the condensate flow paths 3 on the cross section shown in FIG. 49(*a*). The protrusions 39*a* include the communicating opening parts 39*b*. Thus, the vapor flow paths 4 and the condensate flow paths 3 communicate with each other via the communicating opening parts 39*b* according to a cross section showing that the communicating opening parts 39*b* are adjacent to the vapor flow paths 4 as shown in FIG. 49(*b*).

As can be seen from FIGS. 49(*a*) and 49(*b*), the first sheet 10, the second sheet 20 and the third sheet 30 are arranged so that the inner face 10*a* of the first sheet 10 is superposed on the third sheet 30 on the first face 30*a* side and the inner face 20*a* of the second sheet 20 is superposed on the third sheet 30 on the second face 30*b* side, to be bonded to constitute the vapor chamber 1.

The guiding parts 241 are provided, so as to be included as arranged between the condensate flow paths 3 and the vapor flow paths 4 and protruding on the vapor flow paths 4 sides.

In the present embodiment, the guiding parts 241 each include the apex 241*a* sticking out most on the vapor flow paths 4 sides in the thickness direction (direction z), and the guiding face 241*b* of a circular arc on a cross section, from the apex 241*a* toward the side where the condensate flow paths 3 are included.

That is, the guiding parts are arranged between the condensate flow paths 3 and the vapor flow paths 4, protrude on the vapor flow paths 4 sides, and each include a face (guiding face) including a face from the most sticking portion (apex) thereof towards the condensate flow paths 3.

The working fluid from which heat is taken as moving the vapor flow paths 4 and which condenses is adhered to wall faces of the vapor flow paths 4. Because the vapor continuously flows in the vapor flow paths 4, the condensate moves to the condensate flow paths 3 as if the condensate were pushed by the vapor as shown by the arrows $C_{211}$ in FIGS. 49(*a*) and 49(*b*). Because the condensate flow paths 3 include the communicating opening parts 39*b*, the condensate passes through these communicating opening parts to be distributed into a plurality of the condensate flow paths 3.

At this time, the guiding parts 241 are included in the inner faces of the vapor flow paths 4, which leads to formation of portions held between the guiding faces 241*b* and the first sheet 10. The condensate tends to collect in these portions by the effect of the capillary force. This leads to further smooth guiding of the condensate into the condensate flow paths 3, to increase the heat transport amount.

Here, the vapor flow paths 4, the guiding parts 241 and the condensate flow paths 3 preferably have the following relationship. FIG. 50 shows an explanatory view. In FIG. 50, a part of the reference sings is omitted for visibility. FIG. 49(*a*) can be referred to.

On the same cross section as FIG. 49(*a*), a rectangle in one of the vapor flow paths 4 where the distance between the facing apexes 241*a* is defined as a breadth and the size of the vapor flow path 4 in the thickness direction is defined as a length is defined as a zone A, and the area thereof is defined as $A_A$.

On the same cross section as FIG. 49(*a*), a zone in the vapor flow path 4 surrounded by the guiding face 241*b*, the zone A, the protrusion 39*a* and the first sheet 10 is defined as a zone B, and the area thereof is defined as $A_B$.

On the same cross section as FIG. 49(*a*), a zone in one of the concentrate flow paths 3 which is closest to the zone B is defined as a zone C, and the area thereof is defined as $A_C$.

These $A_A$, $A_B$ and $A_C$ preferably have the following relationship:

$$A_A > A_B > A_C$$

$A_A$, $A_B$ and $A_C$ having such a relationship make it easy to draw a condensing working fluid from the vapor flow paths 4 into the condensate flow paths 3, and can suppress a rapidly vaporizing fluid flowing out of the condensate flow paths 3 to the vapor flow paths 4.

3.2. Embodiments 3b to 3h

The following drawings are explanatory views of Embodiments 3b to 3h which are other embodiments as focusing on the shape of the guiding parts. All the drawings correspond to FIGS. 49 (*a*) and 49(*b*). The guiding parts in these forms are applicable to those for the peripheral fluid flow path part. For convenience, in every embodiment below, the reference sign 238 represents the inner side fluid flow path parts, the reference sign 241 represents the guiding parts, the reference sign 241*a* represents the apexes and the reference sign 241*b* represents the guiding faces.

In Embodiment 3b in FIGS. 51(*a*) and 51(*b*), the apexes 241*a* are each arranged at a closer position to the condensate flow paths 3 in the thickness direction compared to the apexes 41*a* in Embodiment 3a in FIGS. 49(*a*) and 49(*b*). Specifically, the value obtained by dividing $T_{203}$ by $T_{204}$ shown in FIG. 48 ranges between 0.2 and 0.4.

This embodiment leads to a small space held between each of the guiding faces 241*b* and the first sheet 10, which causes a capillary force to greatly work to make the foregoing effect more remarkable.

In Embodiment 3c in FIGS. 52(*a*) and 52(*b*), the guiding faces 241*b* extending from the apexes 241*a* are like straight lines in a cross-sectional view. While all the guiding faces 241*b* in Embodiments 3a and 3b have shapes of recessed circular arcs toward the inner side fluid flow path parts 238 sides, the guiding faces 241*b* are like straight lines on a cross section in Embodiment 3c.

Such an embodiment also brings about the foregoing effect.

In Embodiment 3d in FIGS. 53(*a*) and 53(*b*), the apexes 241*a* are in the form of a face, and the guiding faces 441*b* each include a face extending parallel to the aligning direction of a plurality of the condensate flow paths 3 and the vapor flow paths 4 (direction y).

Such an embodiment also brings about the foregoing effect.

In Embodiment 3e in FIGS. 54(*a*) and 54(*b*), the guiding faces 241*b* extending from the apexes 241*a* are in the form of a protruding circular arc on the vapor flow paths 4 sides in a cross-sectional view. The guiding faces 541*b* do not have to be in the form of a circular arc, but may have a curved shape other than a protruding circular arc on the vapor flow paths 4 side, in the cross-sectional view.

Such an embodiment also brings about the foregoing effect. In this embodiment, as the guiding faces 241*b* are approaching the condensate flow paths 3, portions of a short distance from the first sheet 10 can be formed relatively a lot, from which efficient use of a capillary force can be expected.

Embodiment 3f in FIGS. 55(*a*) and 55(*b*) is an example of the apexes 241*a* disposed separately on a face of the vapor flow paths 4 which is on the opposite side of the condensate flow paths 3 side. According to such an embodiment, the guiding faces 241*b* may be formed and the foregoing effect is brought about, as well.

In view of narrow spaces between the guiding faces and the first face 10*a* to use a greater capillary force, the apexes are preferably arranged on any side faces of the vapor flow paths which are not inner faces facing the thickness direction, in the thickness direction, as the foregoing embodiments.

In Embodiment 3g in FIGS. 56(*a*) and 56(*b*), the condensate flow paths 3 are formed on both sides of the inner side fluid flow path parts 238 in the thickness direction (that is, the same as Embodiment 1 in this point). In this example, the guiding parts 241 can form the guiding faces 241*b* from the apexes 241*a* thereof toward the condensate flow paths 3 on both sides, which brings about the foregoing effect for the condensate flow paths 3 present on both sides in the thickness direction.

In Embodiment 3h in FIGS. 57(*a*) and 57(*b*), the condensate flow paths 3 are formed at the center of the inner side fluid flow path parts 238 in the thickness direction. In this example, the vapor chamber is made from two sheets. In this case, a first sheet 210 includes the above-described structure of the first sheet 10 and part of the above-described structure of the third sheet 30, and a second sheet 220 includes the above-described structure of the second sheet 20 and part of the above-described structure of the third sheet 30. Thus, the combination of both leads to formation of the enclosure of the vapor chamber.

In Embodiment 3h, the guiding faces 241*b* each include a face extending from the apex 241*a* of the guiding part 241 in parallel to the aligning direction of a plurality of the condensate flow paths 3 and the vapor flow paths 4 (direction y).

Such an embodiment also brings about the foregoing effect.

The present embodiment is an example of the apexes 241*a* and the condensate flow paths 3 positioned at the same in the thickness direction (at positions in the direction z) are the same. In the above-described embodiments, the positions of the apexes and the condensate flow paths in the thickness direction (position in the direction z) are different. Either type of Embodiments may be applied as necessary. More condensate tends to be capable of being held and guided when the positions of the apexes and the condensate flow paths in the thickness direction (position in the direction z) are different.

4. Embodiment 4

In the vapor chamber, an enclosed working fluid may freeze in an environment of lower temperature than the freezing point thereof. If the working fluid expands due to freezing like pure water and the like, the vapor chamber may be considered to deform due to volume expansion of the working fluid in the vapor flow path parts. In the case where such a problem arises, the vapor chamber preferably has a form capable of suppressing deformation thereof even when the working fluid freezes and expands, to show a stabler performance.

In Embodiment 4, a vapor chamber including a structure for the foregoing will be described.

The first sheet 10 and the second sheet 20 according to Embodiment 4 are different from those in Embodiments 1 to 3. Accordingly, the aspects described in Embodiments 1 to 3 are applicable to the third sheet, and thus the description of the third sheet is omitted here. Here, for convenience, such an example that the third sheet 30 according to Embodiment 1 is applied will be described. Embodiment 4 is not limited to this. Therefore, the concepts of the arrangement in an electronic device and the operation of a working fluid, and heat diffusion thereby are as described above, and the description thereof will be omitted.

4.1. Embodiment 4a

[Form]

FIG. 58 shows a cross section of a vapor chamber 301 and corresponds to FIG. 15. As can be seen from FIG. 58, a first sheet 310 includes an inner sheet 311 and a reinforcing sheet 312, and a second sheet 320 includes an inner sheet 321 and a reinforcing sheet.

The inner sheet 311 is a sheet disposed in contact with the first face 30*a* of the third sheet 30 and constitutes the inner face 10*a*. Similarly, the inner sheet 321 is a sheet disposed in contact with the second face 30*b* of the third sheet 30 and constitutes the inner face 20*a*.

The reinforcing sheet 312 is a sheet disposed on the inner sheet 311 on the opposite side of the third sheet 30 and constitutes the outer face 10*b*. Similarly, the reinforcing sheet 322 is a sheet disposed on the inner sheet 321 on the opposite side of the third sheet 30 and constitutes the outer face 10*b*.

The inner sheet 311 and the reinforcing sheet 312 may be formed as a clad material. The clad material means a laminated material formed by bonding plural types of sheets to each other. For example, the inner sheet 311 and the reinforcing sheet 312 may be made as a clad material by plating one sheet with the other sheet. In this case, an adhesion layer (such as a strike plating layer and a seed layer) not shown, for improving adhesiveness of both the sheets may be interposed between both the sheets. Further, both the sheets may be made as a clad material by diffusion bonding.

Similarly, the inner sheet 321 and the reinforcing sheet 322 may be formed as a clad material. The clad material means a laminated material formed by bonding plural types of sheets to each other. For example, the inner sheet 321 and the reinforcing sheet 322 may be made as a clad material by plating one sheet with the other sheet. In this case, an adhesion layer (such as a strike plating layer and a seed layer) not shown, for improving adhesiveness of both the sheets may be interposed between both the sheets. Further, both the sheets may be made as a clad material by diffusion bonding.

The inner sheet 311 and 321 are made from any material not particularly limited as long as the material has good thermal conductivity. For example, this material may contain copper or a copper alloy. This case can improve the thermal conductivity of each of the sheets, which results in improved efficiency of the heat dissipation of the vapor chamber 301. A case where pure water is used as a working fluid can prevent corrosion. Anther metal material such as aluminum and titanium, or another metal alloy material such as stainless steel may be also used as long as desired efficiency of the heat dissipation is obtained and corrosion can be prevented.

The reinforcing sheet 312 is made from a material of higher proof stress than the inner sheet 311. The reinforcing sheet 322 is made from a material of higher proof stress than the inner sheet 321. Here, the proof stress is stress that leads to permanent strain of 0.2% in unloading.

Any specific material of the reinforcing sheets 312 and 322 is not particularly limited. Preferably, this material is a metallic material of good thermal conductivity and has desired mechanical strength. Examples of the material include materials containing copper alloys, iron alloys, nickel, nickel alloys, titanium, titanium alloys and aluminum alloys. Among them, examples of iron alloys include stainless steel, invar materials (iron alloy containing nickel) and Kovar (iron alloy containing cobalt).

The inner sheets 311 and 312 may each have a thickness of, for example, 0.2 μm to 100 μm. This thickness at least 0.2 μm can prevent pinholes from forming in the inner sheet 311 or 312, and can prevent impurities contained in the material constituting the reinforcing sheets 312 and 322 from depositing on the third sheet 30 side through the pinholes. The thickness at most 100 μm can suppress the vapor chamber 301 having more thickness. The thickness of each of the inner sheets is more preferably 0.25 μm to 10 μm, and further preferably 0.45 μm to 5 μm.

The reinforcing sheets 312 and 322 may each have a thickness more than that of each of the inner sheets 311 and 321, respectively, in order to enhance the reinforcing function. In view of enhancement of the reinforcing function, the reinforcing sheet 312 is preferably thicker than the inner sheet 311. More specifically, the thickness of the reinforcing sheets is preferably 5 to 30 times, and more preferably 5 to 20 times as much as the thickness of the inner sheet.

Any specific thickness of each of the reinforcing sheets 312 and 322 is not particularly limited. For example, the thickness is 3 μm to 100 μm. This thickness at least 3 μm can lead to effective reinforcement. The thickness at most 100 μm can suppress the vapor chamber 301 having more thickness. The thickness is more preferably 5 μm to 50 μm, and further preferably 9 μm to 25 μm.

The first sheet 310 and the second sheet 320 each have a thickness at most 0.1 mm, preferably at most 0.05 mm, and further preferably at most 0.02 mm. This makes it possible to produce a thin vapor chamber (e.g., at most 0.4 mm) that makes freezing and expansion difficult. The first sheet 310 and the second sheet 320 each have a thickness, for example, at least 0.01 mm. This can suppress deformation of the inner sheets 311 and 321 due to freezing and expansion of a working fluid in the vapor flow paths 4.

In the present embodiment, each of both the first sheet 310 and the second sheet 320 includes both the inner sheet and the reinforcing sheet. The present invention is not limited thereto. Only one of the first sheet and the second sheet may include the reinforcing sheet if not necessary.

A layer of the same material and the same thickness as the inner sheets may be further laminated onto at least one of the reinforcing sheet 312 of the first sheet 310 and the reinforcing sheet 322 of the second sheet 320. This can suppress warpage generated in any sheet on which the layer is laminated.

[Production Method]

Next, a method of producing the vapor chamber 301 having such a structure will be described with reference to FIGS. 59 to 64.

First, as shown in FIG. 59, as a preparation step, a metallic material sheet M in the form of a flat table which includes a first face Ma and a second face Mb is prepared.

Next, as shown in FIG. 60, as a resist forming step, a resist film 340 is formed on the first face Ma of the metallic material sheet M and a resist film 341 is formed on the second face Mb thereof. The first face Ma and the second face Mb of the metallic material sheet M may be subjected to acid degreasing as pretreatment before the resist films 340 and 341 are formed.

Next, as shown in FIG. 61, as a patterning step, the resist films 340 and 341 are patterned by a photolithography technique.

In the patterning on the resist film 340, openings corresponding to the fluid flow path grooves 39 and the communicating opening parts 39*b* of the inner side fluid flow path parts 38 and the vapor flow path grooves 42 are formed. At this time, the openings corresponding to the fluid flow path grooves 39 and the communicating opening parts 39*b* may be formed to be smaller than the width of these fluid flow path grooves 39 and communicating opening parts 39*b*. The openings corresponding to the vapor flow path grooves 42 may be formed to have the same width as the vapor flow path grooves 42 on the first face 30*a*.

In the patterning on the resist film 341, openings corresponding to the fluid flow path grooves 40 and the communicating opening parts 40*b* of the inner side fluid flow path parts 38, and the vapor flow path grooves 42 are formed. At this time, the openings corresponding to the fluid flow path grooves 40 and the communicating opening parts 40*b* may be formed to be smaller than the width of these fluid flow path grooves 40 and communicating opening parts 40*b*. The openings corresponding to the vapor flow path grooves 42 may be formed to have the same width as vapor flow path grooves 42 on the second face 30*b*.

Next, as shown in FIG. 62, as an etching step, the first face 30*a* and the second face 30*b* of the metallic material sheet M are etched. This allows portions of the metallic material sheet M which correspond to opening parts where the resist films 340 and 341 are formed to be etched, and to form the fluid flow path grooves 39, the communicating opening parts 39*b*, the fluid flow path grooves 40, the communicating opening parts 40*b* and the vapor flow path grooves 42. As an etchant, for example, an iron chloride-based etchant such as an aqueous ferric chloride solution, or a copper chloride-based etchant such as an aqueous copper chloride solution may be used.

Here, as described above, the openings of the resist films 340 and 341 which correspond to the fluid flow path grooves 39, the communicating opening parts 39*b*, the fluid flow path grooves 40 and the communicating opening parts 40*b* are formed to have a width less than the width of each of the grooves, thereby the amount of the etchant entering these openings is reduced to decrease the etching rate in these portions. Therefore, the depths of these fluid flow path grooves 39, the communicating opening parts 39*b*, the fluid flow path grooves 40 and the communicating opening parts 40*b* may be made to be shallow.

The openings of the resist films 340 and 341 which correspond to the vapor flow path grooves 42 are formed to have the same width as the vapor flow path grooves 42 on the first face 30*a* and the second face 30*b*, thereby the amount of the etchant entering these openings is secured, which makes it possible to secure the depth of the etching for forming the vapor flow path grooves 42 (as a result, the vapor flow path grooves 42 penetrate in the thickness direction).

A portion where no grooves penetrate in the thickness direction like, for example, the linking part 44*c* shown in FIG. 6, and any other means for holding the inner side fluid flow path parts 38 can be formed by adjusting the width of the resist films to suppress the depth of such a portion, or disposing an opening only in one of the resist films, which are disposed on both faces of the metallic material sheet M.

After the etching step, as shown in FIG. 63, as a resist removing step, the resist films 340 and 341 are removed.

In this way, the third sheet 30 can be obtained.

As a preparation step of the first sheet 310, a sheet formed by laminating the reinforcing sheet 312 on the inner sheet 311 is prepared. As a preparation step of the second sheet 320, a sheet formed by laminating the reinforcement sheet 322 on the inner sheet 321 is prepared. Each of the preparation steps is carried out in a particularly nonlimited way. A sheet manufactured as a clad material may be used.

As another method, the inner sheets 311 and 312 may be formed by plating the reinforcing sheets 311 and 322, which are formed of a rolled material. In this case, an adhesion layer for improving adhesiveness of both of the sheets may be interposed between the reinforcing sheet 312 and the inner sheet 311, and between the reinforcing sheet 322 and the inner sheet 321. Examples of the adhesion layer include a strike plating layer and a seed layer. For example, when the reinforcing sheets 312 and 322 are formed of stainless steel and the inner sheets 311 and 321 are formed of copper, a strike plating layer containing a material such as nickel or copper may be interposed, or a seed layer containing a material such as titanium and molybdenum may be interposed by sputtering. The strike plating layer or the seed layer has a thickness, for example, ranging between 10 nm and 1000 nm. Alternatively, the inner sheets 311 and 321 may be formed of a rolled material, and the reinforcing sheets 312 and 322 may be formed by plating. Further, one of a pair of the inner sheets 311 and 321 and a pair of the reinforcing sheets 312 and 322 may be formed by plating, and the other may be laminated and formed by further plating.

After prepared, the third sheet 30, the first sheet 310 and the second sheet 320 are tentatively fixed as being laminated, as a tentatively fixing step.

The tentative fixation is performed in a particularly non-limited fixing way, but may be performed by resistance welding. In this case, resistance welding may be performed spot-wise using an unshown electrode rod. Laser welding may be performed instead of resistance welding.

After the tentatively fixing step, as shown in FIG. 64, the first sheet 310, the second sheet 320 and the third sheet 30 are permanently bonded by diffusion bonding, as a bonding step. Diffusion bonding is a method of adhering the first sheet 310 and the third sheet 30 to be bonded, adhering the third sheet 30 and the second sheet 320 to be bonded, pressuring and heating the sheets in a laminating direction in a controlled atmosphere such as a vacuum or an inert gas, and bonding the sheets using diffusion of atoms generated on the bonding faces. In diffusion bonding, the materials constituting each sheet are heated to temperature that is almost the melting points but lower than the melting points, which makes it possible for each sheet to avoid melting and deformation.

After the bonding step, a working fluid is sealed in the hollow part via the inlet, as a sealing step. After the working fluid is poured, the inlet flow paths are sealed. For example, the inlet flow paths may be sealed by irradiating the inlet with a laser to partially melt the inlet. This causes a space where the working fluid is sealed in to be shut off from the outside. For sealing the inlet flow paths, the inlet may be caulked (may be pressed to plastically deform) or may be brazed.

As described above, the vapor chamber 301 is obtained. In this example, each of the sheets are laminated after the first sheet and the second sheet are plated. The present invention is not limited to this. Each of the sheets may be laminated and thereafter plated. This leads to formation of plated layers also on the side faces.

[Operation of Vapor Chamber]

The operating process of the vapor chamber 301 concerning cooling of a heat source is the same as in the above-described embodiments, and thus the description thereof is omitted here.

There is a case where an electronic device where the vapor chamber 301 is installed is placed under an environment of a lower temperature than the freezing point of a working fluid. In this case, the working fluid freezes, and expands due to freezing according to the type of the working fluid. For example, if being pure water, the working fluid may freeze and expand under an environment of below-zero temperatures. This expansion may apply force to a portion where the working fluid collects in the direction such that the vapor chamber 301 is enlarged in the thickness direction.

Against this, in the vapor chamber 301, the first sheet 310 is provided with the reinforcing sheet 312 and the second sheet 320 is provided with the reinforcing sheet 322, so that the first sheet 310 and the second sheet 320 are each reinforced. Therefore, deformation can be suppressed even if force due to freezing and expansion of the working fluid is applied. This can suppress deterioration of flatness of a contact face of a portion receiving heat from a heat source with the heat source, and a contact face of a portion where the heat is released to the outside with some member (e.g., the housing), to suppress formation of gaps. In this case, prevention of thermal conduction from the heat source to the vapor chamber 301, and prevention of thermal conduction from the vapor chamber 301 to the outside can be suppressed.

The reinforcing sheet 312 having a thickness more than the inner sheet 311 and the reinforcing sheet 322 having a thickness more than the inner sheet 321 make it possible for the reinforcing sheets 312 and 322 to further reinforce the inner sheets 311 and 321, to further suppress deformation of the vapor chamber 301.

4.2. Embodiment 4b

Next, Embodiment 4b will be described. FIG. 65 explanatorily shows a vapor chamber 301'. FIG. 66 explanatorily shows a vapor chamber 301''. Both the drawings are cross-sectional views corresponding to FIG. 64.

In the vapor chamber 301' shown in FIG. 65, the third sheet 30 is not disposed but a first sheet 310' and a second sheet 320' are directly laminated. In other words, the vapor chamber 301' is formed by superposing and bonding an inner sheet 311' of the first sheet 310' and an inner sheet 321' of the second sheet 320'.

In the present embodiment, grooves are formed on faces to be superposed on the inner sheet 311' and the inner sheet 321', to form the condensate flow paths 3 and the vapor flow paths 4. The concepts of the forms of the condensate flow paths 3 and the vapor flow paths 4 are the same as described above.

Such an embodiment also brings about the effect same as the foregoing since the reinforcing sheets 312 and 322 are included.

In the vapor chamber 301'' shown in FIG. 66, the third sheet 30 is not disposed either but a first sheet 310'' and a second sheet 320'' are directly laminated. In other words, the vapor chamber 301'' is formed by superposing and bonding an inner sheet 311'' of the first sheet 310'' and an inner sheet 321'' of the second sheet 320''.

This embodiment shows an example of each of the condensate flow paths 3 and each of the vapor flow paths 4 included in the same flow path, but is not such that the condensate flow paths 3 are included between the adjacent vapor flow paths 4. Therefore, in this embodiment, capillary structure member 339 is disposed in the same flow path as the flow path to be each of the vapor flow paths 4. These capillary structure members 339 are formed as a capillary structure (wick) through which a working fluid liquifying flows. The capillary structural members 339 may be made of, for example, a metal mesh, a metal powder, metal stranded wire, or the like.

Such an embodiment also brings about the effect same as the foregoing since the reinforcing sheets 312 and 322 are included.

5. Embodiment 5

A vapor chamber 401 according to Embodiment 5 is such an example that a first sheet 410 and a second sheet 420 are applied instead of the first sheet 310 and the second sheet 320 included in the vapor chamber 301 described in Embodiment 4. Further, this first sheet 410 is different from the first sheet 310 in that a barrier sheet 413 is disposed between the inner sheet 311 and the reinforcing sheet 312 described concerning the first sheet 310. The second sheet 420 is different from the second sheet 320 in that a barrier sheet 423 is disposed between the inner sheet 321 and the reinforcing sheet 322 described concerning the first sheet 320.

Accordingly, the vapor chamber 401 except for the barrier sheet 413 or 423 may be considered the same as the vapor chamber 301 of Embodiment 4. Here, the barrier sheets 413 and 423 will be described.

The barrier sheets 413 and 423 are made from a particularly nonlimited barrier material as long as this material is capable of preventing the metal element(s) constituting the reinforcing sheets 312 and 322 from being transmitted by the inner sheets 311 and 321. Such a barrier material may contain, for example, at least one of tungsten (W), titanium (Ti), tantalum (Ta) and molybdenum (Mo). The barrier material may be constituted of only one of tungsten, titanium, tantalum and molybdenum. In this case, the barrier sheets 413 and 423 are formed as single phase films. Alternatively, the barrier material may be constituted of at least any two materials of tungsten, titanium, tantalum and molybdenum in combination. In this case, the barrier sheets 413 and 423 are formed as alloy films. Examples of such alloy films include alloy films of tungsten and titanium. The barrier material may be any combination of the above four metal elements and any metal element other than the four. Examples of an alloy film in this case include alloy films of nickel and tungsten.

The barrier sheets 413 and 423 each have any thickness as long as capable of showing a barrier function. The barrier sheets 413 and 423 each have, for example, a thickness ranging between 10 nm and 1000 nm. The barrier sheets 413 and 423 each having a thickness at least 10 nm can effectively prevent the metal elements constituting the reinforcing sheets 312 and 322 from being transmitted. The barrier sheets 413 and 423 each having a thickness at most 1000 nm can lead to easy production by sputtering, and can suppress the vapor chamber 401 having a more thickness. Further, the barrier sheets 413 and 423 each having a thickness at most 1000 nm can suppress prevention of thermal conduction. In view of bringing about the barrier function more effectively, the barrier sheets each preferably have a thickness at least 100 nm.

Here, a method of confirming the components of the barrier sheets 413 and 423 will be described. First, the presence or absence of the barrier sheets 413 and 423 may be confirmed on, for example, an image obtained by imaging a cross section obtained by cutting the vapor chamber 401 at some position, with SEM (scanning electron microscope). The components of the barrier sheets 413, 423 may be analyzed by, for example, scraping off a lower face of the vapor chamber 401 a little, analyzing scraped components by means of energy dispersive X-ray analysis (EDX), and further scraping off to analyze the components. The analysis of the components is repeated in this manner, which makes it possible to confirm the components of the barrier sheets 413 and 423.

An adhesion layer for improving adhesiveness of both of the sheets may be interposed between the barrier sheet 413 and the inner sheet 311, and between the barrier sheet 423 and the inner sheet 321. When formed, first, the adhesion layers are formed on faces of the barrier sheets 413 and 423, thereafter the inner sheets 311 and 321 are formed on faces of the adhesion layers. Examples of the adhesion layers include strike plating layers and seed layers. For example, when the barrier sheets 413 and 423 are formed of a material containing molybdenum and the inner sheets 311 and 321 are formed of copper, a seed layer containing a copper material may be interposed by spattering using a sputtering target material containing copper. The strike plating layer or the seed layer may have a thickness, for example, ranging between 50 nm and 500 nm. Alternatively, the barrier sheets 413 and 423 may be formed of a rolled material, and the reinforcing sheets 312 and 322 may be formed by plating. Further, one of a pair of the barrier sheets 413 and 423 and a pair of the reinforcing sheets 312 and 322 may be formed by plating, and the other may be laminated and formed by further plating.

The vapor chamber 401 as described above can suppress diffusion of the metal material(s) constituting the reinforcing sheets into the inner sheets, in addition to the effect same as the vapor chamber 301 described in Embodiment 4.

6. Embodiment 6

In Embodiment 6, the shape of the fluid flow path grooves of the third sheet is different from that in the vapor chambers according to Embodiments 1 to 5. The other portions may be considered the same as in these embodiments 1 to 5. Thus, here, the inner side fluid flow path parts will be focused on and described, and the description of the other portions will be omitted. The same shape is also applicable to the peripheral fluid flow path part.

For convenience, the reference signs in Embodiment 1 are added to the portions common to Embodiments 1 to 5. The forms in Embodiments 2 to 5 may be applied to these common portions.

6.1. Embodiment 6a

FIG. 68 shows an inner side fluid flow path part 538 of a vapor chamber 501 according to the present embodiment viewed in the direction z from the same viewpoint as FIG. 14. As can be seen from FIG. 68, the inner side fluid flow path part 538 has a fluid flow path groove 551 extending in the direction x, and fluid flow path protrusions 552 that are respective pairs of protrusions adjacent to each other across the fluid flow path groove 551. The fluid flow path groove 551 is formed mainly to transport a working fluid in the liquifying state.

Each pair of the fluid flow path protrusions 552 is constituted of a first fluid flow path protrusion 552A disposed on one side (the direction y side in the drawing) with respect to the fluid flow path groove 551, and a second fluid flow path protrusion 552B disposed on the opposite side of the one side (the opposite side of the direction y in the drawing) with respect to the fluid flow path groove 551. A plurality of the first fluid flow path protrusions 552A are aligned in the first direction (the direction x in the drawing) to constitute a first fluid flow path protrusion column 553A. Similarly, a plurality of the second fluid flow path protrusions 552B are aligned in the first direction (the direction x in the drawing) to constitute a second fluid flow path protrusion column 553B.

First communicating grooves 554A are formed between the respective plural first fluid flow path protrusions 552A aligned in the first direction (the direction x in the drawing). Similarly, second communicating grooves 554B are formed between the respective plural second fluid flow path protrusions 552B aligned in the first direction (the direction x in the drawing). The first communicating grooves 554A and the second communicating grooves 554B are each linked to the fluid flow path groove 551.

The working fluid condensing to liquefy on the surfaces of the vapor flow path grooves 42 (vapor flow paths 4), which has lost its heat when in the vapor state, enters the first communication grooves 554A and the second communication grooves 554B from the surfaces of the vapor flow path grooves 42 (vapor flow paths 4) by the capillary action, and further enters the fluid flow path grooves 551 (condensate flow path 3) by the capillary action.

In the example shown in FIG. 68, a plurality of the first fluid flow path protrusions 552A constituting the first fluid flow path protrusion column 553A are aligned in the first direction (direction x) at regular pitches $P_{501}$. Similarly, a plurality of the second fluid flow path protrusions 552B constituting the second fluid flow path protrusion column 553B are also aligned in the first direction (direction x) at regular pitches $P_{501}$.

Such alignment at regular pitches makes it unnecessary to complicate designs of the first fluid flow path protrusion column 553A and the second fluid flow path protrusion column 553B. It can be also expected that the operations of pairs of the fluid flow path protrusions 552 are equalized. For example, it can be expected to equalize easiness of entry of the working fluid in the liquifying state from each of a plurality of the first communicating grooves 554A and the second communicating grooves 554B into the fluid flow path groove 551.

It is noted that a plurality of the first fluid flow path protrusions 552A and a plurality of the second fluid flow path protrusions 552B do not always have to be aligned at regular pitches.

In the example shown in FIG. 68, the first fluid flow path protrusion 552A constituting each pair of the fluid flow path protrusions 552 and the second fluid flow path protrusion 552B adjacent thereto across the fluid flow path groove 551 are formed to have line symmetry with respect to the fluid flow path groove 551.

Such line symmetry makes it unnecessary to complicate designs of the first fluid flow path protrusion column 553A and the second fluid flow path protrusion column 553B. It can be also expected that the operations of pairs of the fluid flow path protrusions 552 are equalized. For example, it can be expected to equalize easiness of entry of the working fluid in the liquifying state from each of a plurality of the first communicating grooves 554A and the second communicating grooves 554B into the fluid flow path groove 551.

It is noted that in the present embodiment, the first fluid flow path protrusions 552A and the second fluid flow path protrusions 552B adjacent thereto across the fluid flow path groove 551 do not always have to be formed to have line symmetry with respect to the fluid flow path groove 551.

The first fluid flow path protrusions 552A extend in a direction inclining with respect to the first direction as if directed from one side with respect to the fluid flow path groove 551 (direction y side in the drawing) toward the fluid flow path groove 551 to be directed in the first direction (direction x in the drawing). The second fluid flow path protrusions 552B extend in a direction inclining with respect to the first direction as if directed from the opposite side of the one side with respect to the fluid flow path groove 551 (opposite side of the direction y in the drawing) toward the fluid flow path groove 551 to be directed in the first direction. Further, the distance between the first fluid flow path protrusion 552A and the second fluid flow path protrusion 552B which constitute a pair of the fluid flow path protrusions 552 on the first direction side is shorter than that on the opposite side of the first direction side.

The form of the first fluid flow path protrusions 552A and the second fluid flow path protrusions 552B and the operations thereof will be described in more detail using FIGS. 69 and 70.

First, the form of the first fluid flow path protrusions 552A and the second fluid flow path protrusions 552B will be described. FIG. 69 explanatorily shows a form of pairs of the fluid flow path protrusions 552 shown in FIG. 68. In the example shown in FIG. 69, the first fluid flow path protrusions 552A each have a planar shape of a parallelogram having four corners of P1, Q1, R1 and S1. The side connecting P1 and Q1 forms an angle θ1 with the first direction (direction x). The angle θ1 may range between more than 0° and less than 90°, preferably between 30° and 60°.

As described above, the first fluid flow path protrusions 552A have a form of extending in a direction inclining with respect to the first direction as if directed from one side with respect to the fluid flow path groove 551 (direction y side in the drawing) toward the fluid flow path groove 551 to be directed in the first direction (direction x). Therefore, the first communicating grooves 554A (portions surrounded by the broken lines in the drawing), which are formed between the first fluid flow path protrusions 552A aligned in the first direction (direction x), also have a form of extending in a direction inclining with respect to the first direction as if directed from one side with respect to the fluid flow path groove 551 (direction y side) toward the fluid flow path groove 551 to be directed in the first direction (direction x).

Similarly, the second fluid flow path protrusions 552B each have a planar shape of a parallelogram having four corners of P2, Q2, R2 and S2. The side connecting P2 and Q2 forms an angle θ2 with the first direction (direction x). The angle θ2 may also range between more than 0° and less than 90°, preferably between 30° and 60°.

As described above, the second fluid flow path protrusions 552B have a form of extending in a direction inclining with respect to the first direction as if directed from the opposite side of the one side with respect to the fluid flow path groove 551 (opposite side of the direction y) toward the fluid flow path groove 551 to be directed in the first direction. Therefore, the second communicating grooves 554B (portions surrounded by the broken lines in the drawing), which are formed between the second fluid flow path protrusions 552B aligned in the first direction (direction x), also have a form of extending in a direction inclining with respect to the first direction as if directed from the opposite side of the one side with respect to the fluid flow path groove 551 (opposite side of the direction y) toward the fluid flow path groove 551 to be directed in the first direction (direction x).

Here, as well as in FIG. 68, in the example shown in FIG. 69, the first fluid flow path protrusions 552A constituting pairs of the fluid flow path protrusions 552 and the second fluid flow path protrusions 552B adjacent thereto across the main flow groove 551 are formed to have line symmetry with respect to the fluid flow path groove 551. In this case, the angle θ1 is equal to the angle θ2. Also in this case, the first communicating grooves 554A and the second communicating grooves 554B also have line symmetry with respect to the fluid flow path groove 551.

Such line symmetry makes it unnecessary to complicate designs of the first fluid flow path protrusion column 553A and the second fluid flow path protrusion column 553B. It can be also expected that the operations of pairs of the fluid flow path protrusions 552 are equalized. For example, it can be expected to equalize easiness of entry of the working fluid in the liquifying state from each of a plurality of the first communicating grooves 554A and the second communicating grooves 554B into the fluid flow path groove 551.

It is noted that in the present embodiment, the first fluid flow path protrusions 552A and the second fluid flow path protrusions 552B constituting pairs of the fluid flow path protrusions 552 do not always have to be formed to have line symmetry with respect to the fluid flow path groove 551. The first fluid flow path protrusions 552A and the second fluid flow path protrusions 552B not formed to have line symmetry can bring about, for example, the following effects.

For example, if a vapor of a working fluid flows or is generated in an area held between any pair of the fluid flow path protrusions 552, it is necessary to prevent this vapor from entering an evaporating part (portion close to a heat source). Here, in the present embodiment, even if the vapor of the working fluid is aimed to move in the first direction (direction x), the first fluid flow path protrusion 552A and the second fluid flow path protrusion 552B block the vapor to decrease the momentum in the first direction, even when the first fluid flow path protrusion 552A and the second fluid flow path protrusion 552B constituting the pair of the fluid flow path protrusions 552 are not formed to have line symmetry with respect to the fluid flow path groove 551, which makes it possible to prevent the vapor from moving to the evaporating part. The operations of the first fluid flow path protrusions 552A and the second fluid flow path protrusions 552B will be described in more detail in the description using FIG. 70 described later.

Further, in the vapor chamber 501 according to the present embodiment, the distance between the first fluid flow path protrusion 552A and the second fluid flow path protrusion 552B which constitute a pair of the fluid flow path protrusions 552 on the first direction side is shorter than that on the opposite side of the first direction side. For example, as shown in FIG. 69, a distance $D_1$ between the ends of a pair of the first fluid flow path protrusion 552A (parallelogram having the four corners of P1, Q1, R1 and S1) and the second fluid flow path protrusion 552B (parallelogram having the four corners of P2, Q2, R2 and S2) on the first direction (direction x) side (distance between S1 and S2) is shorter than a distance D2 between the ends thereof on the opposite side of the first direction (direction x) side (distance between R1 and R2).

Next, the operations of the first fluid flow path protrusions 552A and the second fluid flow path protrusions 552B having the above described form will be described. FIG. 70 explanatorily shows the operation of pairs of the fluid flow path protrusions 552 shown in FIG. 69, which mainly shows the flows of a working fluid in the liquifying state and the flows of the working fluid in the vapor state in this embodiment. Here, in FIG. 70, the flows of the working fluid in the liquifying state are shown by the thick solid arrows, and the flows of the working fluid in the vapor state are shown by the thick broken arrows.

First, the flows of the working fluid in the liquifying state shown in FIG. 70 will be described.

The first fluid flow path protrusions 552A and the second fluid flow path protrusions 552B constituting pairs of the fluid flow path protrusions 552 have a form of extending in a direction inclining with respect to the first direction as described using FIG. 69, and have such a form that the distance between the first fluid flow path protrusion 552A and the second fluid flow path protrusion 552B on the first direction side is shorter than that on the opposite side of the first direction side.

Therefore, in FIG. 70, as shown by the thick solid arrows, the working fluid in the liquifying state present in the area held between the first fluid flow path protrusion 552A and the second fluid flow path protrusion 552B constituting a pair of the fluid flow path protrusions 552 moves from a side where the distance between the first fluid flow path protrusion 552A and the second fluid flow path protrusion 552B is longer to a side where the distance between the first fluid flow path protrusion 552A and the second fluid flow path protrusion 552B is shorter by the capillary action.

In other words, according to the present embodiment, a stronger driving force can be applied to the working fluid in the liquifying state present in the area held between the first fluid flow path protrusion 552A and the second fluid flow path protrusion 552B constituting a pair of the fluid flow path protrusions 552, to be transported in the first direction (direction x).

In the present embodiment, the area held between any pair of the fluid flow path protrusions 552 on the side where the distance between the first fluid flow path protrusion 552A and the second fluid flow path protrusion 552B is longer can have a depth more than that on the side where the distance between the first fluid flow path protrusion 552A and the second fluid flow path protrusion 552B is shorter.

Such a form is capable of storing a more working fluid in the liquifying state in this area. Then, as described above, the working fluid in the liquifying state present in this area can be transported in the first direction (direction x) (that is, toward the evaporating part V) with stronger driving force. Therefore, it is possible to prevent the working fluid in the liquifying state from being lacked in the evaporating part (portion 4 close to an object to be cooled).

A form as described above causes the depth on the side where the distance between the first fluid flow path protrusion 552A and the second fluid flow path protrusion 552B is shorter to be shallower, that is, causes the cross-sectional area of the flow paths on the side where the distance between the first fluid flow path protrusion 552A and the second fluid flow path protrusion 552B is shorter to be smaller than that on the side where the distance between the first fluid flow path protrusion 552A and the second fluid flow path protrusion 552B is longer. As a result, the capillary action works more strongly. Therefore, the working fluid in the liquifying state in the fluid flow path groove 551 is given a stronger driving force, which makes it possible for the working fluid in the liquefying state to be transported in the first direction (direction x) via the fluid flow path groove 551 (condensate flow paths 3) of the inner side fluid flow path parts 538.

The working fluid in the liquifying state which has passed through the ends on the side where the distance between the first fluid flow path protrusion 552A and the second fluid flow path protrusion 552B is shorter diffuses in the area held between the successive pair of the fluid flow path protrusions 552. The pressure of this diffusion, and the capacity of the working fluid in the liquifying state present in the area held between a pair of the fluid flow path protrusions 552 make it possible to more effectively prevent the vapor of the working fluid from entering the fluid flow path groove 551 (condensed flow path 3) from the first communicating grooves 554A and the second communicating grooves 554B.

The above described form may be obtained by, for example, forming the fluid flow path parts 50 by half etching using an etchant. In half etching using an etchant, a depth obtained by etching tends to be deeper when an area to be etched is larger than when an area to be etched is smaller.

Therefore, for example, an etching pattern used for forming the inner side fluid flow path parts 538 is such that an area in an area between each pair of the fluid flow path protrusions 552 on the side where the distance between the first fluid flow path protrusion 552A and the second fluid flow path protrusion 552B is longer (the above descried D2 side) is larger than that on the side where the distance between the first fluid flow path protrusion 552A and the second fluid flow path protrusion 552B is shorter (the above descried $D_1$ side). This makes it possible for the depth in the area held between each pair of the fluid flow path protrusions 552 formed by half etching using an etchant on the side where the distance between the first fluid flow path protrusion 552A and the second fluid flow path protrusion 552B is longer (the above descried D2 side) to be deeper than that on the side where the distance between the first fluid flow path protrusion 552A and the second fluid flow path protrusion 552B is shorter (the above descried $D_1$ side).

Next, the flow of the working fluid in the vapor state will be described.

As described using FIG. 69, the first fluid flow path protrusions 552A and the second fluid flow path protrusions 552B, and the first communication grooves 554A and the second communication grooves 554B have a form of extending in a direction inclining with respect to the first direction. Therefore, it is difficult for the vapor of the working fluid passing through the vapor flow path grooves 42 (vapor flow paths 4) and diffusing in the direction opposite to the first direction (direction x) (shown by the broken arrows in the drawing) to pass through the first communicating grooves 554A and the second communicating grooves 554B, which are directed in a substantially opposite direction of this diffusing direction, to enter the fluid flow path grooves 551 (condensate flow paths 3).

That is, as shown in FIG. 68, since the evaporating part (portion close to an object to be cooled) 4 is located on the upper side (direction x side) in FIG. 70, the pressure of the vapor is higher on the upper side (direction x side) and is lower on the lower side (opposite side of the direction x) in FIG. 70. Therefore, it is difficult for the vapor of the working fluid to diffuse from the lower side (opposite side of the direction x), where the pressure is lower, to the upper side (direction x), where the pressure is higher. That is, it is difficult for the vapor of the working fluid to flow in the first communicating grooves 554A and the second communicating grooves 554B from the lower side (opposite side of the direction x) to the upper side (direction x).

Further, as described above, the working fluid in the liquifying state having passed through the ends on the side where the distance between the first fluid flow path protrusion 552A and the second fluid flow path protrusion 552B is shorter diffuses in the area held between the successive pair of the fluid flow path protrusions 552. Therefore, the pressure of this diffusion, and the capacity of the working fluid in the liquifying state present in the area held between a pair of the fluid flow path protrusions 552 make it possible to more effectively prevent the vapor of the working fluid from entering the fluid flow path groove 551 (condensed flow path 3) from the first communicating grooves 554A and the second communicating grooves 554B.

Therefore, the vapor chamber 501 according to the present embodiment can effectively prevent the working fluid in the vapor state from entering the fluid flow path groove 551 (condensate flow path 3) from the first communicating grooves 554A and the second communicating grooves 554B, to improve the transport function of the working fluid in the liquifying state, and to improve heat transport efficiency.

Further, the pressure of the vapor immediately after (at the time of the instance of) the inflow of the vapor of the working fluid into the fluid flow path groove 551 (condensate flow path 3) or bumping of the working fluid in the liquifying state (i.e., generation of a vapor) is higher on the side where the distance between the first fluid flow path protrusion 552A and the second fluid flow path protrusion 552B of a pair of the fluid flow path protrusions 552 is shorter, and is lower on the other sides (side where the distance between the first fluid flow path protrusion 552A and the second fluid flow path protrusion 552B is longer, the first communicating grooves 554A side, and the second communicating groove 554B side).

Therefore, it is easy for the vapor flowing into or generated in the area held between a pair of the fluid flow path protrusions 552 to move to the other sides (side where distance between the first fluid flow path protrusion 552A and the second fluid flow path protrusion 552B of this pair of the fluid flow path protrusion 552 is longer, the first communicating grooves 554A side, and the second communicating groove 554B side) than to the side where the distance between the first fluid flow path protrusion 552A and the second fluid flow path protrusion 552B thereof is shorter. That is, it is difficult for the vapor flowing into or generated in the area held between a pair of the fluid flow path protrusions 552 to move in the fluid flow path groove 551 (condensate flow path 3) in the first direction (direction x).

Therefore, the vapor chamber 501 according to the present embodiment can effectively prevent the vapor flowing into or generated in the fluid flow path groove 551 (condensate flow path 3) in active evaporation from moving in the fluid flow path groove 551 (condensate flow path 3) in the first direction (direction x), to improve the transport function of the working fluid in the liquifying state, and to improve heat transport efficiency.

As described above, it is easy for the vapor flowing into or generated in the area held between a pair of the fluid flow path protrusions 552 to move to the other sides (side where the distance between the first fluid flow path protrusion 552A and the second fluid flow path protrusion 552B of this pair of the fluid flow path protrusions 552 is longer, the first communicating grooves 554A side, and the second communicating groove 554B side) than the side where the distance between the first fluid flow path protrusion 552A and the second fluid flow path protrusion 552B thereof is shorter.

Here, because the pressure on the side where the distance between the first fluid flow path protrusion 552A and the second fluid flow path protrusion 552B of a pair of the fluid flow path protrusions 552 which is located on the side opposite to the first direction (direction x) with respect to a pair of the fluid flow path protrusions 552 where the vapor flows or is generated is shorter is higher, it is difficult for the vapor to pass through such a place of a higher pressure to flow in the pair of the fluid flow path protrusions 552 located on the opposite side of the first direction (direction x).

Therefore, the vapor is discharged to the vapor flow path grooves 42 (vapor flow paths 4) through the first communicating grooves 554A and the second communicating grooves 554B. Here, the width of each of the first communicating grooves 554A and the second communicating grooves 554B is designed more than the distance between the first fluid flow path protrusions 552A and the second fluid flow path protrusions 552B of pairs of the fluid flow path protrusions 552, which can promote the effect of the above described vapor discharge more.

Next, the planar shape of the first fluid flow path protrusions 552A and the second fluid flow path protrusions 552B (corners in particular) will be described in detail using FIG.

71. As described later, the inner side fluid flow path parts 538 are formed by half etching a metallic material sheet using an etchant. Therefore, the planar shape of each of the first fluid flow path protrusions 552A and the second fluid flow path protrusions 552B constituting pairs of the fluid flow path protrusions 552 are not strict parallelograms, but in the form of round corners.

For example, as shown in FIG. 71, the steep corners of the parallelogram formed of the four corners of P1, Q1, R1 and S1 (parallelogram shown by the solid line in FIG. 71) are rounded, so that the first fluid flow path protrusions 552A each have a form having curved parts 555 and 556 as shown by the broken lines. However, as long as a side 557 in the direction of the line connecting P1 and Q1 and a side 558 in the direction of the line connecting S1 and R1 remain, the above described various effects in the vapor chamber 501 according to the present embodiment can be achieved. The same applies to the second fluid flow path protrusions 552B.

6.2. Embodiment 6b

Next, a vapor chamber according to Embodiment 6b will be described using FIG. 72. The vapor chamber according to Embodiment 6b is different from the vapor chamber according to Embodiment 6a in the form of the inner side fluid flow path parts, and the structure thereof excluding the foregoing may be the same as that of the vapor chamber according to Embodiment 6a.

FIG. 72 shows an example of an inner side fluid flow path part 538' of a vapor chamber 501' according to Embodiment 6b. More particularly, FIG. 72 corresponds to FIG. 69 in the vapor chamber 501'.

The fluid flow path parts of the vapor chamber according to the present embodiment have a plurality of fluid flow path grooves each extending in the first direction where a working fluid in the liquifying state passes through, and a plurality of protrusion columns each holding the fluid flow path grooves and extending in the first direction. A plurality of the fluid flow path grooves include one fluid flow path groove for reference. Each of the protrusion columns includes a plurality of fluid flow path protrusions aligned in the first direction across a plurality of communicating grooves. A plurality of the communicating grooves include first communicating grooves disposed on one side with respect to the main flow groove for reference, and second communicating grooves disposed on the other side with respect to the main flow groove for reference. The first communicating grooves extend in a direction inclining with respect to the first direction as if directed toward the main flow groove for reference to be directed in the first direction. The second communicating grooves extend in a direction inclining with respect to the first direction as if directed toward the fluid flow path groove for reference to be directed in the first direction.

The first communicating grooves are aligned in the extending direction thereof. The second communicating grooves are aligned in the extending direction thereof.

For example, as shown in FIG. 72, the inner side fluid flow path part 538' of the vapor chamber 501' has three fluid flow path grooves (551', 551'A and 551'B) including one fluid flow path groove 551' for reference. The fluid flow path grooves each extend in the first direction (direction x).

The inner side fluid flow path part 538' of the vapor chamber 501' has four protrusion columns (553'A, 553'B, 553'C and 553'D) extending in the first direction. Among the four protrusion columns (553'A, 553'B, 553'C and 553'D), protrusion columns on one side with respect to the fluid flow path groove 551 for reference (direction y side in the drawing) are first protrusion columns (553'A and 553'B), and protrusion columns on the other side with respect to the fluid flow path groove 551 for reference (direction y side in the drawing) are second protrusion columns (553'D and 553'C).

To put the foregoing more plainly, in the example shown in FIG. 72, the first protrusion column 553'A, the fluid flow path groove 551'A, the first protrusion column 553'B, the main flow groove for reference 551', the second protrusion column 553'D, the fluid flow path groove 551'B and the second protrusion column 553'C are arranged in order from the direction y side in the drawing.

The first protrusion column 553'A includes a plurality of fluid flow path protrusions 552'A aligned in the first direction (direction x) across a plurality of first communicating grooves 554'A. Similarly, the first protrusion column 553'B includes a plurality of fluid flow path protrusions 552'B aligned in the first direction across a plurality of first communicating grooves 554'B. The second protrusion column 553'D includes a plurality of fluid flow path protrusions 552'D aligned in the first direction across a plurality of second communicating grooves 554'D. The second protrusion column 553'C includes a plurality of fluid flow path protrusions 552'C aligned in the first direction across a plurality of second communicating grooves 554'C.

The first communicating grooves 554'A and 554'B each extend in a direction inclining with respect to the first direction as if directed from the one side (direction y side) with respect to the fluid flow path groove 551' for reference toward the fluid flow path groove 551' for reference to be directed in the first direction (direction x).

In the example shown in FIG. 72, an angle formed by the extending direction of the first communicating grooves 554'A and 554'B (direction shown by the thick broken arrow in the drawing) and the first direction (direction x) (angle on the acute angle side) is defined as an angle θ3. The angle θ3 may range between more than 0° and less than 90°, preferably between 30° and 60°.

The second communicating grooves 554'D and 554'C each extend in a direction inclining with respect to the first direction as if directed from the other side with respect to the fluid flow path groove 551' for reference (opposite side of the direction y) toward the fluid flow path groove 551' for reference to be directed in the first direction (direction x).

In the example shown in FIG. 72, an angle formed by the extending direction of the second communicating grooves 554'D and 554'C (direction shown by the thick broken arrow in the drawing) and the first direction (direction x) (angle on the acute angle side) is defined as an angle θ4. The angle θ4 may range between more than 0° and less than 90°, preferably between 30° and 60°.

The first communicating grooves 554'A and 554'B are each aligned in the extending direction thereof. The second communicating grooves 554'D and 554'C are each aligned in the extending direction thereof.

For example, as shown in FIG. 72, the first communicating grooves 554'A and 554'B are arranged in the extending direction of the first communicating grooves, i.e., in a direction forming the angle θ3 with the first direction (direction x) (direction shown by the thick broken arrow in the drawing), and the second communicating grooves 554'C and 554'D are arranged in the extending direction of the second communicating grooves, i.e., in a direction forming the angle θ4 with the first direction (direction x) (direction shown by the thick broken arrow in the drawing).

Such arrangement makes it unnecessary to complicate designs of a plurality of the first communicating grooves and the second communicating grooves. It can be also expected that the operations of the communicating grooves are equalized. For example, it can be expected to equalize easiness of entry of a working fluid in the liquifying state from each of a plurality of the first communicating grooves and the second communicating grooves into the fluid flow path grooves (condensate flow paths).

As described above, the vapor chamber 501' has a plurality of the fluid flow path grooves (551', 551'A and 551'B), and a plurality of the protrusion columns (553'A, 553'B, 555'C and 553'D) each holding the fluid flow path grooves and extending in the first direction, which can lead to the inner side fluid flow path part 538' of the vapor chamber 501' having a more complicated uneven structure, to enlarge the surface area of the inner side fluid flow path part 538' more. Therefore, the heat transport amount of the working fluid by the capillary action can be increased more, to improve transport efficiency more.

The first communicating grooves 554'A and the second communicating grooves 554'C of the vapor chamber 501' have a form of extending in a direction inclining with respect to the first direction. Therefore, as well as the vapor chamber 501 according to Embodiment 6a, such an effect can be expected that it is difficult for the working fluid in the vapor state passing through the vapor flow paths 4 and diffusing in the direction opposite to the first direction (direction x) to pass through the first communicating grooves 554'A and the second communicating grooves 554'C, which are directed in a substantially opposite direction of this diffusing direction, to enter the fluid flow path grooves (condensate flow paths).

6.3. Embodiment 6c

Next, a vapor chamber according to Embodiment 6c will be described using FIG. 73.

As described above, the first communicating grooves 554'A and the second communicating grooves 554'C of the vapor chamber 501' according to Embodiment 6b have a form of extending in a direction inclining with respect to the first direction. Therefore, as well as the vapor chamber 501 according to Embodiment 6a, such an effect can be expected that it is difficult for the working fluid in the vapor state passing through the vapor flow path part and diffusing in the direction opposite to the first direction (direction x) to pass through the first communicating grooves 554'A and the second communicating grooves 554'C, which are directed in a substantially opposite direction of this diffusing direction, to enter the fluid flow path grooves.

In the vapor chamber 501', the distance between the fluid flow path protrusions adjacent to each other (D3) is constant (see FIG. 72) unlike the vapor chamber 501 according to Embodiment 6a. That is, the vapor chamber 501' shown in FIG. 72 does not take a form such that the distance between the first fluid flow path protrusion and the second fluid flow path protrusion constituting a pair of the fluid flow path protrusions on the first direction side is shorter than that on the opposite side of the first direction side, unlike the vapor chamber 501 according to Embodiment 6a.

More specifically, the vapor chamber 501 according to Embodiment 6a takes a form such that the distance between the first fluid flow path protrusion 552A and the second fluid flow path protrusion 552B on the first direction side (direction x side) (D$_1$) is shorter than that on the opposite side of the first direction side (D2), as shown in FIG. 69.

Such a form leads to the working fluid in the liquifying state having passed through the ends on the side where the distance between the first fluid flow path protrusion 552A and the second fluid flow path protrusion 552B is shorter diffusing in the area held between the successive pair of the fluid flow path protrusions 552. Such an effect is then predicted that the pressure of this diffusion, and the capacity of the working fluid in the liquifying state present in the area held between a pair of the fluid flow path protrusions 552 make it possible to more effectively prevent the working fluid in the vapor state from entering the fluid flow path groove 551 (condensed flow path 3) from the first communicating grooves 554A and the second communicating grooves 554B.

In contrast, in the vapor chamber 501' according to Embodiment 6b, the distance between the fluid flow path protrusions 552'B and the fluid flow path protrusions 552'D adjacent to each other (D3) is constant as shown in FIG. 72, and the distance therebetween on the first direction side (direction x side) is the same as that on the opposite side of the first direction side.

Therefore, the vapor chamber 501 is preferable as to the effect as the vapor chamber 501 according to Embodiment 6a has, i.e., the effect of more effective prevention of the working fluid in the vapor state from entering the fluid flow path groove 551' for reference (condensed flow path 3) from the first communicating grooves 554'B and the second communicating grooves 554'D.

Further, in the vapor chamber 501' shown in FIG. 72, the first communicating grooves 554'A and 554'B are each aligned in the extending direction thereof, and the second communicating grooves 554'D and 554'C are each aligned in the extending direction thereof.

For example, as shown in FIG. 72, the first communicating grooves 554'A and 554'B are arranged in the extending direction of the first communicating grooves, i.e., in a direction forming the angle θ3 with the first direction (direction x) (direction shown by the thick broken arrow in the drawing), and the second communicating grooves 554'C and 554'D are arranged in the extending direction of the second communicating grooves, i.e., in a direction forming the angle θ4 with the first direction (direction x) (direction shown by the thick broken arrow in the drawing).

Therefore, the working fluid in the vapor state entering from the first communicating grooves 554'A, which are on the outer side with respect to the fluid flow path groove 551' for reference, may also pass through the first communicating grooves 554'B on the inner side than the first communicating grooves 554'A, to easily enter the fluid flow path groove 551' for reference (condensate flow path 3) because there is no fluid flow path protrusion in the extending direction of the first communicating grooves. Similarly, the working fluid in the vapor state entering from the second communicating grooves 554'C, which are on the outer side with respect to the fluid flow path groove 551' for reference, may also pass through the second communicating grooves 554'D on the inner side than the second communicating grooves 554'C, to easily enter the fluid flow path groove 551' for reference (condensate flow path 3) because there is no fluid flow path protrusion in the extending direction of the second communicating grooves.

Then, the vapor chamber according to Embodiment 6c takes such a form that the fluid flow path protrusions are present in the extending direction of the communication grooves. The vapor chamber according to Embodiment 6c is different from the vapor chambers according to Embodiments 6a and 6b in the form of the inner side fluid flow path parts, and the structure thereof excluding the foregoing may be the same as that of the vapor chamber according to Embodiment 6a.

FIG. 73 shows an example of an inner side fluid flow path part 538" of a vapor chamber 501" according to Embodiment 6c. As shown in FIG. 73, the inner side fluid flow path part 538" of the vapor chamber 501" has three fluid flow path grooves (551", 551"A and 551"B) including one fluid flow path groove 551" for reference. The fluid flow path grooves each extend in the first direction (direction x).

The inner side fluid flow path parts 538" of the vapor chamber 501" has four protrusion columns (553"A, 553"B, 553"C. and 553"D) extending in the first direction. Among the four protrusion columns (553"A, 553"B, 553"C. and 553"D), protrusion columns on one side with respect to the fluid flow path groove 551" for reference (direction y side) are first protrusion columns (553"A and 553"B), and protrusion columns on the other side with respect to the fluid flow path groove 551" for reference (direction y side) are second protrusion columns (553"D and 553"C).

To put the foregoing more plainly, in the example shown in FIG. 73, the first protrusion column 553"A, the fluid flow path groove 551"A, the first protrusion column 553"B, the fluid flow path groove 551" for reference, the second protrusion column 553"D, the fluid flow path groove 551"B and the second protrusion column 553"C are arranged in order from the direction y side in the drawing.

The first protrusion column 553"A includes a plurality of fluid flow path protrusions 552"A aligned in the first direction (direction x) across a plurality of first communicating grooves 554"A. Similarly, the first protrusion column 553"B includes a plurality of fluid flow path protrusions 552"B aligned in the first direction across a plurality of first communicating grooves 554"B. The second protrusion column 553"D includes a plurality of fluid flow path protrusions 552"D aligned in the first direction across a plurality of second communicating grooves 554"D. The second protrusion column 553"C includes a plurality of fluid flow path protrusions 552"C aligned in the first direction across a plurality of second communicating grooves 554"C.

The first communicating grooves 554"A and 554"B each extend in a direction inclining with respect to the first direction as if directed from the one side (direction y side) with respect to the fluid flow path groove 551" for reference toward the fluid flow path groove 551' for reference to be directed in the first direction (direction x). In the example shown in FIG. 73, an angle formed by the extending direction of the first communicating grooves 554'A (direction shown by the thick broken arrow in the drawing) and the first direction (direction x) (angle on the acute angle side) is defined as an angle θ5. The angle θ5 may range between more than 0° and less than 90°, preferably between 30° and 60°.

The second communicating grooves 554"D and 554"C each extend in a direction inclining with respect to the first direction as if directed from the other side with respect to the fluid flow path groove 551" for reference (opposite side of the direction y) toward the fluid flow path groove 551" for reference to be directed in the first direction (direction x). In the example shown in FIG. 73, an angle formed by the extending direction of the second communicating grooves 554"C (direction shown by the thick broken arrow in the drawing) and the first direction (direction x) (angle on the acute angle side) is defined as an angle θ6. The angle θ6 may range between more than 0° and less than 90°, preferably between 30° and 60°.

Here, in the vapor chamber according to the present embodiment, fluid flow path protrusions constituting an inner side first protrusion column are disposed in the extending direction of the first communicating grooves passing between fluid flow path protrusions constituting an outer side first protrusion column, and fluid flow path protrusions constituting an inner side second protrusion column are disposed in the extending direction of the second communicating grooves passing between fluid flow path protrusions constituting an outer side second protrusion column when, in a pair of the first protrusion columns adjacent to each other, a first protrusion column disposed on the outer side with respect to the fluid flow path groove for reference is the outer side first protrusion column, and a first protrusion column disposed on the inner side with respect to the fluid flow path groove for reference is the inner side first protrusion column, and when, in a pair of the second protrusion columns adjacent to each other, a second protrusion column disposed on the outer side with respect to the fluid flow path groove for reference is the outer side second protrusion column, and a second protrusion column disposed on the inner side with respect to the fluid flow path groove for reference is the inner side second protrusion column.

For example, in the vapor chamber 501″ shown in FIG. 73, the first protrusion column 553″A is the outer side first protrusion column, and the first protrusion column 553″B is the inner side first protrusion column. Similarly, the second protrusion column 553″C is the outer side second protrusion column, and the second protrusion column 553″D is the inner side second protrusion column.

The fluid flow path protrusions 552″B constituting the first protrusion column 553″B, which is the inner side first protrusion column, are disposed in the extending direction of the first communicating grooves 554″A passing between the fluid flow path protrusions 552″A constituting the first protrusion column 553″A, which is the outer side first protrusion column (direction shown by the thick broken arrow in the drawing).

Therefore, the flow of the working fluid in the vapor state entering from the first communicating grooves 554″A on the outer side with respect to the fluid flow path groove 551″ for reference is blocked by the fluid flow path protrusions 552″B present in the extending direction of these first communicating grooves, which makes it difficult for the flow to enter the fluid flow path groove 551″ for reference, which is present on the inner side than the first communicating grooves 554″A. In addition, the flow of the vapor is dispersed by the fluid flow path protrusions 552″B, which reduces the pressure of the vapor as well. Therefore, it is further difficult to enter the fluid flow path groove 551″ for reference.

Similarly, the fluid flow path protrusions 552″D constituting the second protrusion column 553″D, which is the inner side second protrusion column, are disposed in the extending direction of the second communicating grooves 554″C passing between the fluid flow path protrusions 552″C constituting the second protrusion column 553″C, which is the outer side second protrusion column (direction shown by the thick broken arrow in the drawing).

Therefore, the flow of the working fluid in the vapor state entering from the second communicating grooves 554″C on the outer side with respect to the fluid flow path groove 551″ for reference is blocked by the fluid flow path protrusions 552″D present in the extending direction of these second communicating grooves, which makes it difficult for the flow to enter the fluid flow path groove 551″ for reference, which is present on the inner side than the second communicating grooves 554″C. In addition, the flow of the vapor is dispersed by the fluid flow path protrusions 552″D, which reduces the pressure of the vapor as well. Therefore, it is further difficult to enter the fluid flow path groove 551″ for reference.

Therefore, the vapor chamber 501″ can effectively prevent the working fluid in the vapor state from entering the fluid flow path groove 551″ for reference, to improve the transport function of the working fluid in the liquifying state, and to improve heat transport efficiency.

As well as the vapor chamber 501′ shown in FIG. 72, the vapor chamber 501″ has a plurality of the fluid flow path grooves (551″, 551″A and 551″B) and a plurality of the protrusion columns (553″A, 553″B, 555″C. and 553″D) each holding these fluid flow path grooves and extending in the first direction, which can lead to the inner side fluid flow path part 538″ of the vapor chamber 501″ having a more complicated uneven structure, to enlarge the surface area of the inner side fluid flow path part 538″ more. Therefore, the heat transport amount of the working fluid by the capillary action can be increased more, to improve transport efficiency more.

The foregoing embodiments of the present disclosure are not limited as they are, but components therein may be modified to be specified as long as the modification or specification does not deviate from the gist thereof. A plurality of the components disclosed in the foregoing embodiments may be combined to constitute various forms that brings about the effect.

Some components may be removed from all the components shown in Embodiments. Only one or some of these components may be used in view of obtainment of a necessary effect.

REFERENCE SIGNS LIST

1, 51 vapor chamber
2 enclosure
3 condensate flow path
4 vapor flow path
10 first sheet
11 main body
12 inlet
20 second sheet
21 main body
22 inlet
30, 52 third sheet
31, 53 main body
32 inlet
33 peripheral bonding part
34 peripheral fluid flow path part (fluid flow path part)
37 guiding part
38, 54 inner side fluid flow path part (fluid flow path part)
41 guiding part
42 vapor flow path groove
44 vapor flow path communicating groove
54a thickness direction communicating hole
80 electronic device
81 housing
83 electronic component
101 vapor chamber
130 third sheet
131 main body
134 peripheral fluid flow path part (fluid flow path part)
136 groove for a heat insulating part
138 inner side fluid flow path part (fluid flow path part)
140 groove for a heat insulating part
201 vapor chamber
230 third sheet 238 inner side fluid flow path part (fluid flow path part)
241 guiding part
301 vapor chamber
310 first sheet
311 inner sheet
312 reinforcing sheet
320 second sheet
321 inner sheet
322 reinforcing sheet
401 vapor chamber
410 first sheet
411 inner sheet
413 barrier sheet
420 second sheet
423 barrier sheet
501 vapor chamber
538 inside fluid flow path part
551 vapor flow path groove
552 pair of fluid flow path protrusions
552A first fluid flow path protrusion
552B second fluid flow path protrusion
553A first fluid flow path protrusion column
553B second fluid flow path protrusion column
554A first communicating groove
554B second communicating groove

The invention claimed is:

1. A vapor chamber having an enclosure which a working fluid is sealed in, comprising:
    a first flow path;
    a fluid flow path part that is adjacent to the first flow path, the fluid flow path part including a second flow path, and a guiding part on a boundary surface with the first flow path, the guiding part sticking out toward an interior of the first flow path such that the guiding part narrows a middle portion the first flow path, the guiding part having a guiding face that extends toward the second flow path from an apex that sticks out most toward the first flow path; and
    three sheets that are superposed on each other, wherein
    a sheet that is a middle one of the three sheets forms the first flow path, which penetrates in a thickness direction of the sheet and extends along a plane of the sheet,
    the second flow path is on a face of the fluid flow path part of the sheet that is the middle one and is at least on one side in the thickness direction, and
    a plurality of communicating openings are orthogonal to and are on a side of the second flow path corresponding to the guiding part so that the first flow path and the second flow path communicate with each other at the guiding face.

2. The vapor chamber according to claim 1, wherein the guiding face is concave toward the fluid flow path part.

3. The vapor chamber according to claim 1, wherein the apex of the guiding part is included at a location closer to the second flow path than a center of the fluid flow path part in the thickness direction.

4. The vapor chamber according to claim 1, wherein a cross-sectional area of the second flow path is smaller than a cross-sectional area of the first flow path, the first flow path is one of a plurality of adjacent first flow paths,
    the second flow path is one of a plurality of second flow paths between the adjacent first flow paths,
    $A_l$ of at least part of the second flow paths is at most 0.5 times as much as Ag,
    $A_g$ is an average cross-sectional area of pairs of the adjacent first flow paths, and $A_l$ is an average cross-sectional area of the plurality of the second flow paths between the adjacent first flow paths.

5. The vapor chamber according to claim 1, wherein the first flow path is a vapor flow path in which a vapor of the working fluid flows,
    a cross-sectional area of the second flow path is smaller than a cross-sectional area of the vapor flow path, and
    the second flow path is a condensate flow path in which a condensate of the working fluid flows.

6. An electronic device comprising:
    a housing;
    an electronic component inside the housing; and
    the vapor chamber according to claim 1, the vapor chamber being in the electronic component.

7. An electronic device comprising:
    a housing;
    an electronic component disposed inside the housing; and
    the vapor chamber according to claim 1, the vapor chamber being disposed in the electronic component.

8. The vapor chamber according to claim 1, further comprising:
    a heat insulating part,
    wherein the heat insulating part is on a face of the fluid flow path part different from the second flow path.

9. An electronic device comprising:
    a housing;
    an electronic component disposed inside the housing; and
    the vapor chamber according to claim 8, the vapor chamber being disposed in the electronic component.

10. A sheet for a vapor chamber, comprising:
    a first flow path; and
    a fluid flow path part that is adjacent to the first flow path, the fluid flow path part including a second flow path, and a guiding part on a boundary surface with the first flow path, the guiding part sticking out toward an interior of the first flow path such that the guiding part narrows a middle portion the first flow path, the guiding part having a guiding face that extends toward the second flow path from an apex that sticks out most toward the first flow path, wherein
    the sheet is configured to form the first flow path, which penetrates in a thickness direction of the sheet and extends along a plane of the sheet,
    the second flow path is on a face of the fluid flow path part of the sheet at least on one side in the thickness direction, and
    a plurality of communicating openings are orthogonal to and are on a side of the second flow path corresponding to the guiding part so that the first flow path and the second flow path communicate with each other at the guiding face.

11. The sheet for a vapor chamber according to claim 10, further comprising:
    a heat insulating part, the heat insulating part not communicating with the first or second flow path, wherein
    the heat insulating part is on a face of the fluid flow path part different from the second flow path.

12. The sheet for a vapor chamber according to claim 10, wherein the guiding face is concave toward the fluid flow path part.

13. The sheet according to claim 10, wherein the apex of the guiding part is at a location closer to the second flow path than a center of the fluid flow path part in the thickness direction.

14. The sheet for a vapor chamber according to claim 10, wherein a cross-sectional area of the second flow path is smaller than a cross-sectional area of the first flow path, the first flow path is one of a plurality of adjacent first flow paths, the second flow path is one of a plurality of second flow paths between the adjacent first flow paths, $A_l$ of at least part of the second flow paths is at most 0.5 times as much as $A_g$, $A_g$ is an average cross-sectional area of pairs of the adjacent first flow paths, and $A_l$ is an average cross-sectional area of the plurality of the second flow paths between the adjacent first flow paths.

15. The sheet for a vapor chamber according to claim 10, wherein the first flow path is a vapor flow path in which a vapor of a working fluid is to flow, a cross-sectional area of the second flow path is smaller than a cross-sectional area of the vapor flow path, and the second flow path is a condensate flow path in which a condensate of the working fluid is to flow.

* * * * *